(12) United States Patent
Iguchi et al.

(10) Patent No.: US 6,927,132 B2
(45) Date of Patent: Aug. 9, 2005

(54) METHOD FOR PRODUCING NONVOLATILE SEMICONDUCTOR MEMORY DEVICE AND THE DEVICE ITSELF

(75) Inventors: Tadashi Iguchi, Mie (JP); Hiroaki Tsunoda, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/683,355

(22) Filed: Oct. 14, 2003

(65) Prior Publication Data

US 2004/0077146 A1 Apr. 22, 2004

Related U.S. Application Data

(62) Division of application No. 10/251,754, filed on Sep. 23, 2002, now abandoned.

(30) Foreign Application Priority Data

Jul. 29, 2002 (JP) .................................... 2002-220140

(51) Int. Cl.[7] .............................................. H01L 21/336
(52) U.S. Cl. ...................................... 438/261; 438/595
(58) Field of Search ................................ 438/258, 261, 438/264, 296, 594, 595

(56) References Cited

U.S. PATENT DOCUMENTS

| | | | |
|---|---|---|---|
| 5,290,723 A | * | 3/1994 | Tani et al. .................... 438/595 |
| 5,661,053 A | * | 8/1997 | Yuan .......................... 438/257 |
| 6,329,685 B1 | | 12/2001 | Lee ............................. 438/201 |
| 6,335,243 B1 | * | 1/2002 | Choi et al. .................. 438/264 |
| 6,355,524 B1 | | 3/2002 | Tuan et al. .................. 438/257 |

FOREIGN PATENT DOCUMENTS

| | | |
|---|---|---|
| JP | 2000-174145 | 6/2000 |
| JP | 2002-083884 | 3/2002 |

OTHER PUBLICATIONS

Wolf, "Silicon Processing for the VLSI Era", vol. 1, pp. 182–194, 384–389.*

* cited by examiner

*Primary Examiner*—Chandra Chaudhari
(74) *Attorney, Agent, or Firm*—Finnegan, Henderson, Farabow, Garrett & Dunner, L.L.P.

(57) ABSTRACT

Method for producing a nonvolatile semiconductor memory device includes forming a first insulating film on a semiconductor substrate, forming a floating gate electrode material film on the first insulating film, forming a second insulating film on the floating gate electrode material film, forming a control gate electrode material film on the second insulating film, forming a first mask film on the control gate electrode material film, the first mask film having slits extending along a first direction, forming sidewalls on the sides of the first mask film in the slits, and etching the control gate electrode material film, the second insulating film and the floating gate electrode material film using the first mask film and the sidewalls as a mask so as to form memory cells each of which includes a floating gate electrode and a control gate electrode.

11 Claims, 53 Drawing Sheets

METHOD FOR PRODUCING NONVOLATILE SEMICONDUCTOR MEMORY DEVICE AND THE DEVICE ITSELF

This is a divisional of application Ser. No. 10/251,754, filed Sep. 23, 2002 now abandoned, which is incorporated herein by reference, to which Applicants claim the benefit under 35 U.S.C. § 120.

CROSS REFERENCE TO RELATED APPLICATION

This application claims the benefit of priority under 35 U.S.C. § 119 of Japanese Patent Application No. 2002-220140, filed on Jul. 29, 2002, the entire contents of which are incorporated by reference herein.

BACKGROUND OF THE INVENTION

1. Field of the Invention

The present invention relates generally to a method for producing a nonvolatile semiconductor memory device and the device itself. More specifically, the present invention relates to a method for producing a nonvolatile semiconductor memory device so as to suppress embedding failure between memory cells when an interlayer dielectric film is formed and such a device itself.

2. Description of the Related Art

A nonvolatile semiconductor memory device including memory cells is a kind of semiconductor memory device, and a floating gate electrode and a control gate electrode are stacked in each of the memory cells. A NAND-type nonvolatile semiconductor memory device is of particular interest in view of high integration, and the NAND-type nonvolatile semiconductor memory device includes a NAND-type memory cell array in which the memory cells are connected in series to share a source/drain region of each memory cell.

FIG. 1 is an equivalent circuit diagram of the NAND-type memory cell array, and FIG. 2 is a plan layout view thereof. As shown in FIG. 1, in the NAND-type memory cell array, memory cells CG1.1, CG2.1, CG3.1, . . . ,CGn.1 are connected in series and a floating gate electrode and a control gate electrode are stacked in each of the memory cells CG1.1, CG2.1, CG3.1, . . . ,CGn.1. Furthermore, a drain diffusion region of the memory cell CG1.1 at one end of the line of the memory cells is connected to a bit line BL1 via a selecting transistor SG1.1 and a bit line contact. On the other hand, a source diffusion region of the memory cell CGn.1 at the other end of the line of memory cells is connected to a source line S via a selecting transistor SG2.1 and a source line contact. These memory cells are arranged in the matrix form so as to constitute the memory cell array.

As shown in FIG. 2, each of the memory cells is formed on a common well of a semiconductor substrate. The control gate electrodes of the memory cells CG1.1, CG2.1, CG3.1, . . . , CGn.1 (CG1.2, CG2.2, CG3.2, . . . , CGn.2) are continuously formed in a direction which intersects a bit line direction so as to constitute word lines WL1, WL2, . . . , WLn. The control gate electrodes of the selecting transistors SG1.1 and SG2.2 are also continuously formed in the word line direction so as to constitute selecting lines SL1 and SL2. As shown by dotted lines, the floating gate electrodes of the memory cells are separated from one another.

Methods for producing such a nonvolatile semiconductor memory device are disclosed, for example, in Japanese Patent Laid-Open Publication No. 2002-83884, Japanese Patent Laid-Open Publication No. 2000-174145 and so on. The method for producing the nonvolatile semiconductor memory device disclosed in Japanese Patent Laid-Open Publication No. 2002-83884 will be explained in accordance with FIG. 3 through FIG. 16.

FIG. 3 through FIG. 13 and FIG. 15 are sectional views taken along the line A–A' of the nonvolatile semiconductor memory device in FIG. 2, and FIG. 14 and FIG. 16 are sectional views taken along the line B–B' of the nonvolatile semiconductor memory device in FIG. 2.

First referring to FIG. 3, a first silicon oxide film 102 is formed on a semiconductor substrate 100 such as a silicon substrate. The first silicon oxide film 102 constitutes a gate insulating film afterward. In this case, the first silicon oxide film 102 has a thickness of 10 nm. Thereafter, a first polysilicon film 104 is formed on the first silicon oxide film 102. In this case, the first polysilicon film 104 has a thickness of 60 nm. Subsequently, a silicon nitride film 106 is formed on the first polysilicon film 104 and a second silicon oxide film 108 is formed on the silicon nitride film 106.

Next, as shown in FIG. 4, a photoresist 110 is applied on the second silicon oxide film 108 and slits extending along the bit line direction are formed in the photoresist 110 by the photoengraving process. Subsequently, the second silicon oxide film 108 and the silicon nitride film 106 are etched by the RIE (Reactive Ion Etching) using the photoresist 110 as a mask.

Next, as shown in FIG. 5, the nonvolatile semiconductor memory device is exposed to an $O_2$ plasma atmosphere and the photoresist 100 is removed. Thereafter, the first polysilicon film 104, the first silicon oxide film 102 and the semiconductor substrate 100 are etched using the second silicon oxide film 108 as a mask, so that grooves 112 are formed in the semiconductor substrate 100. Subsequently, the nonvolatile semiconductor memory device is heated in an oxygen atmosphere so as to form a third silicon oxide film 114. In this case, the third silicon oxide film 114 has a thickness of 6 nm. Thereafter, a fourth silicon oxide film 116 is formed so that it is embedded in the grooves 112 in the semiconductor substrate 100 by the HDP (High Density Plasma) process.

Next, as shown in FIG. 6, the fourth silicon oxide film 116 is polished and flattened by the CMP (Chemical Mechanical Polishing) method. The fourth silicon oxide film 116 is polished between the top and the bottom of the silicon nitride film 106. Thereafter, the nonvolatile semiconductor memory device is heated in a nitrogen atmosphere.

Next, as shown in FIG. 7, it is dipped into $NH_4F$ solution, and then the silicon nitride film 106 is removed by the wet etching, for example, by the phosphoric acid process at 150° C. Thereby, the third silicon oxide film 114 and the fourth silicon oxide film 116 form STI (Shallow Trench Isolation) element isolation regions.

Next, as shown in FIG. 8, a second polysilicon film 120, in which phosphorus is doped, is formed on the semiconductor device by the LPCVD (Low Pressure Chemical Vapor Deposition) method, and then the fifth silicon oxide film 122 is formed on the second polysilicon film 120. Subsequently, a photoresist 124 is applied to the fifth silicon oxide film 122, and then slits extending along the bit line direction are formed in the photoresist 124 by the photoengraving process.

Next, as shown in FIG. 9, the fifth silicon oxide film 122 is etched by the RIE method using the photoresist 124 as a mask. Subsequently, the nonvolatile semiconductor memory device is exposed to an $O_2$ plasma atmosphere and then the photoresist 124 is removed. Thereafter, the sixth silicon oxide film 126 is formed on the semiconductor device by the LPCVD method.

Next, as shown in FIG. 10, the sixth silicon oxide film 126 is etched back so as to form sidewalls 126a on side wall portions of the fifth silicon oxide film 122. The sidewalls 126a and the fifth silicon oxide films 122 form a mask which has slits extending along the bit line direction.

Next, as shown in FIG. 11, the second polysilicon film 120 is etched by the RIE method using the sidewalls 126a and the fifth silicon oxide films 122 as the mask. Subsequently, the nonvolatile semiconductor memory device is exposed to the HF-Vapor, and then the sidewalls 126a and the fifth silicon oxide films 122 are removed. Thereby, the first polysilicon film 104 and the second polysilicon film 120 are separated in the bit line direction, and they constitute floating gate electrodes FG later.

Next, as shown in FIG. 12, an ONO (a silicon oxide film—a silicon nitride film—a silicon oxide film) film 130, which is an example of an insulating film, is formed by the LPCVD method, and then it is heated in an oxygen atmosphere. Thereafter, a third polysilicon film 132 is formed on the ONO film 130 by the LPCVD method. Subsequently, tungsten silicide (WSi) film 134 is formed on the third polysilicon film 132 by the PVD (Physical Vapor Deposition) method. Thereafter, a seventh silicon oxide film 136 is formed on the tungsten silicide film 134 by the LPCVD method. In this case, the seventh silicon oxide film 136 has a thickness of 20 nm.

Next, as shown in FIG. 13 and FIG. 14, a photoresist 140 is applied to the seventh silicon oxide film 136 and then a predetermined pattern is produced in the photoresist 140 by the photo engraving process. That is, the photoresist 140 which has slits extending along the word line direction is formed. Thereafter, the seventh silicon oxide film 136 is etched by RIE method using the photoresist 140 as a mask.

Next, as shown in FIG. 15 and FIG. 16, the photoresist 140 is removed. Thereafter, the tungsten silicide film 134, the third polysilicon film 132, the ONO film 130, the second polysilicon film 120 and the first polysilicon film 104 are etched using the seventh silicon oxide films 136 as a mask. Thereby, the tungsten silicide film 134, the third polysilicon film 132, the ONO film 130, the second polysilicon film 120 and the first polysilicon film 104 are separated in the word line direction. As a result, tungsten silicide film 134 and the third polysilicon film 132 constitute control gate electrodes CG, and the first polysilicon film 104 and the second polysilicon film 120 constitute floating gate electrodes FG. Namely, nonvolatile memory cells each of which has the floating gate electrode FG and the control gate electrode CG are formed.

Next, on both sides of the first polysilicon films 104, the second polysilicon films 120 and the third polysilicon films 132 in the word line direction, oxide films 162 which are an example of an insulating film are formed by the oxide process (RTO). Thereafter, source/drain regions 160 are formed by the ion implanting process. Subsequently, a silicon nitride film 164 which is an example of an insulating film is formed so as to cover every memory cell, and the silicon nitride film 164 has a thickness of 40 nm. Thereafter, an interlayer dielectric film 150 is formed so as to be embedded in gaps between the memory cells and so as to cover every memory cell, and then the interlayer dielectric film 150 is flattened. In this case, the interlayer dielectric film 150 is formed by the following steps. That is, the nonvolatile semiconductor memory device is heated in a nitrogen atmosphere, and an eighth silicon oxide film is formed by the oxidation process. Subsequently, a ninth silicon oxide film and a second silicon nitride film are formed by the LPCVD method. Thereafter, a tenth silicon oxide film, in which boron or phosphorus is doped, is formed, and then the nonvolatile semiconductor memory device is heated in an oxygen atmosphere. Subsequently, the semiconductor memory device is flattened, so that the interlayer dielectric film 150 is obtained.

By the way, it is preferable that the gate electrode has a wide width in order to improve characteristics of the memory cell. That is, in FIG. 16, it is desirable to expand the width W1 of the control gate electrode CG and the width W1 of the floating gate electrode FG of the memory cell. However, if the width W1 of the gate electrode is expanded, the width W2 between the gate electrodes is narrowed. As a result, it arises the problem that forming the interlayer dielectric film 150 embedded between the gate electrodes is difficult. That is, it increases the possibility that embedding failure arises when the interlayer dielectric film 150 is formed.

SUMMARY OF THE INVENTION

In order to accomplish the aforementioned and other objects, according to one aspect of the present invention, a method for producing a nonvolatile semiconductor memory device, comprising:

forming a first insulating film on a semiconductor substrate;

forming a floating gate electrode material film on the first insulating film;

forming a second insulating film on the floating gate electrode material film;

forming a control gate electrode material film on the second insulating film;

forming a first mask film on the control gate electrode material film, the first mask film having slits extending along a first direction;

forming sidewalls on the sides of the first mask film in the slits; and etching the control gate electrode material film, the second insulating film and the floating gate electrode material film using the first mask film and the sidewalls as a mask so as to form memory cells each of which includes a floating gate electrode and a control gate electrode.

According to another aspect of the present invention, a nonvolatile semiconductor memory device including a plurality of memory cells, each of the memory cells comprising:

a first insulating film formed on a semiconductor substrate;

a floating gate electrode formed on the first insulating film;

a second insulating film formed on the floating gate electrode;

a control gate electrode formed on the second insulating film;

a third insulating film formed on the control gate electrode; and sidewalls formed on steps, which is in the top corners of the control gate electrode, and on both sides of the third insulating film.

DETAILED DESCRIPTION OF THE EMBODIMENTS (First Embodiment)

Figure 16:
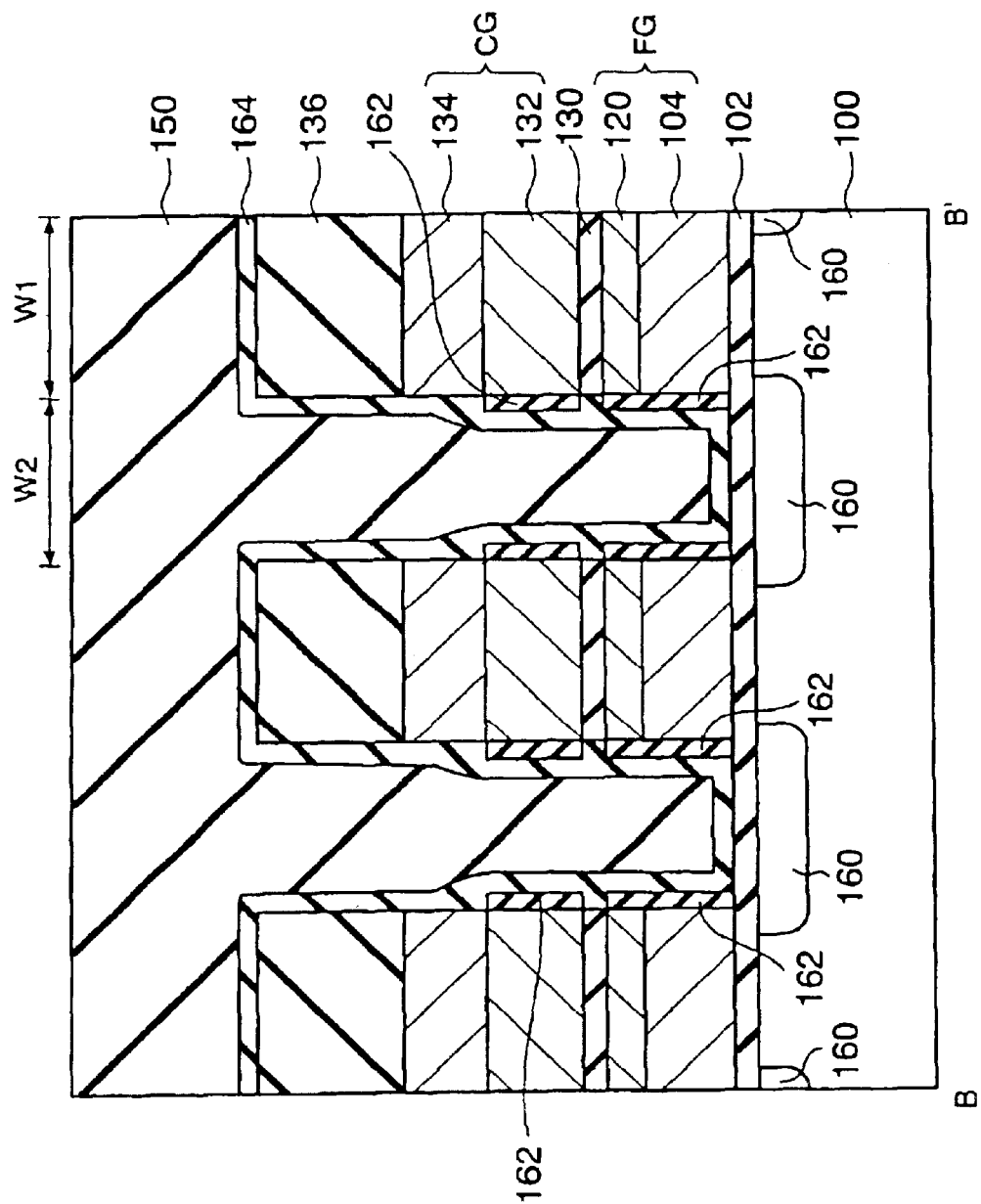
FIG. 16 is a sectional view showing a part of the manufacturing process of the related nonvolatile semiconductor memory device (cross-sectional view taken along the line B–B' in FIG. 2) and corresponding to FIG. 15.

According to a first embodiment, sidewalls of silicon oxide films are additionally formed so that the top corners of the seventh silicon oxide film 136 slope gently in FIG. 16, and therefore it is possible to avoid embedding failure when the interlayer dielectric film 150 is embedded in width W2 between the memory cells. The detailed explanation will be made hereinafter.

The manufacturing process of a nonvolatile semiconductor memory device according to this embodiment is the same as that of the related art described above until FIG. 11.

Figure 1:
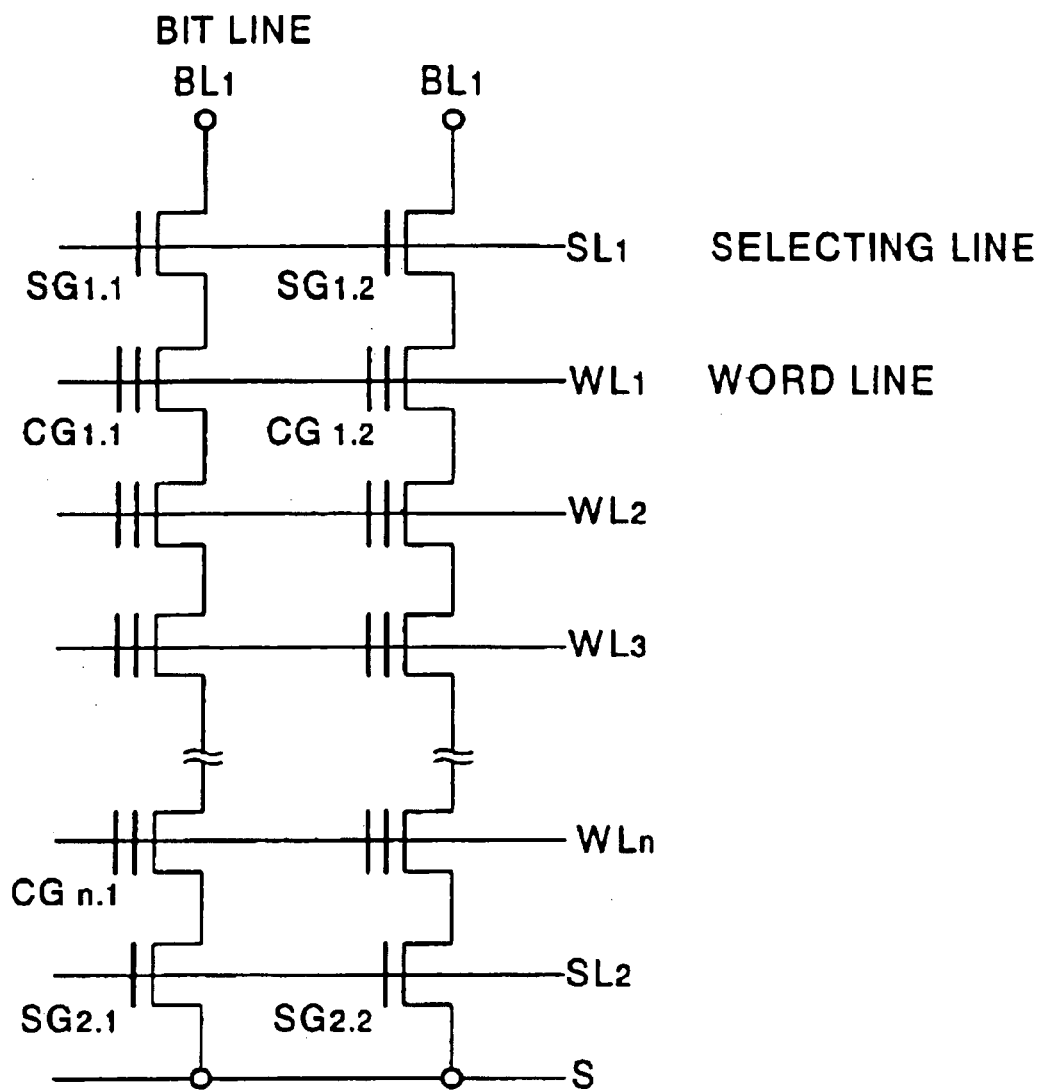
FIG. 1 is a diagram showing an equivalent circuit of a common NAND-type memory cell array.
Figure 2:
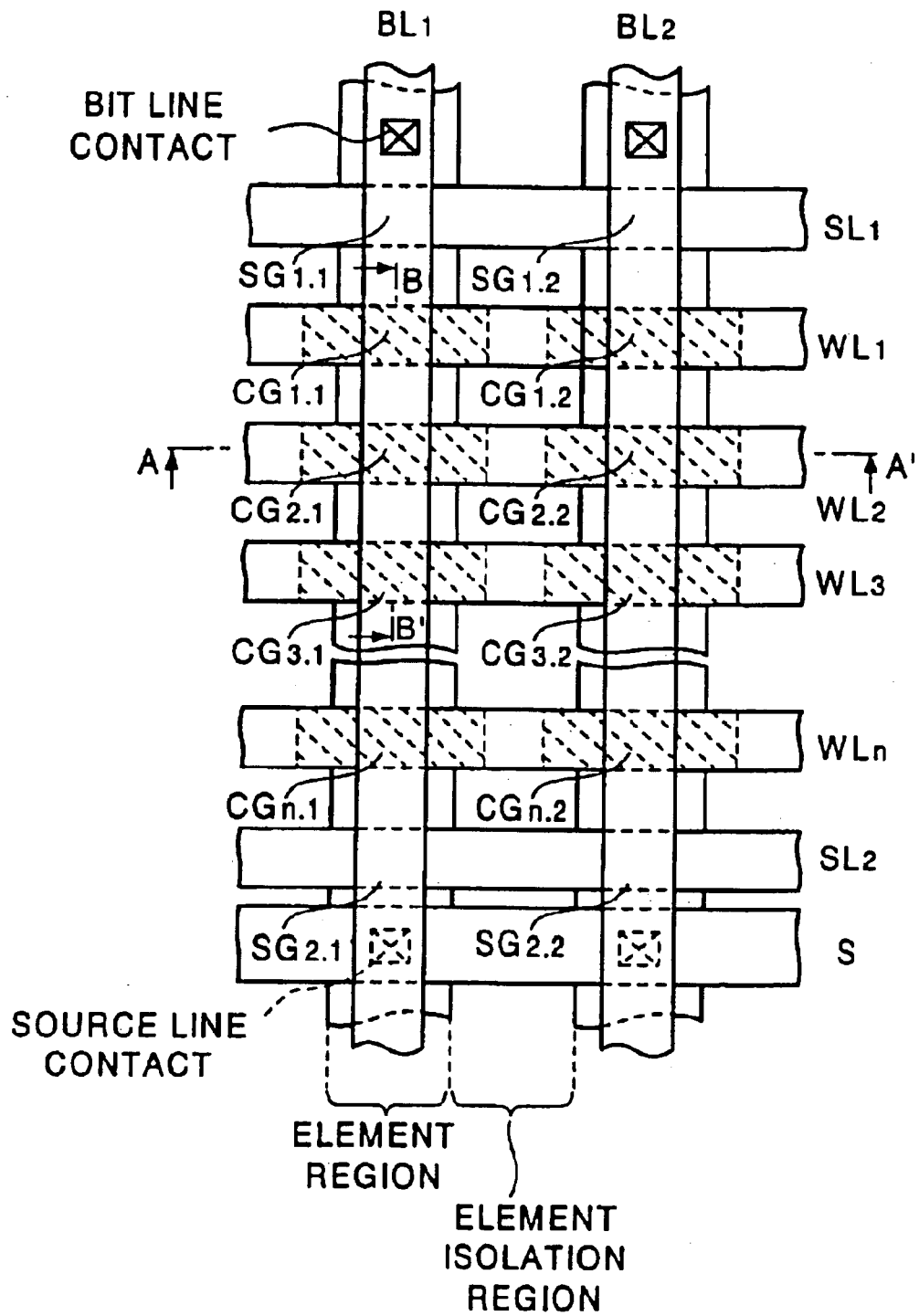
FIG. 2 is a plan layout view of the NAND-type memory cell array.
Figure 3:
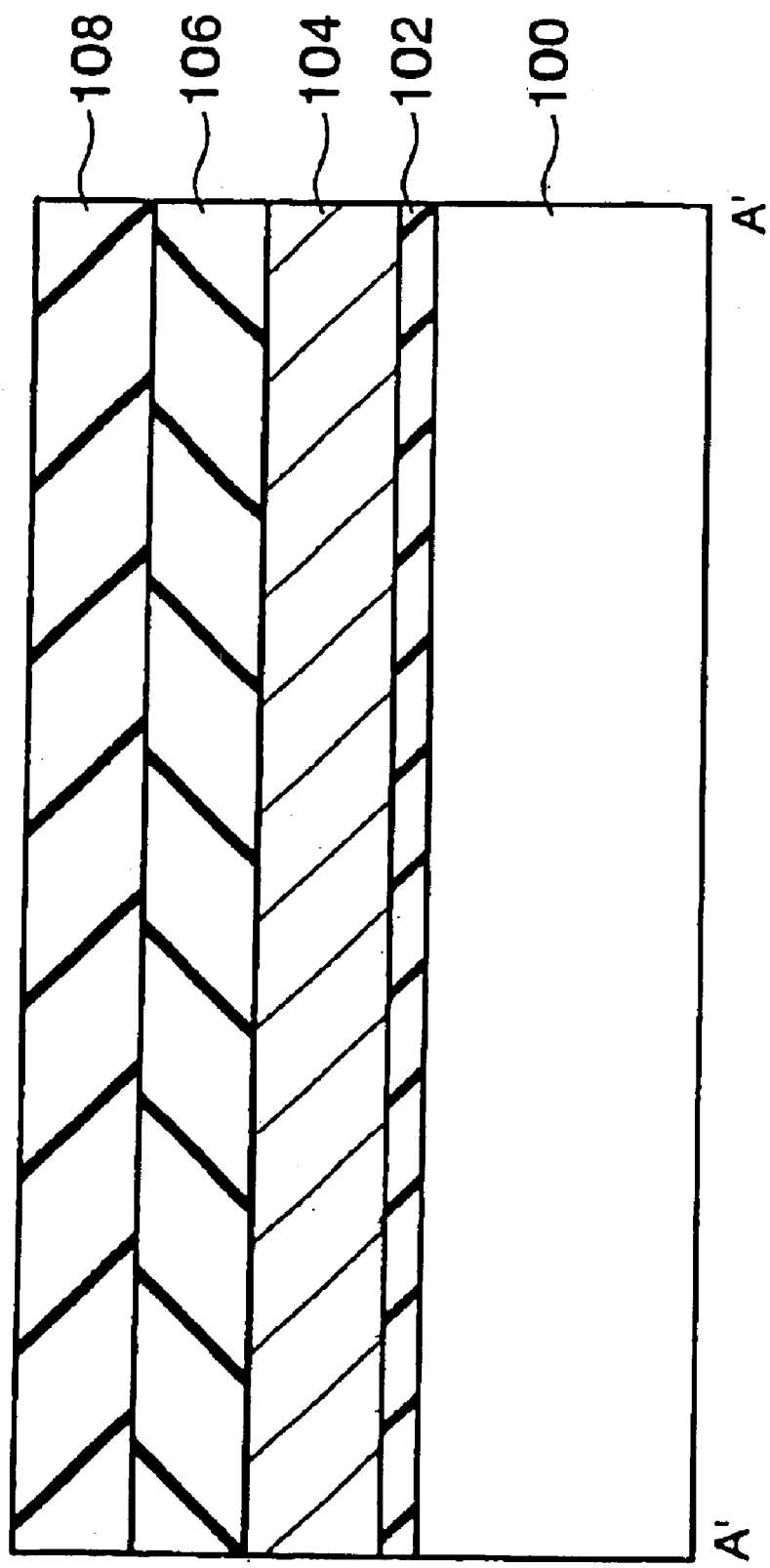
FIG. 3 is a sectional view showing a part of the manufacturing process of a related nonvolatile semiconductor memory device (cross-sectional view taken along the line A–A' in FIG. 2)
Figure 4:
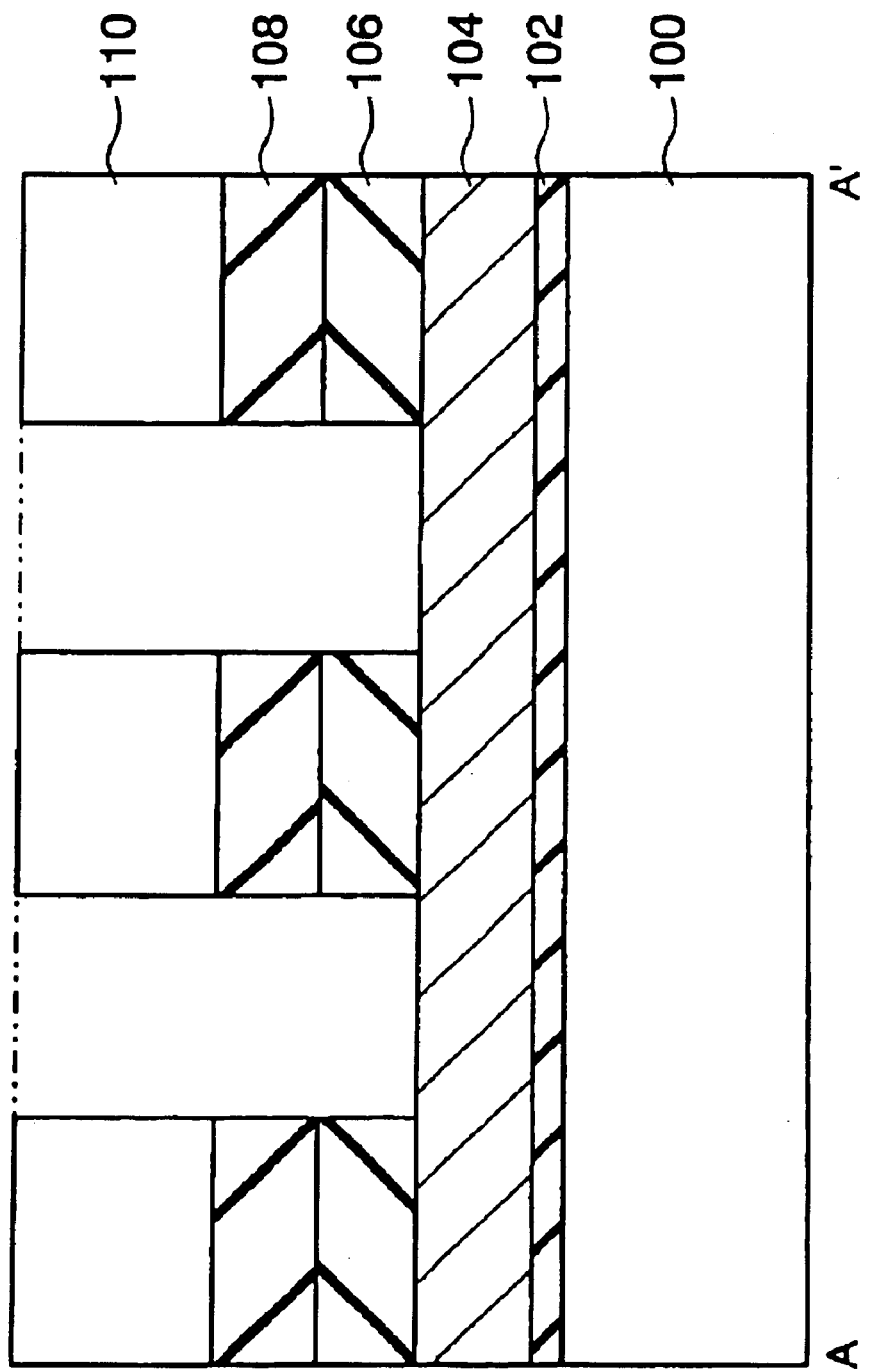
FIG. 4 is a sectional view showing a part of the manufacturing process of the related nonvolatile semiconductor memory device (cross-sectional view taken along the line A–A' in FIG. 2)
Figure 5:
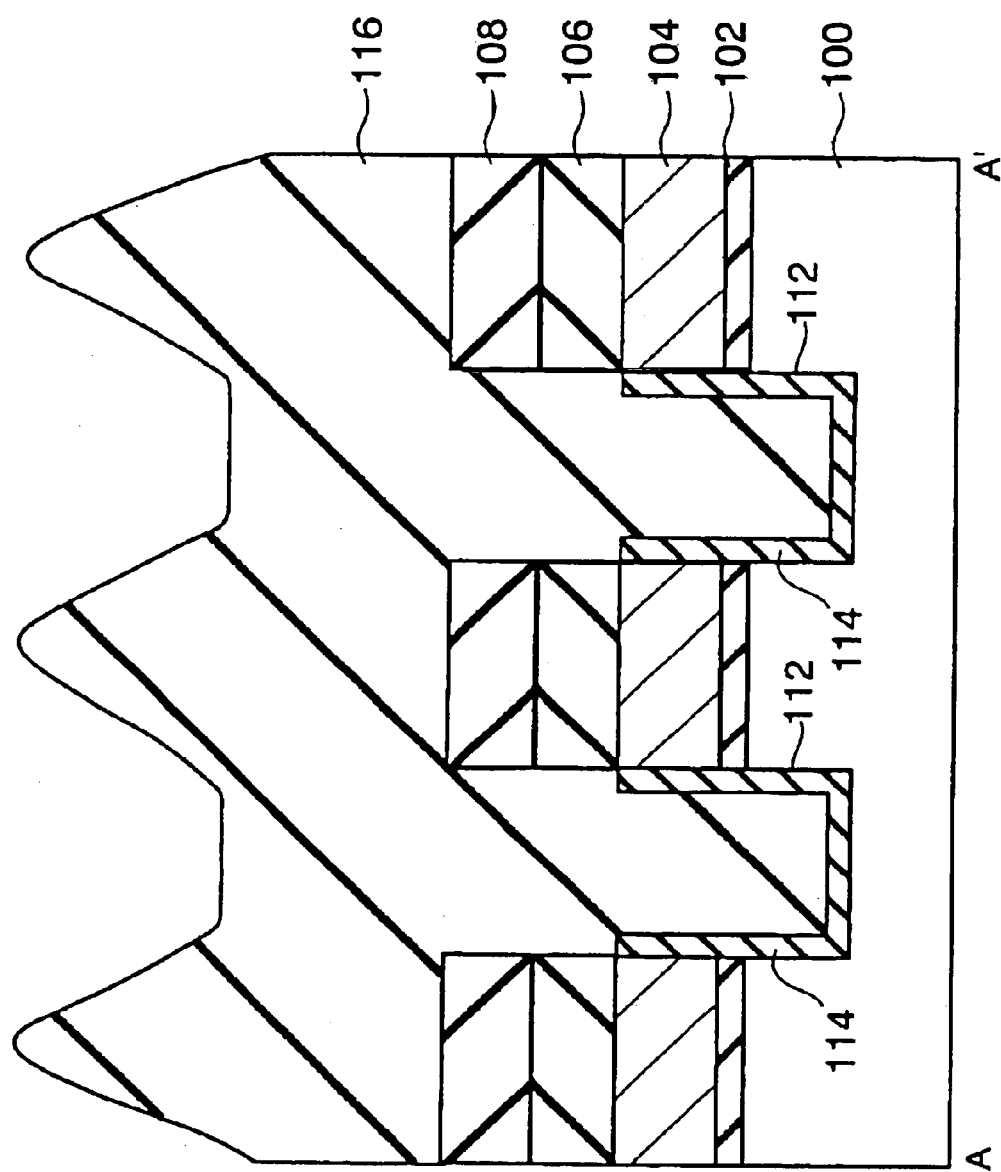
FIG. 5 is a sectional view showing a part of the manufacturing process of the related nonvolatile semiconductor memory device (cross-sectional view taken along the line A–A' in FIG. 2)
Figure 6:
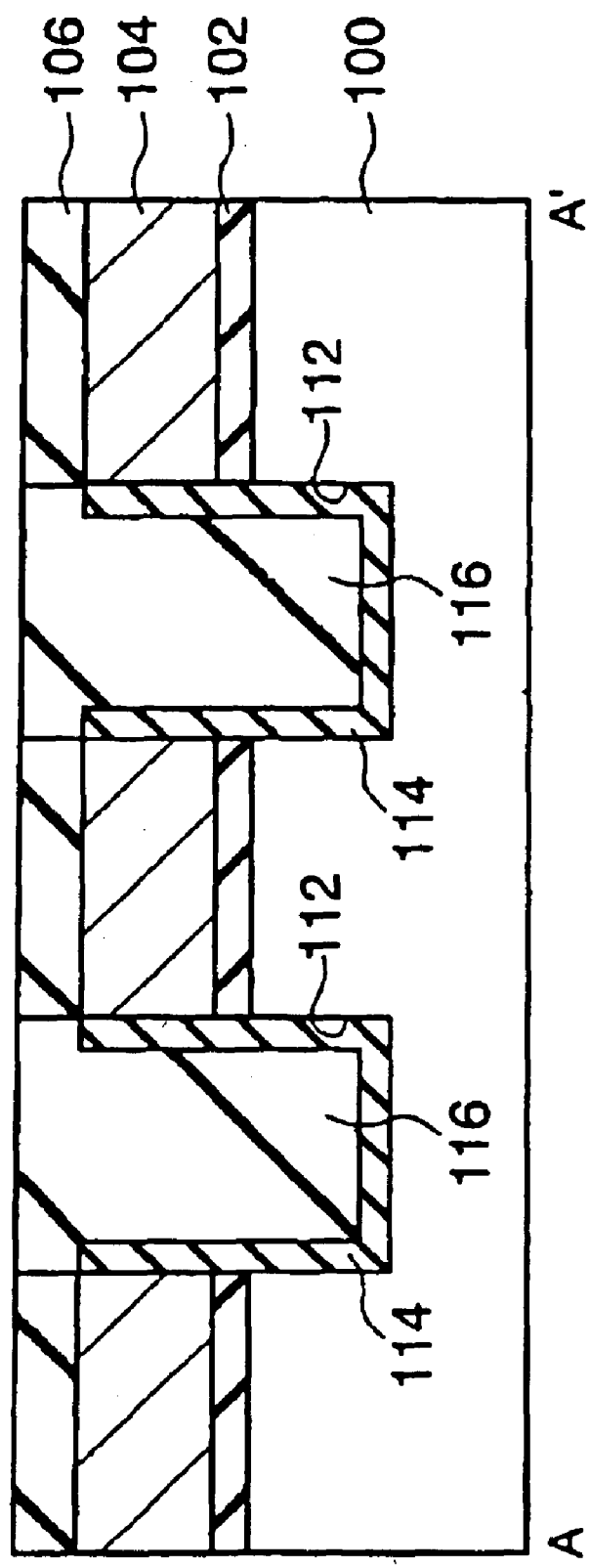
FIG. 6 is a sectional view showing a part of the manufacturing process of the related nonvolatile semiconductor memory device (cross-sectional view taken along the line A–A' in FIG. 2)
Figure 7:
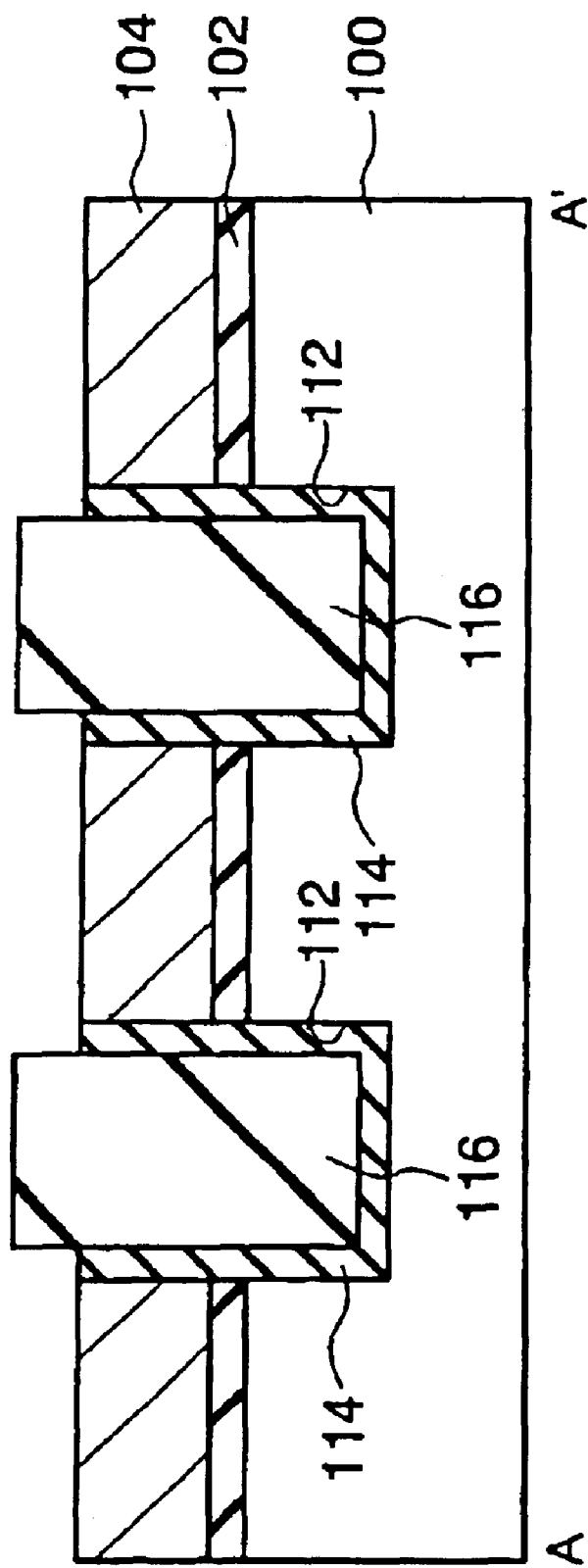
FIG. 7 is a sectional view showing a part of the manufacturing process of the related nonvolatile semiconductor memory device (cross-sectional view taken along the line A–A' in FIG. 2)
Figure 8:
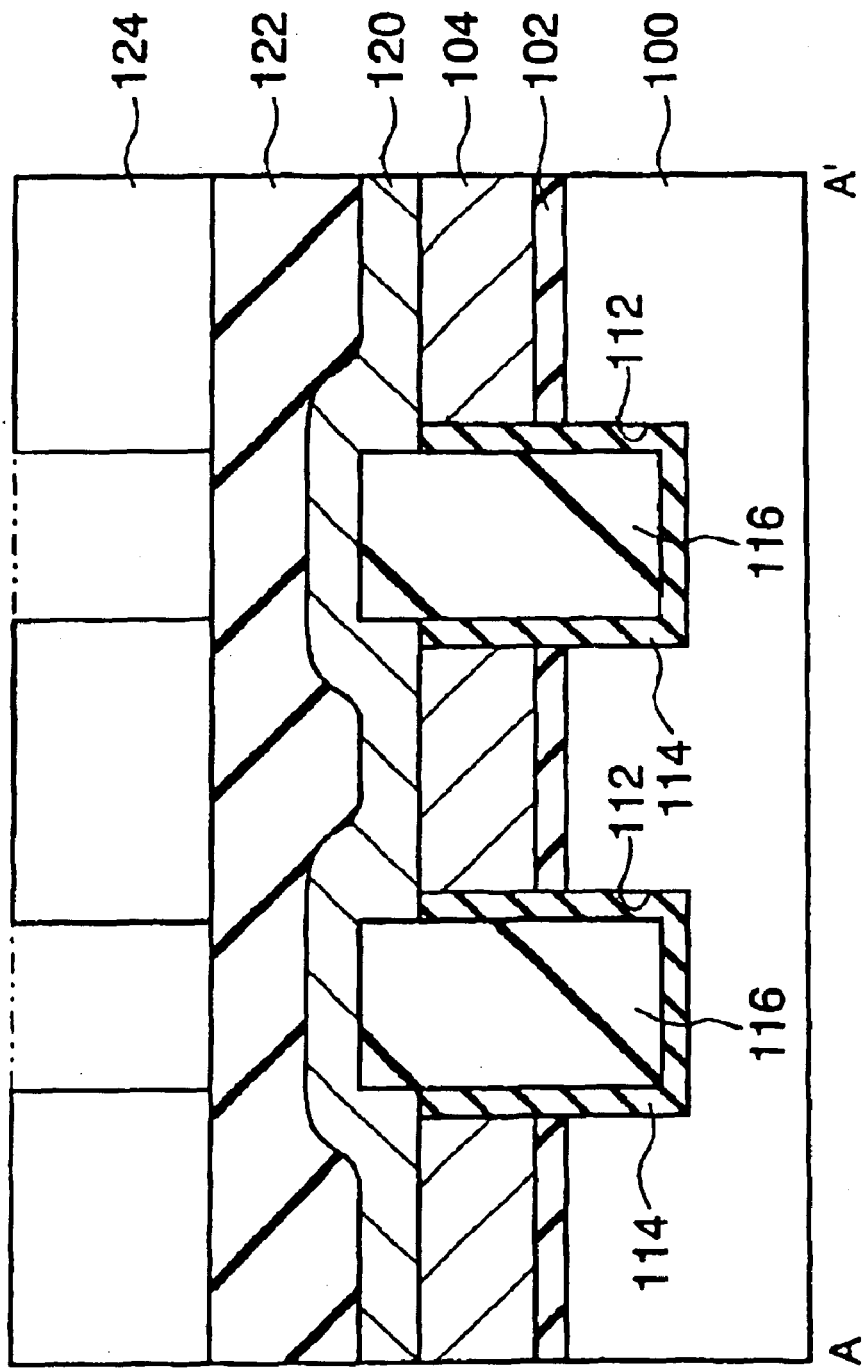
FIG. 8 is a sectional view showing a part of the manufacturing process of the related nonvolatile semiconductor memory device (cross-sectional view taken along the line A–A' in FIG. 2)
Figure 9:
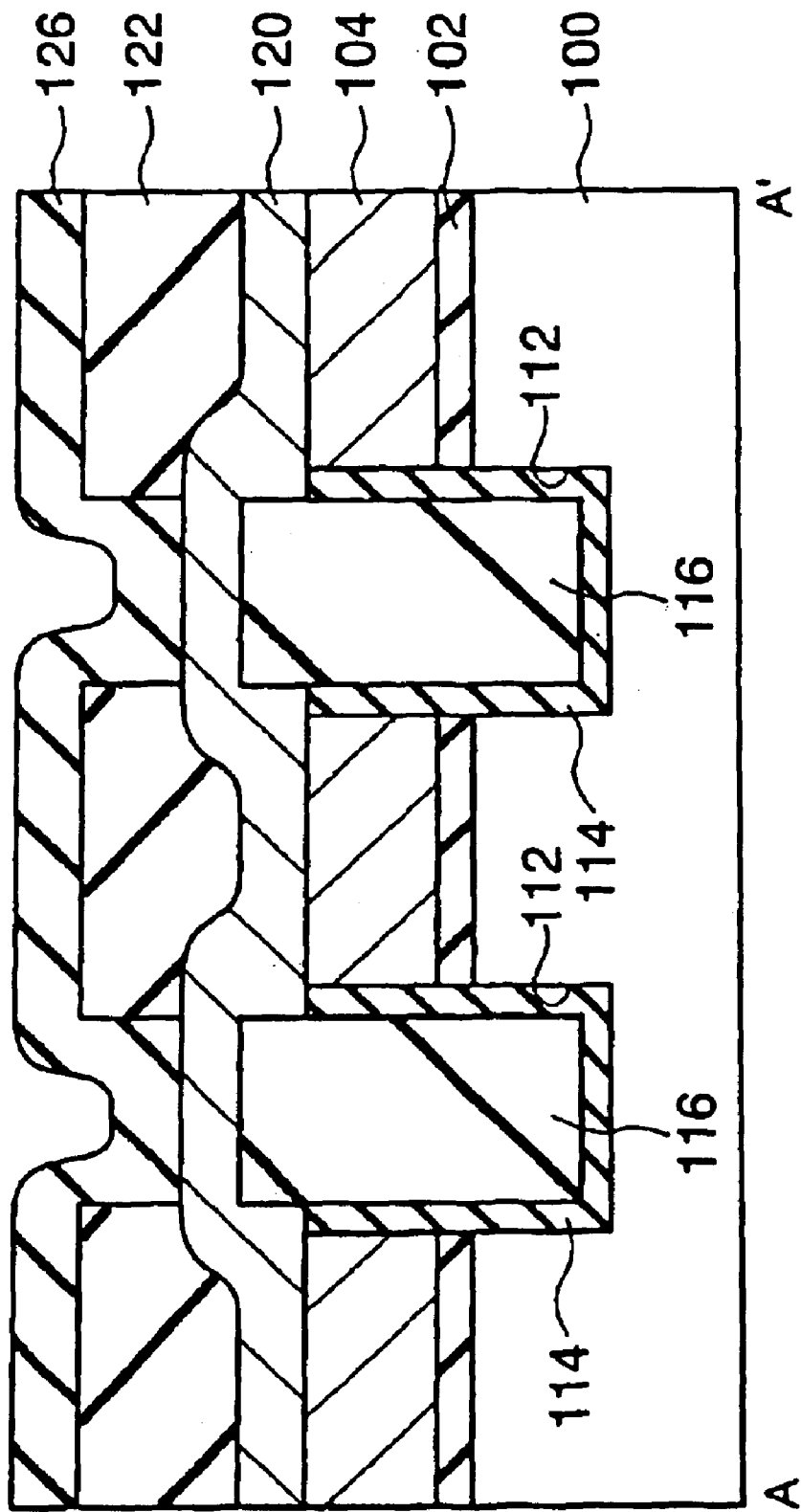
FIG. 9 is a sectional view showing a part of the manufacturing process of the related nonvolatile semiconductor memory device (cross-sectional view taken along the line A–A' in FIG. 2)
Figure 10:
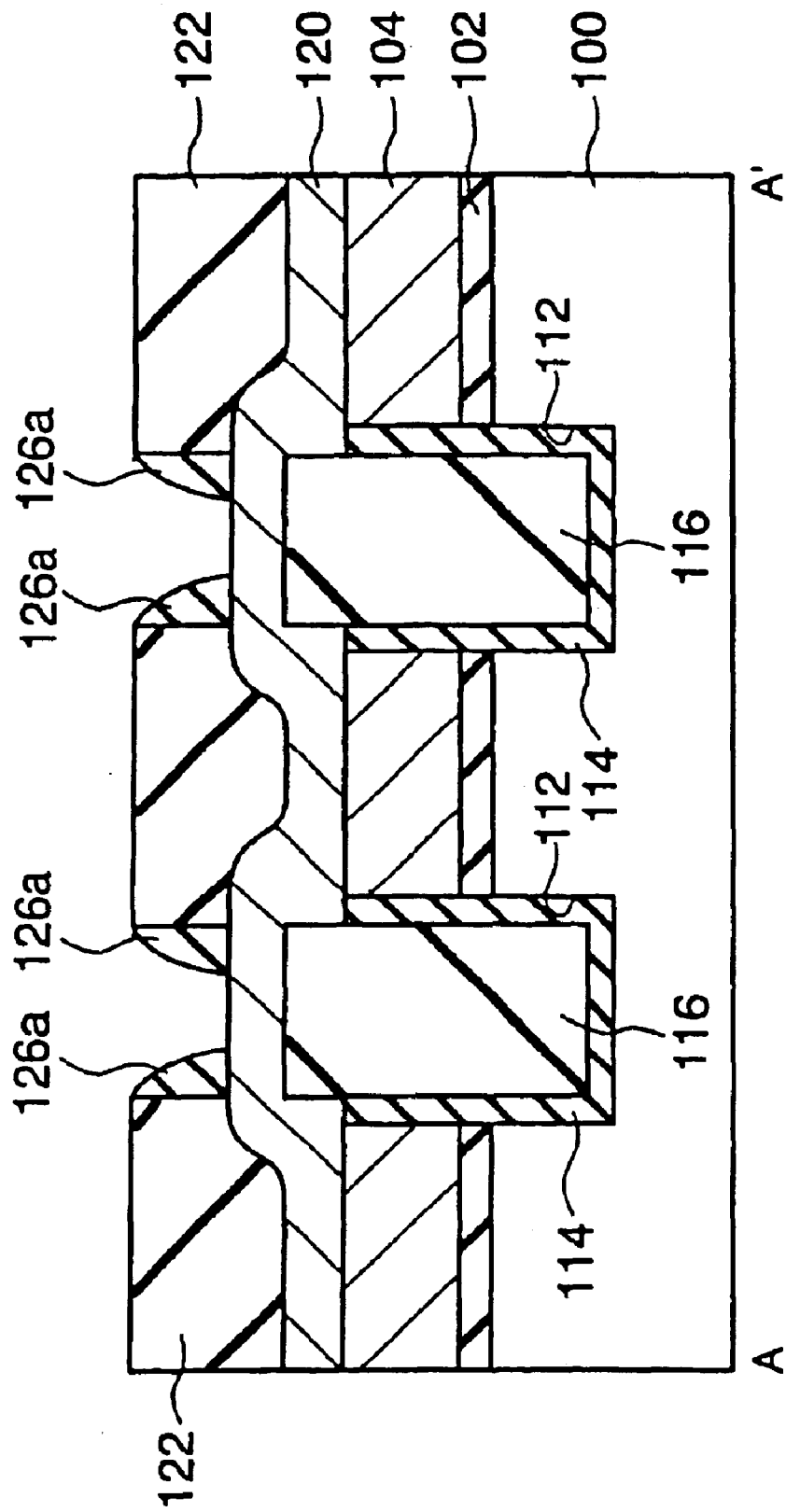
FIG. 10 is a sectional view showing a part of the manufacturing process of the related nonvolatile semiconductor memory device (cross-sectional view taken along the line A–A' in FIG. 2)
Figure 11:
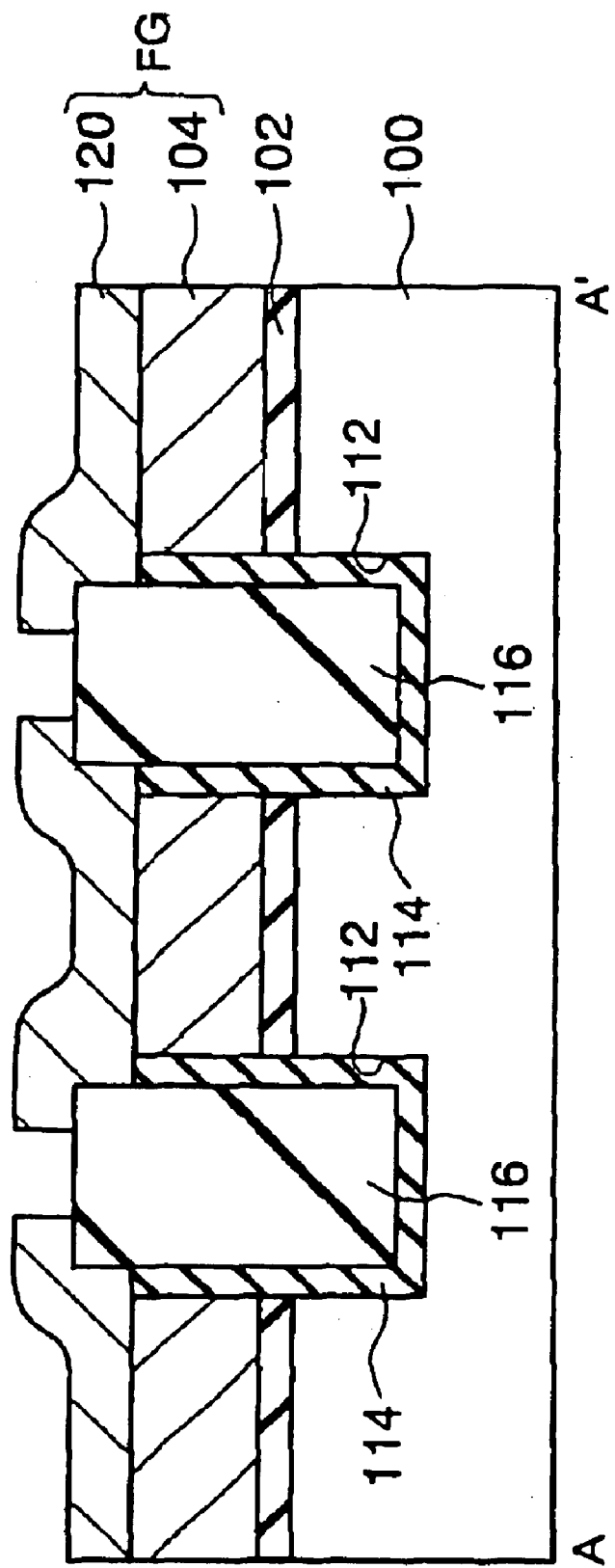
FIG. 11 is a sectional view showing a part of the manufacturing process of the related nonvolatile semiconductor memory device (cross-sectional view taken along the line A–A' in FIG. 2)
Figure 12:
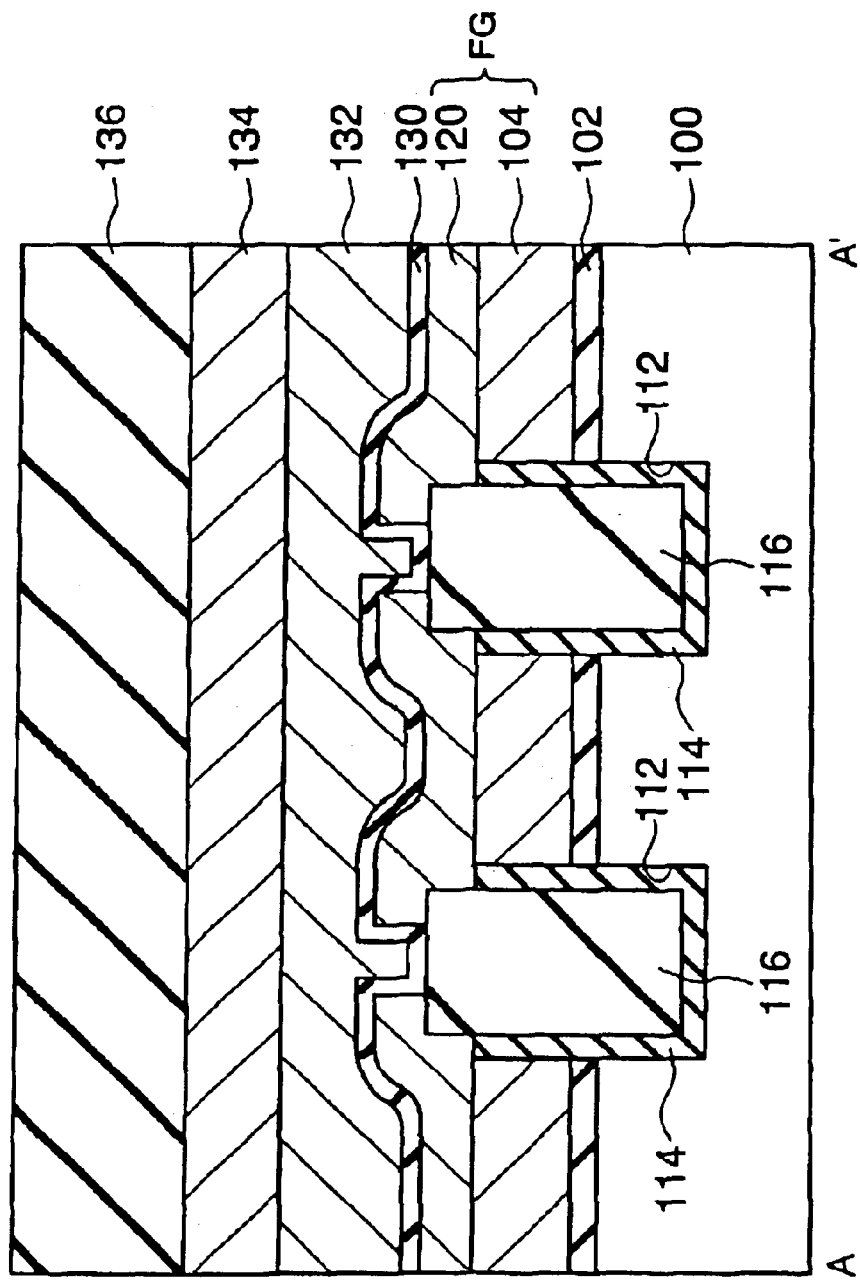
FIG. 12 is a sectional view showing a part of the manufacturing process of the related nonvolatile semiconductor memory device (cross-sectional view taken along the line A–A' in FIG. 2)
Figure 13:
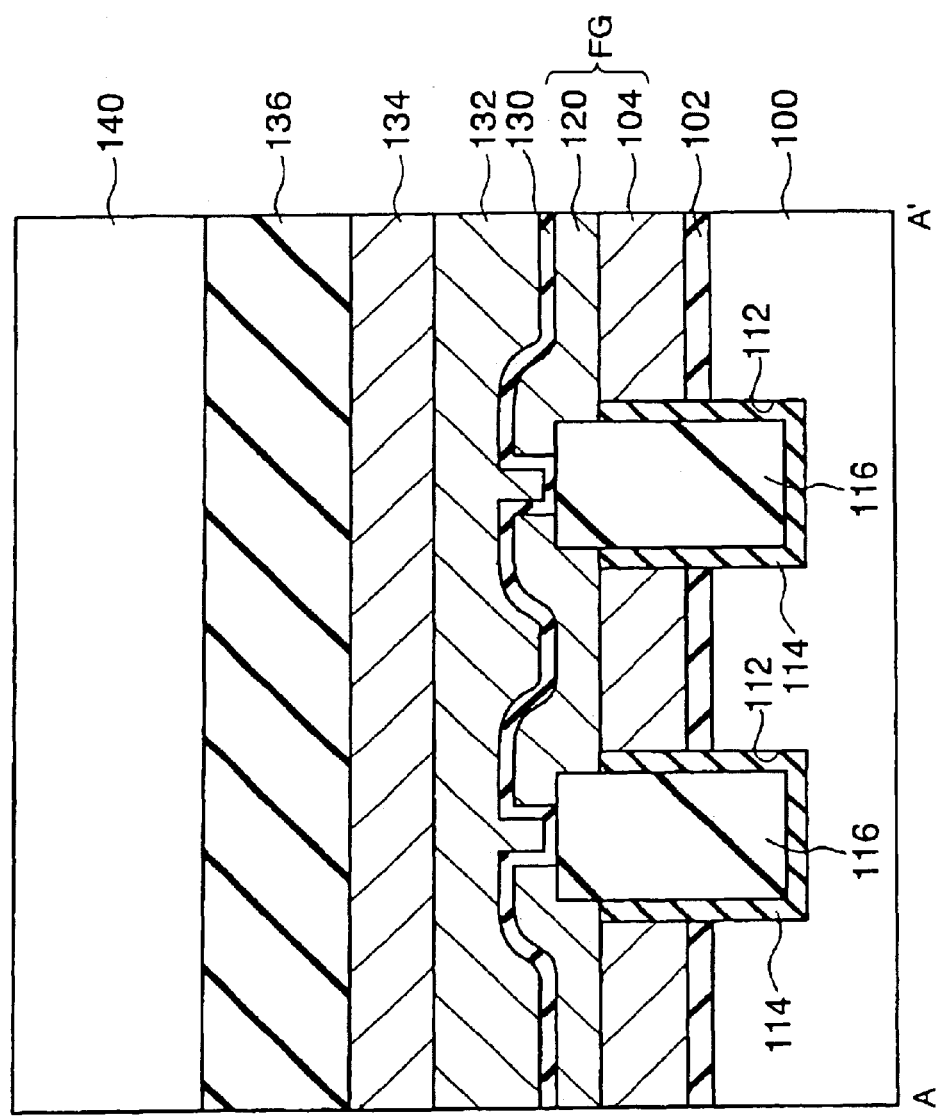
FIG. 13 is a sectional view showing a part of the manufacturing process of the related nonvolatile semiconductor memory device (cross-sectional view taken along the line A–A' in FIG. 2)
Figure 14:
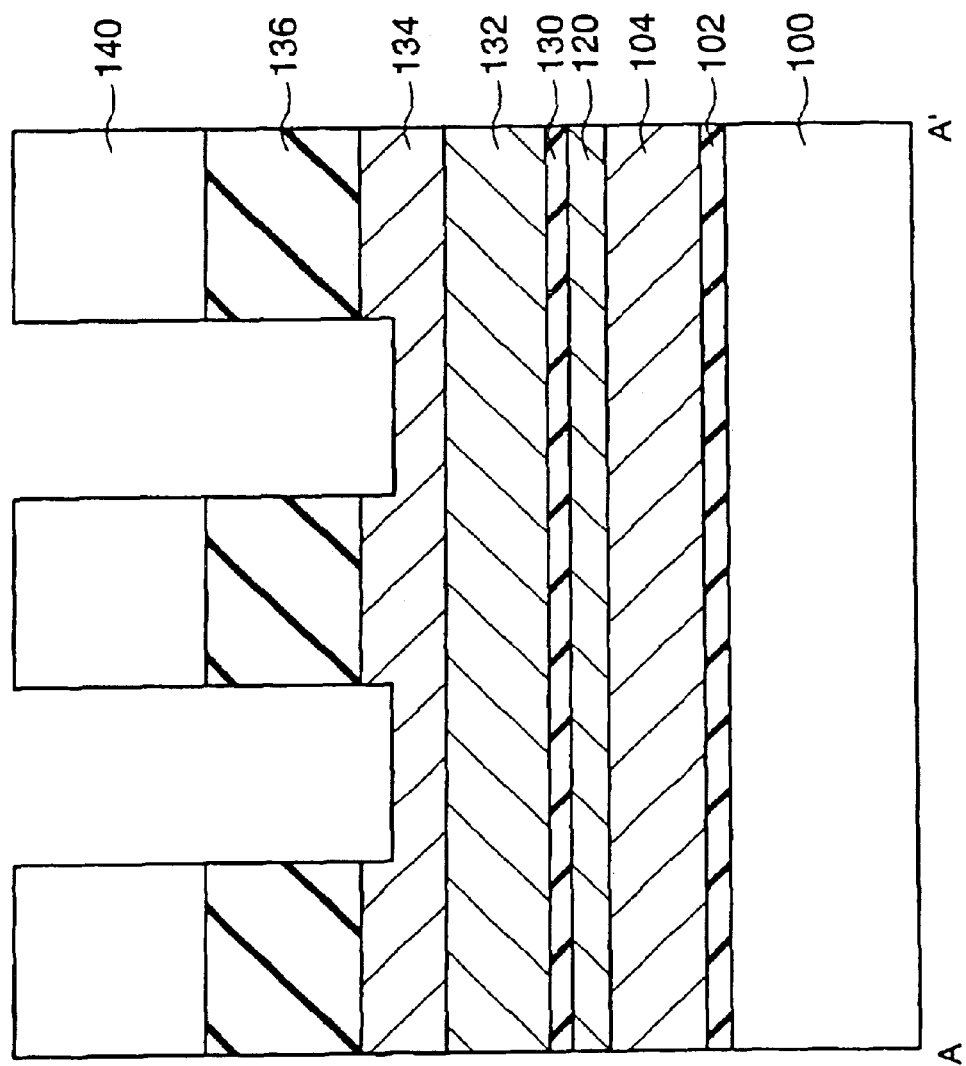
FIG. 14 is a sectional view showing a part of the manufacturing process of the related nonvolatile semiconductor memory device (cross-sectional view taken along the line B–B' in FIG. 2) and corresponding to FIG. 13.
Figure 15:
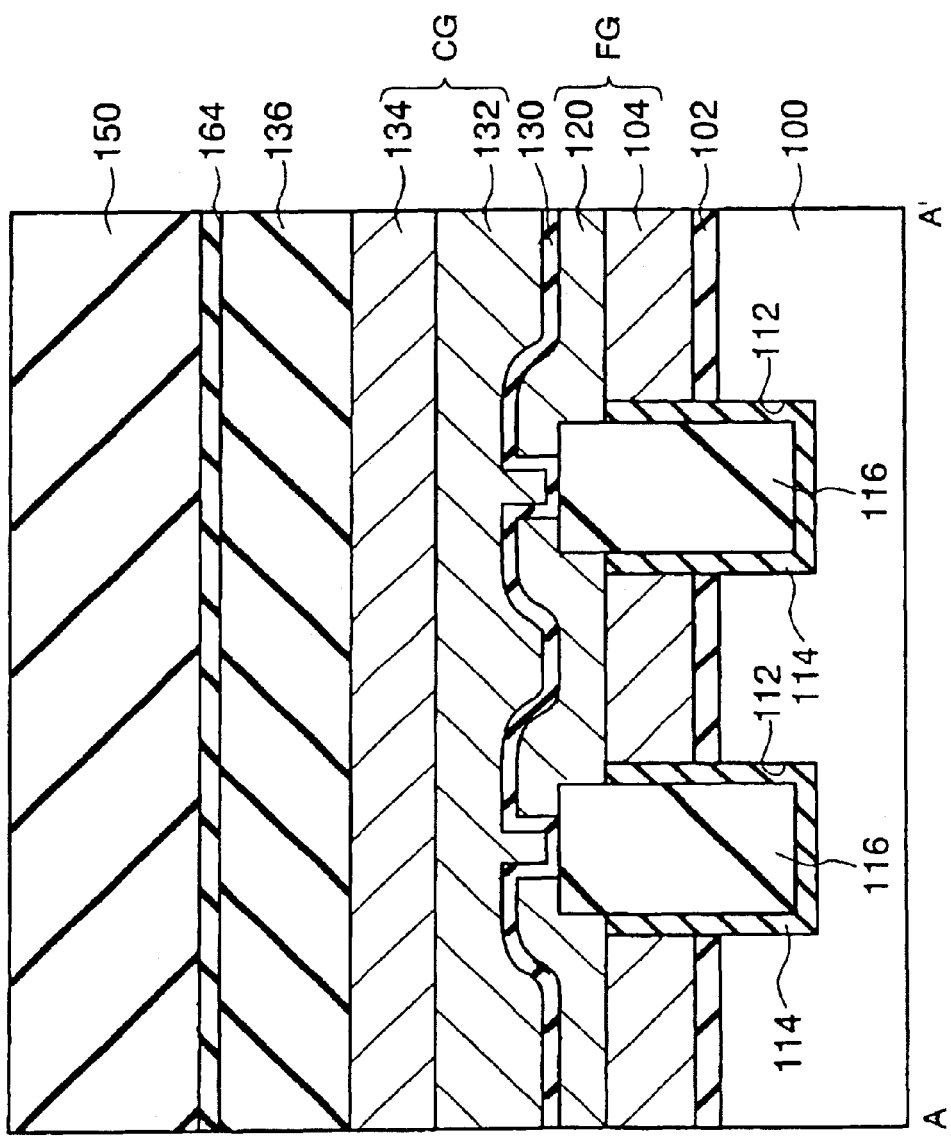
FIG. 15 is a sectional view showing a part of the manufacturing process of the related nonvolatile semiconductor memory device (cross-sectional view taken along the line A–A' in FIG. 2)
Figure 17:
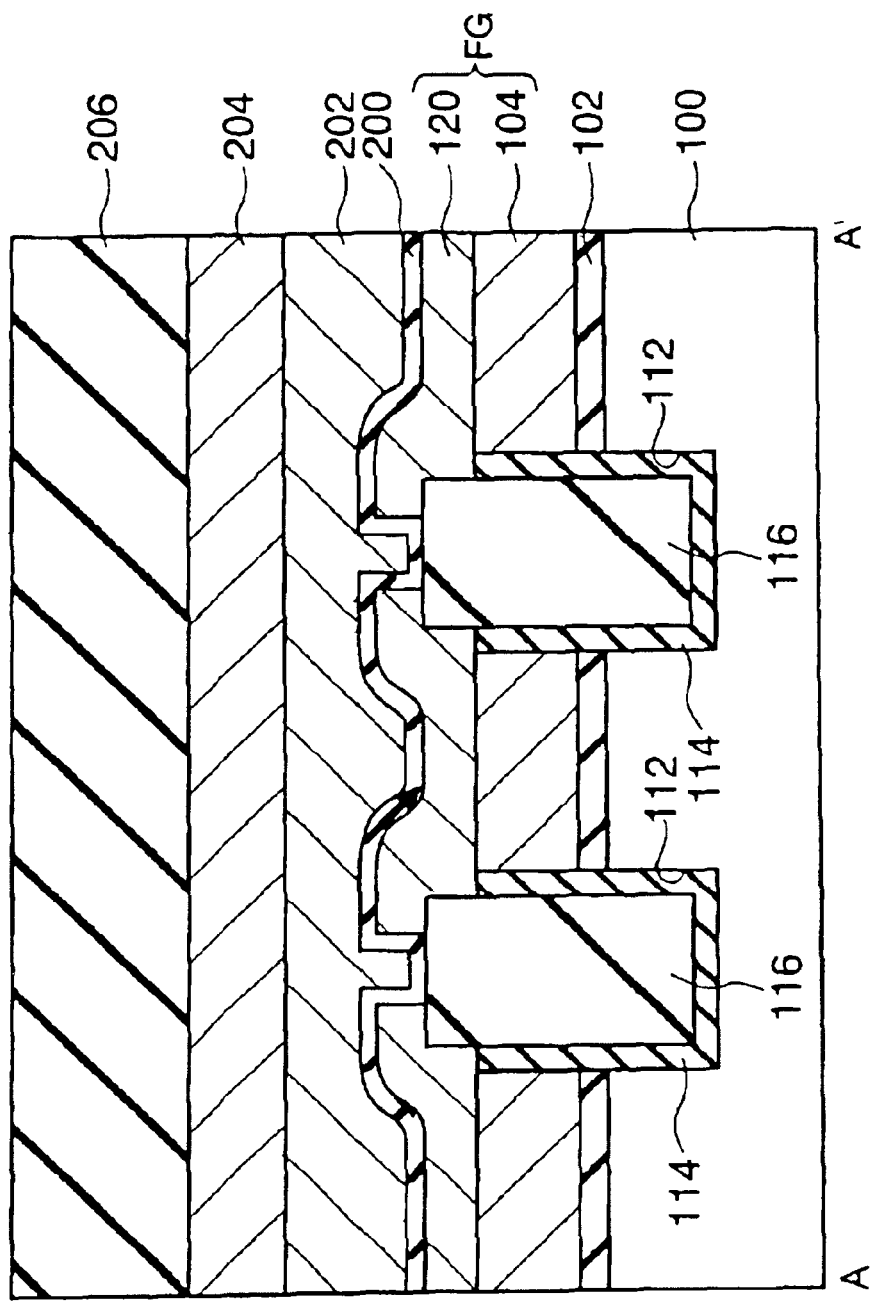
FIG. 17 is a sectional view showing a part of the manufacturing process of a nonvolatile semiconductor memory device according to a first embodiment (cross-sectional view taken along the line A–A' in FIG. 2)

After FIG. 11, in this embodiment, as shown in FIG. 17, an ONO film (a silicon oxide film—a silicon nitride film—a silicon oxide film) 200 is formed as an insulating film by the LPCVD method, and then the nonvolatile semiconductor memory device is heated in an oxygen atmosphere at 850° C. Subsequently, a third polysilicon film 202 is formed on the ONO film 200 by the LPCVD method. Thereafter, a tungsten silicide (WSi) film 204 is formed on the third polysilicon film 202 by the PVD (physical vapor deposition) method. Subsequently, a seventh silicon oxide film 206 is formed on the tungsten silicide film 204 by the LPCVD method at a temperature of 600° C. to 700° C. In this embodiment, the seventh silicon oxide film 206 is one example of an insulating film and has a thickness of 200 nm to 300 nm.

Figure 18:
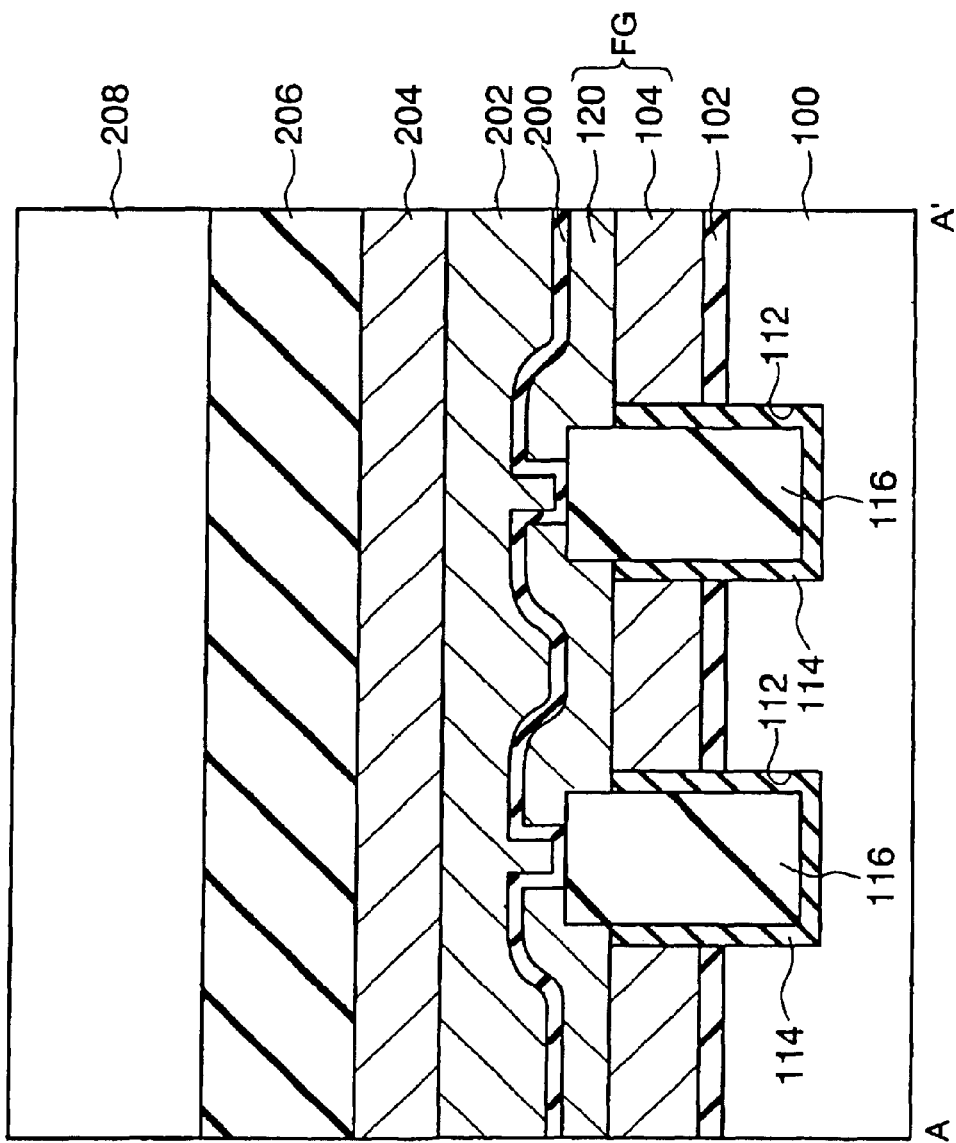
FIG. 18 is a sectional view showing a part of the manufacturing process of the nonvolatile semiconductor memory device according to the first embodiment (cross-sectional view taken along the line A–A' in FIG. 2)
Figure 19:
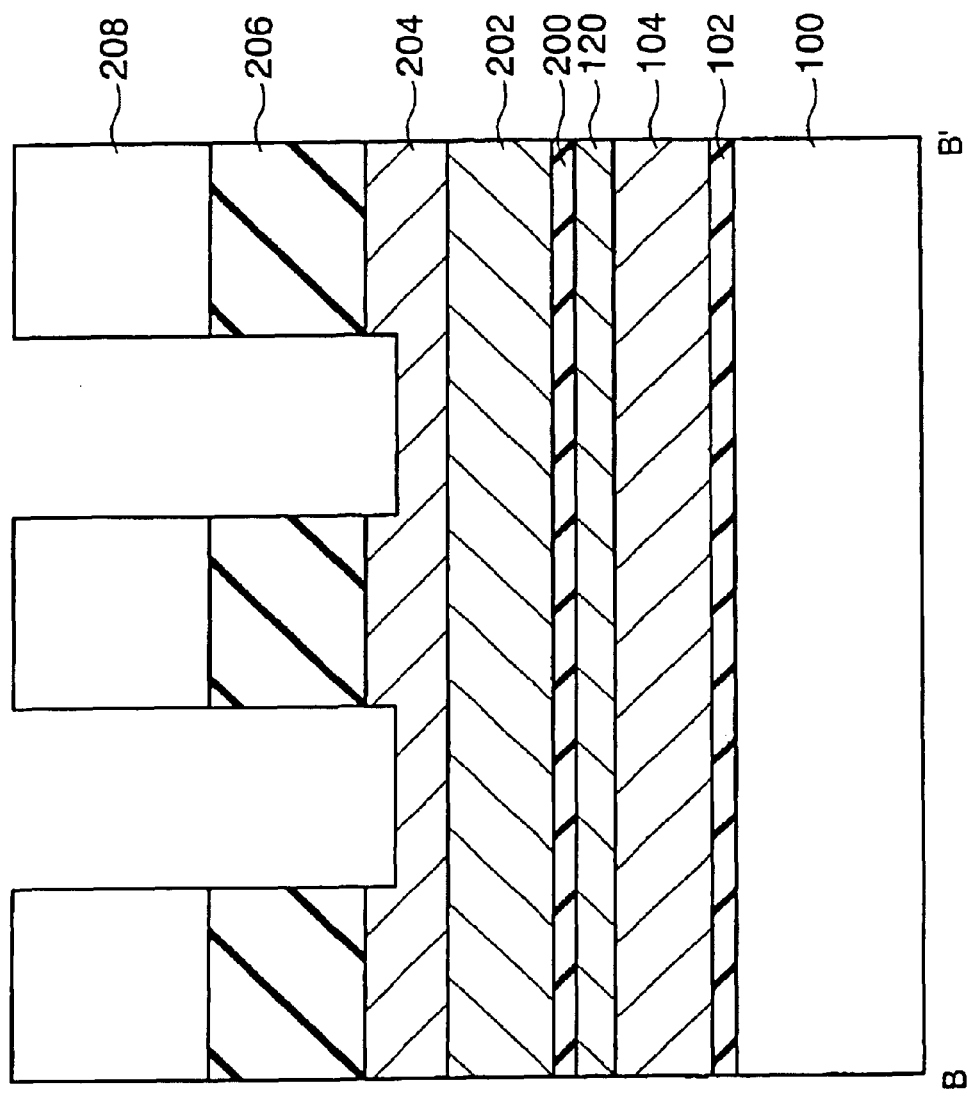
FIG. 19 is a sectional view showing a part of the manufacturing process of the nonvolatile semiconductor memory device according to the first embodiment (cross-sectional view taken along the line B–B' in FIG. 2) and corresponding to FIG. 18.

Next, as shown in FIG. 18 and FIG. 19, a photoresist 208 is applied to the seventh silicon oxide film 206 and then a predetermined pattern is produced in the photoresist 208 by the photoengraving process. That is, the photoresist 208 which has slits extending along the word line direction is formed. Thereafter, the seventh silicon oxide film 206 is etched by the RIE method using the photoresist 208 as a mask. In addition, the tungsten silicide 204 is also etched over. As a result, slits extending along the word line direction are formed in the seventh silicon oxide film 206.

Figure 20:
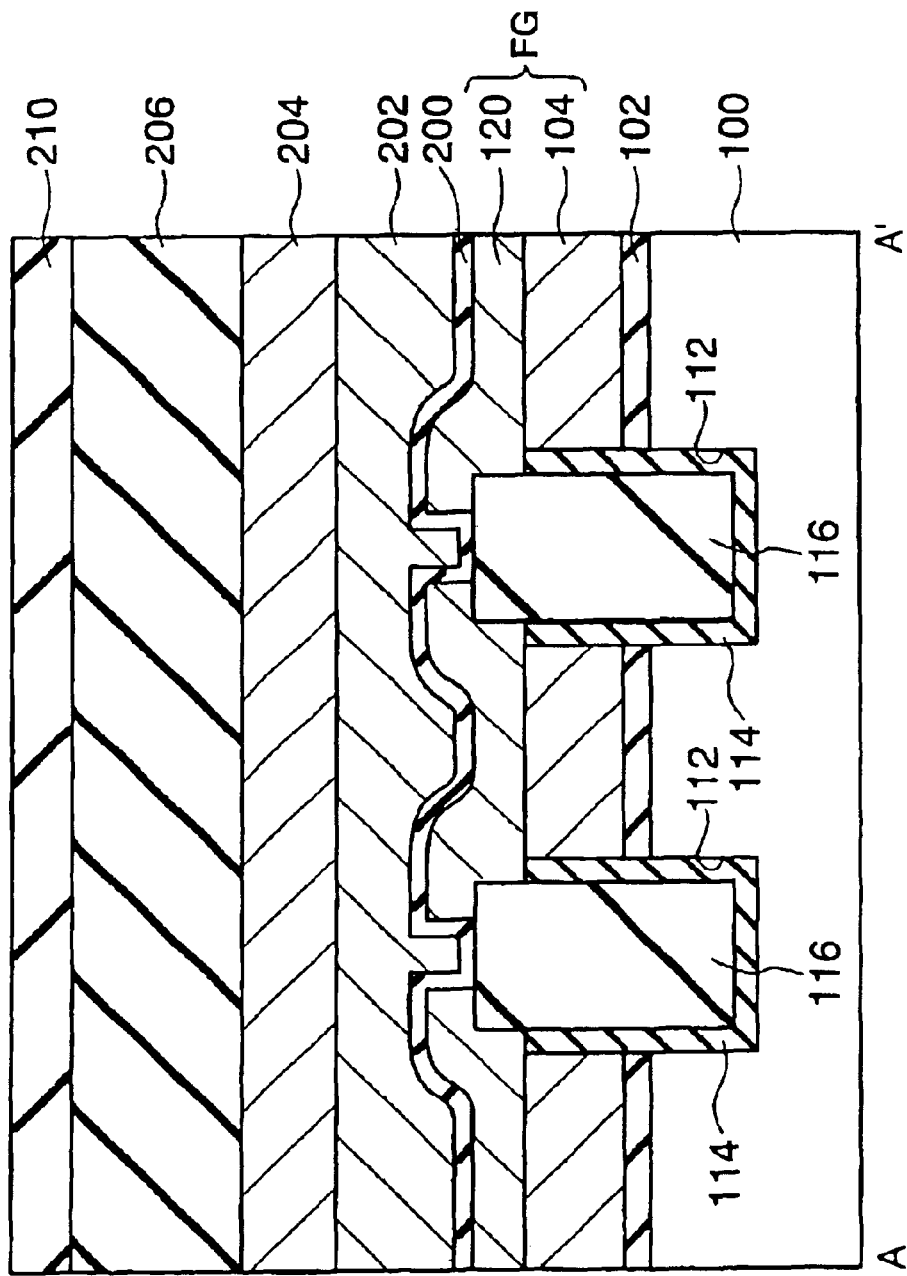
FIG. 20 is a sectional view showing a part of the manufacturing process of the nonvolatile semiconductor memory device according to the first embodiment (cross-sectional view taken along the line A–A' in FIG. 2)
Figure 21:
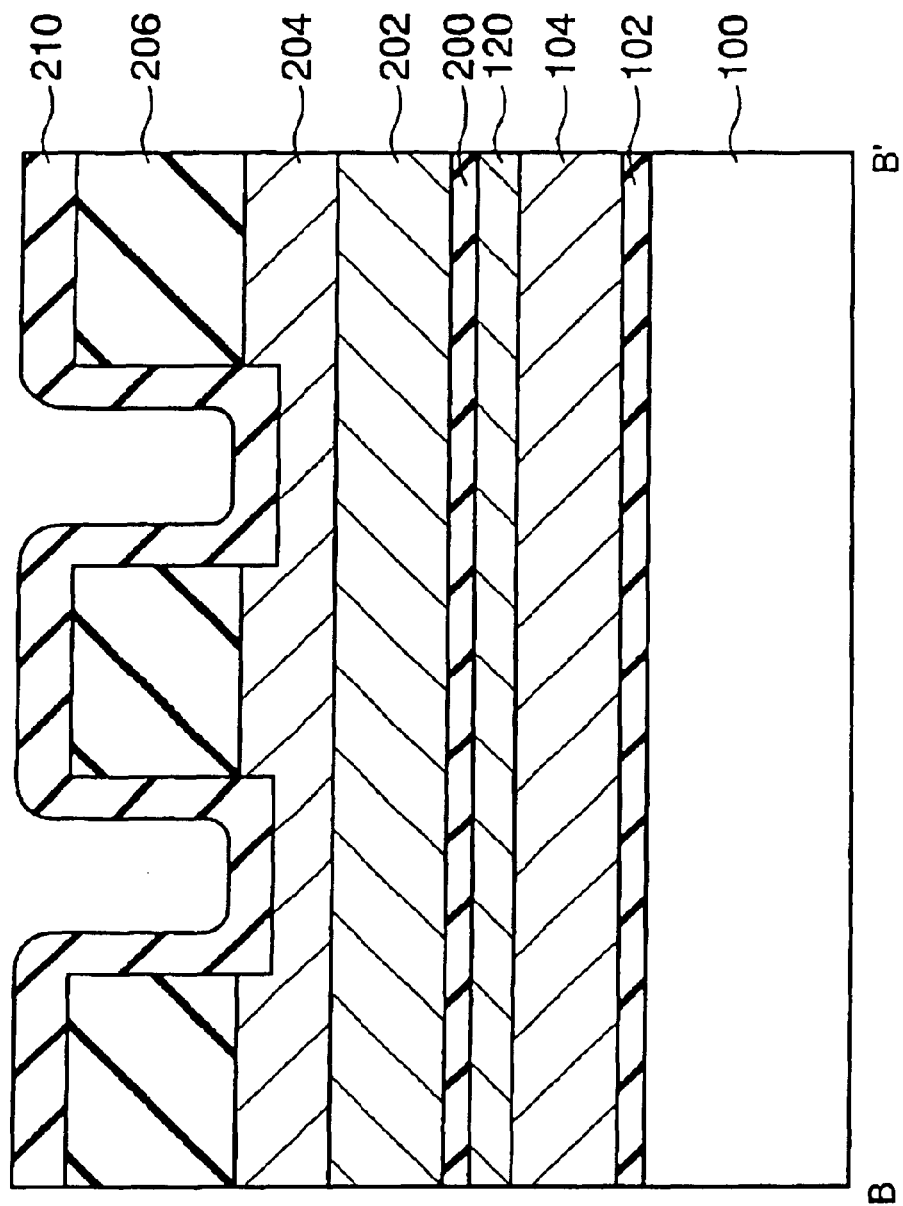
FIG. 21 is a sectional view showing a part of the manufacturing process of the nonvolatile semiconductor memory device according to the first embodiment (cross-sectional view taken along the line B–B' in FIG. 2) and corresponding to FIG. 20.

Next, as shown in FIG. 20 and FIG. 21, the photoresist 208 is removed. Thereafter, a silicon oxide film 210 is formed by the LPCVD method at a temperature below 600° C. In this embodiment, the silicon oxide film 210 is one example of an insulating film and has a thickness of 20 nm. The reason why the silicon oxide film 210 is formed at a temperature below 600° C. is as follows. That is, when the seventh silicon oxide film 206 is formed, the tungsten silicide film 204 of the nonvolatile semiconductor memory device is exposed to a temperature of 600° C. to 700° C., which is the temperature above 600° C. As a result, silicon in the surface side of the tungsten silicide (WSi) film 204 has already reacted with oxygen, so that unreacted silicon does not remain in the surface side thereof. In this condition, if the silicon oxide film 210 is formed at the temperature above 600° C., i.e. at the temperature at which the tungsten silicide reacts with oxygen, then tungsten (W) in the tungsten silicide (WSi) film 204 reacts with oxygen and hence abnormal oxide ($W_2O_3$) is formed in the tungsten silicide film 204.

Accordingly, in this embodiment, the silicon oxide film 210 is formed by the LPCVD method at the temperature below 600° C. i.e. at the temperature at which the tungsten silicide hardly reacts with oxygen. Viewed in this light, there is no lower limit of the temperature at which the silicon oxide film 210 is formed, but the temperature such that the silicon oxide film 210 can be formed by the LPCVD method is needed.

Figure 22:
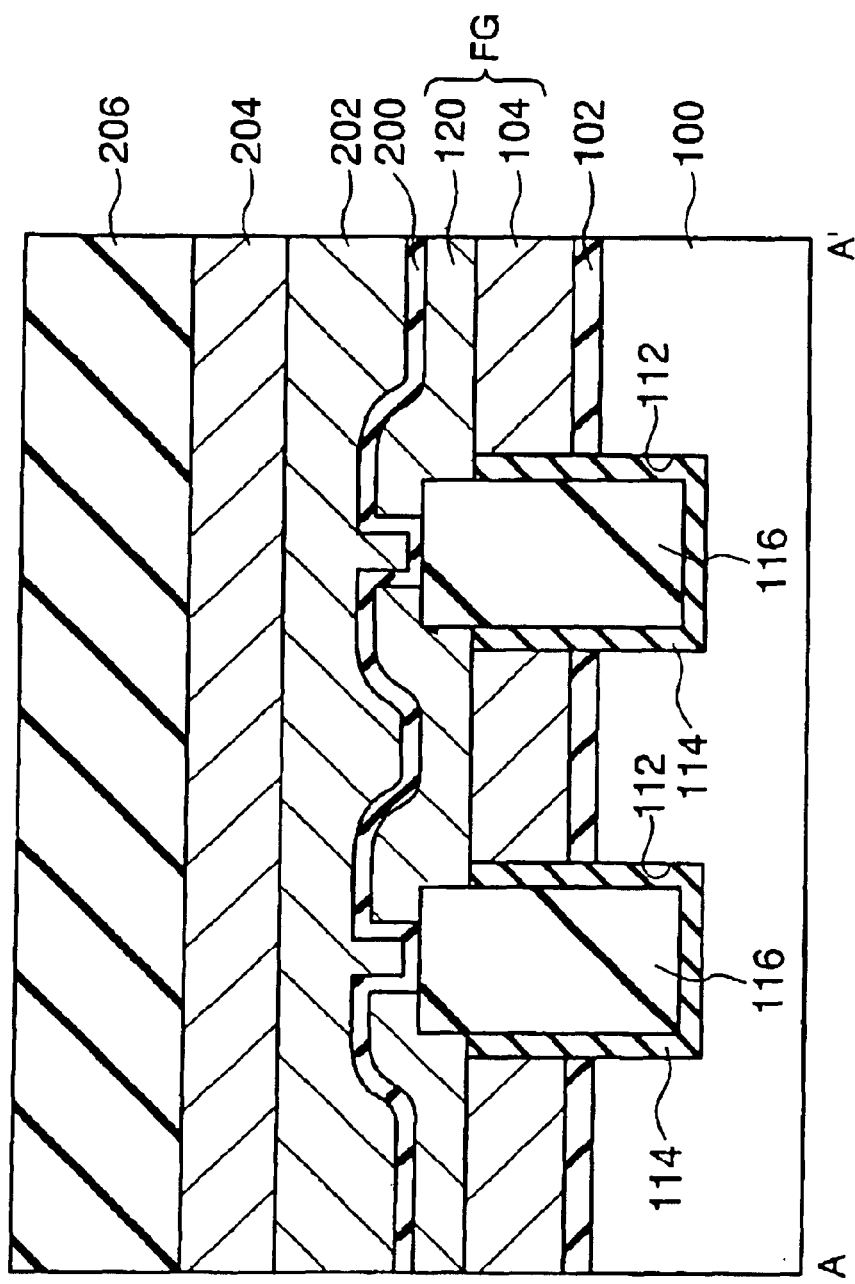
FIG. 22 is a sectional view showing a part of the manufacturing process of the nonvolatile semiconductor memory device according to the first embodiment (cross-sectional view taken along the line A–A' in FIG. 2)
Figure 23:
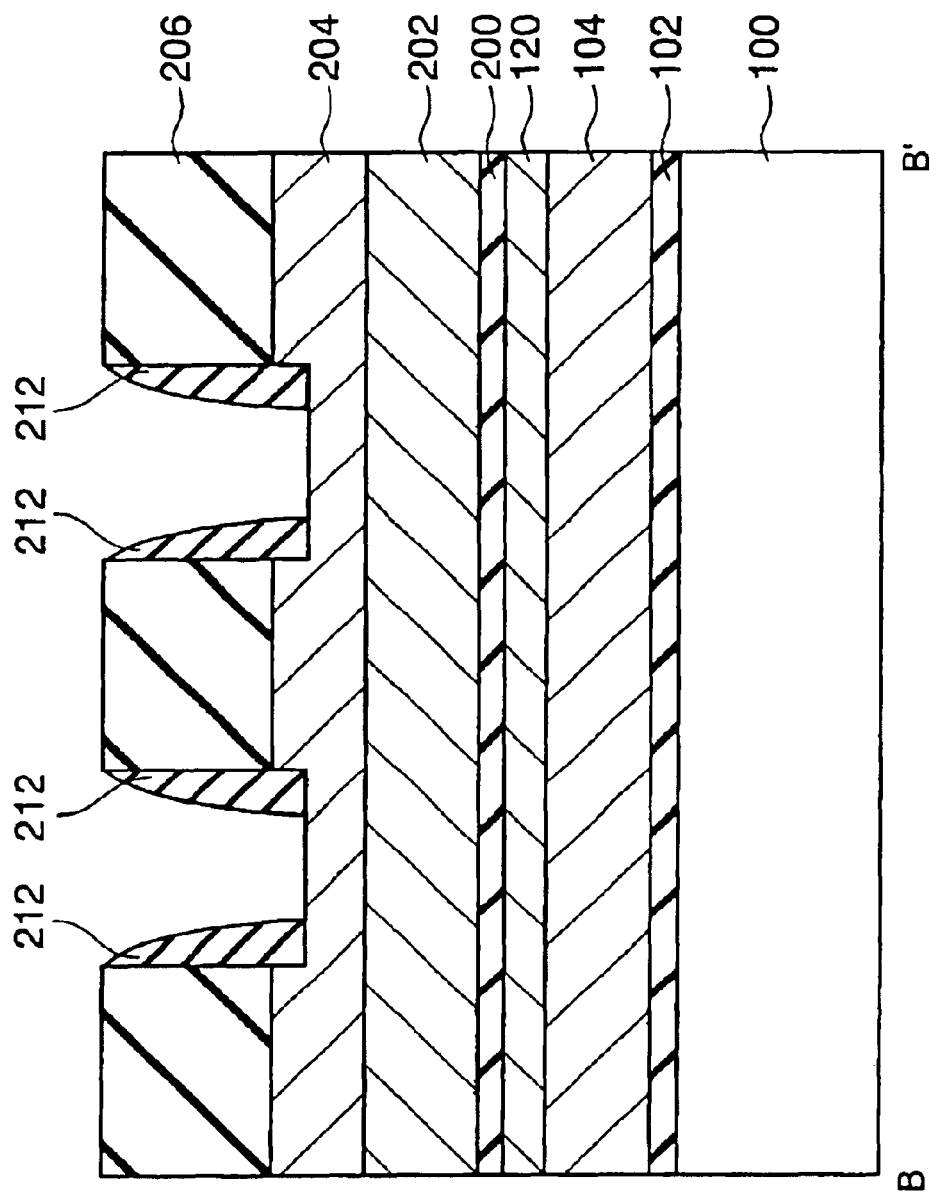
FIG. 23 is a sectional view showing a part of the manufacturing process of the nonvolatile semiconductor memory device according to the first embodiment (cross-sectional view taken along the line B–B' in FIG. 2) and corresponding to FIG. 22.

Next, as shown in FIG. 22 and FIG. 23, by etching back the silicon oxide film 210, sidewalls 212 are formed on both sides of the seventh silicon oxide film 206 in the slits. That is, by etching back the silicon oxide film 210, the silicon oxide film 210 is made into the sidewalls 212 by the self-alignment process.

Figure 24:
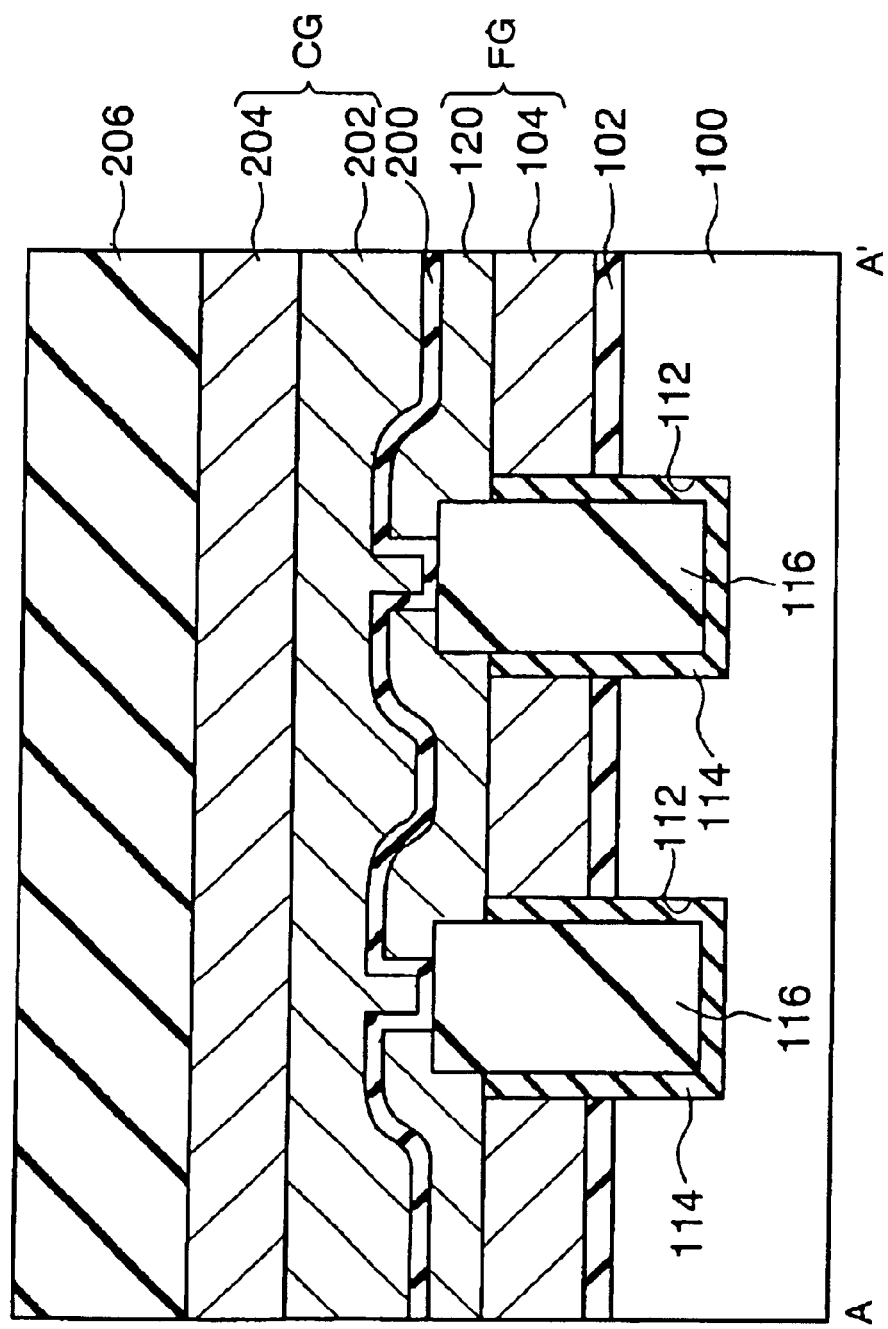
FIG. 24 is a sectional view showing a part of the manufacturing process of the nonvolatile semiconductor memory device according to the first embodiment (cross-sectional view taken along the line A–A' in FIG. 2)
Figure 25:
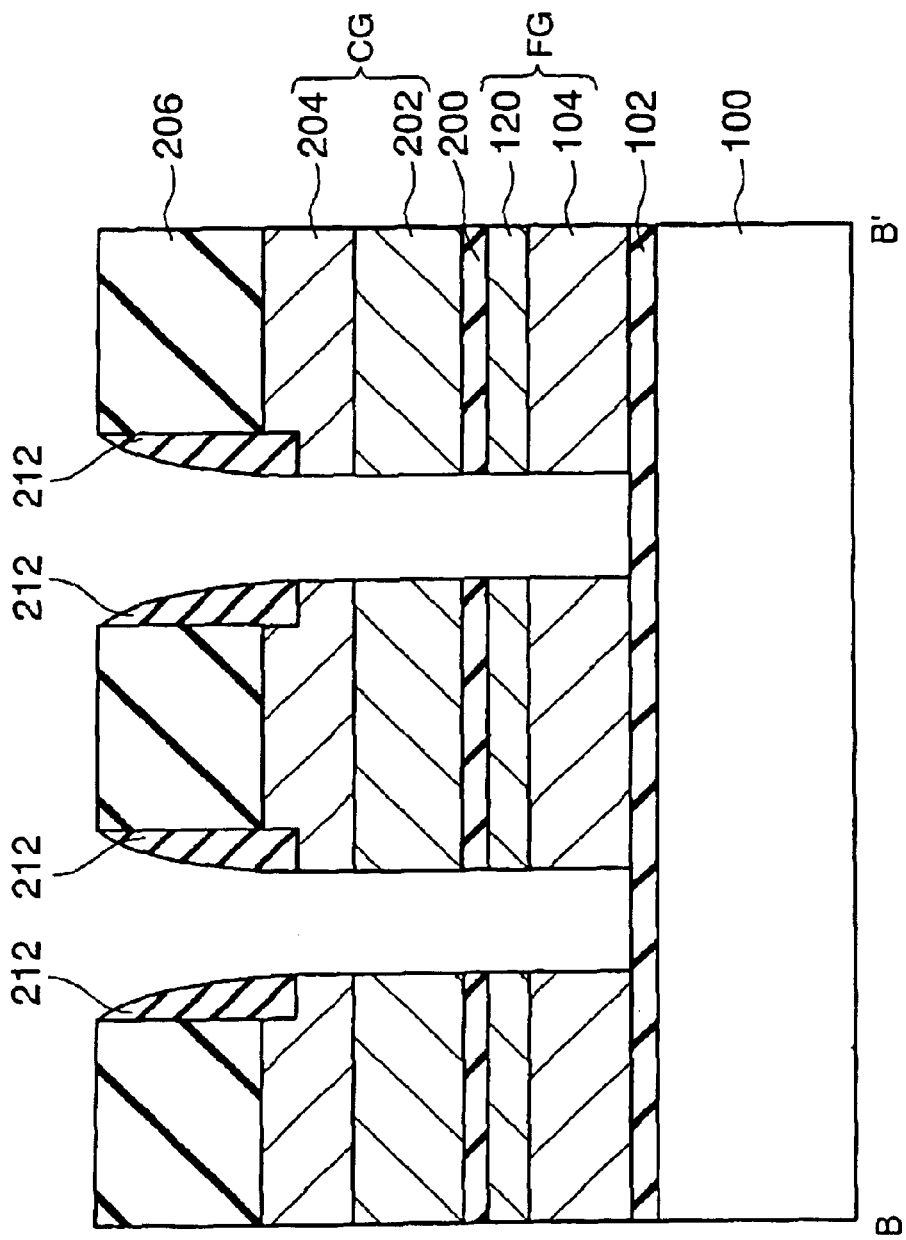
FIG. 25 is a sectional view showing a part of the manufacturing process of the nonvolatile semiconductor memory device according to the first embodiment (cross-sectional view taken along the line B–B' in FIG. 2) and corresponding to FIG. 24.

Next, as shown in FIG. 24 and FIG. 25, the tungsten silicide film 204, the third polysilicon film 202, the ONO film 200, the second polysilicon film 120 and the first polysilicon film 104 are etched using the seventh silicon oxide film 206 and the sidewalls 212 formed of the silicon oxide film 210 as a mask. Thereby, the tungsten silicide film 204, the third polysilicon film 202, the ONO film 200, the second polysilicon film 120 and the first polysilicon film 104 are separated in the word line direction. As a result, tungsten silicide film 204 and the third polysilicon film 202 constitute control gate electrodes CG, and the first polysilicon film 104 and the second polysilicon film 120 constitute floating gate electrodes FG. In addition, steps like stairs are formed in the top corners of the tungsten silicide film 204 of the control gate electrode CG, and the sidewalls 212 are positioned on the steps.

Figure 26:
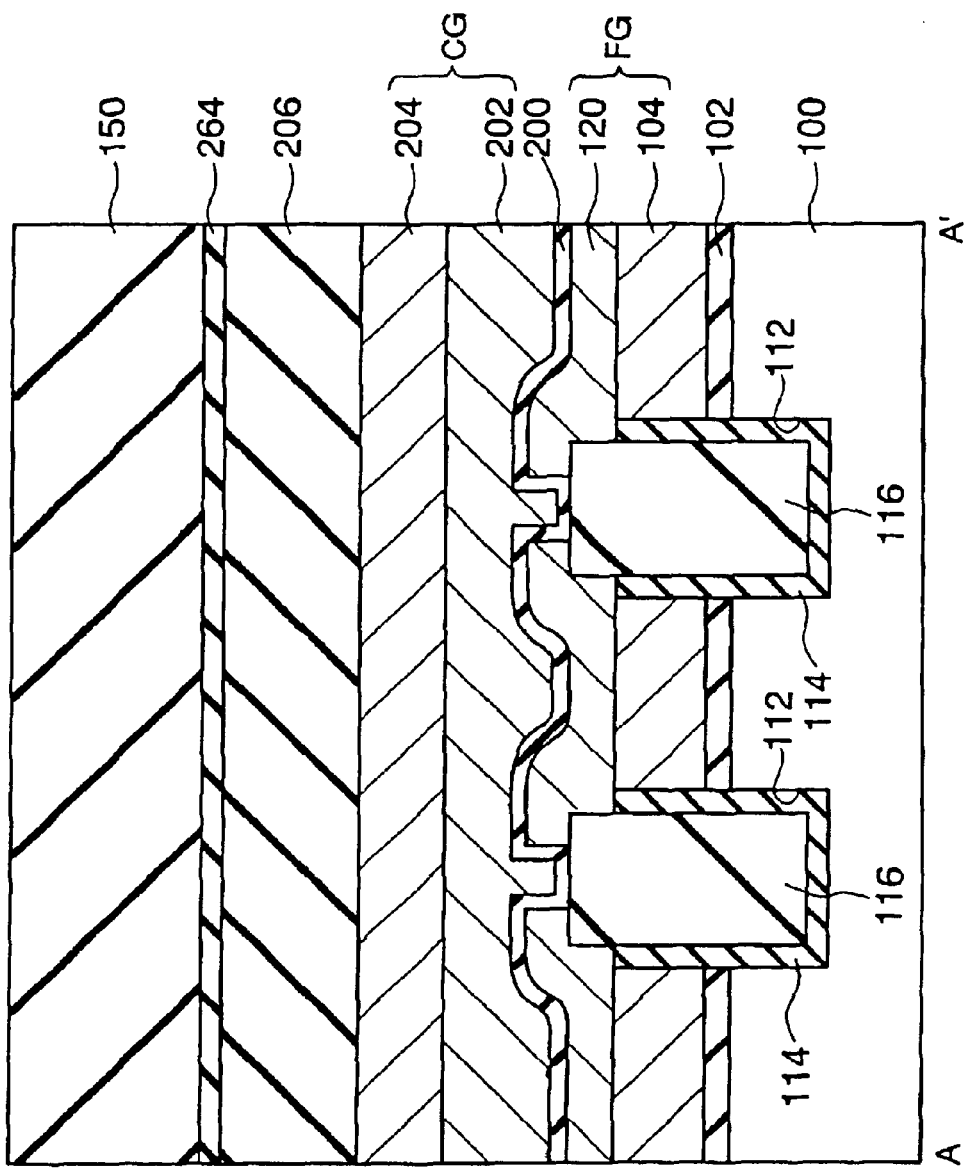
FIG. 26 is a sectional view showing a part of the manufacturing process of the nonvolatile semiconductor memory device according to the first embodiment (cross-sectional view taken along the line A–A' in FIG. 2)
Figure 27:
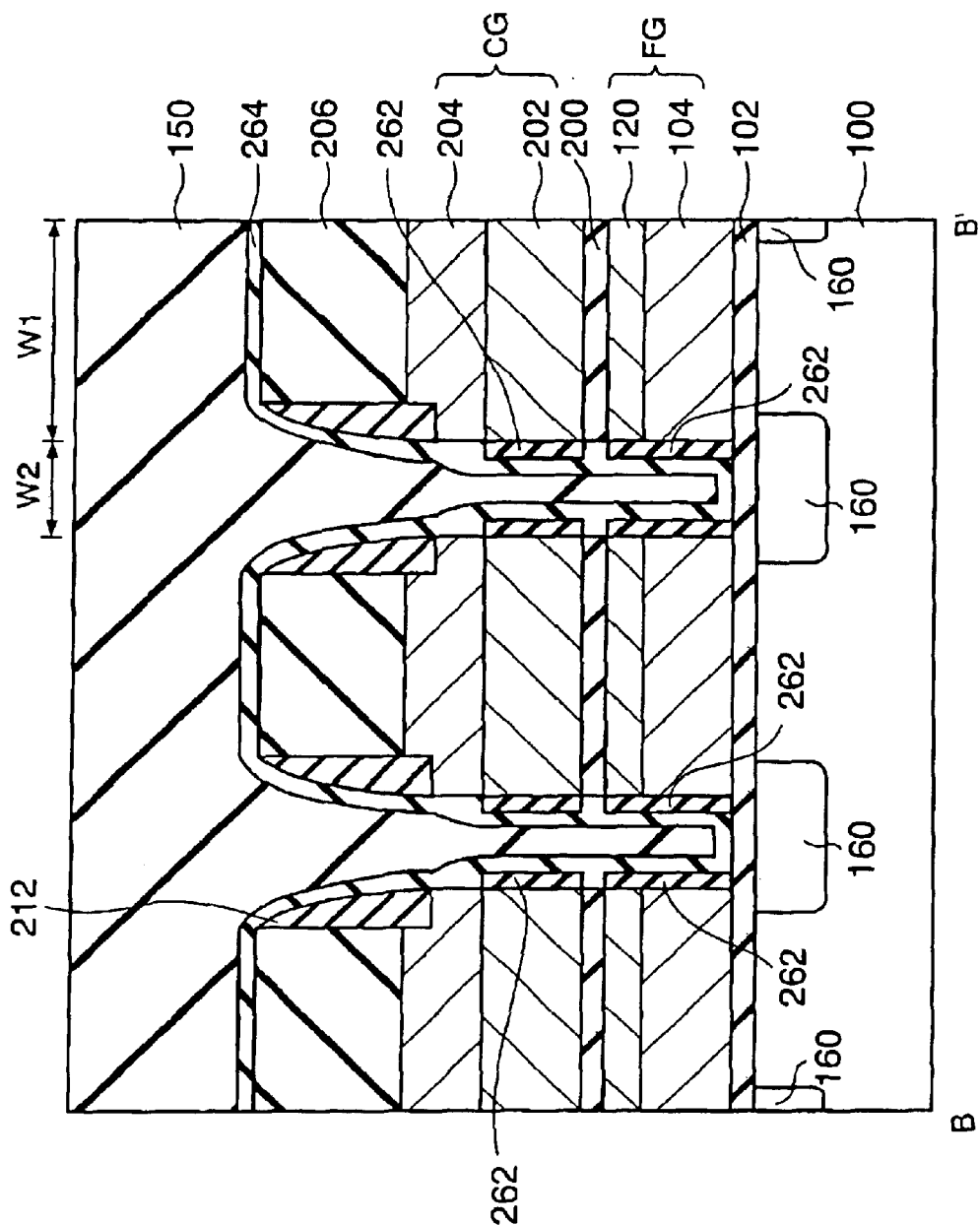
FIG. 27 is a sectional view showing a part of the manufacturing process of the nonvolatile semiconductor memory device according to the first embodiment (cross-sectional view taken along the line B–B' in FIG. 2) and corresponding to FIG. 26.

Next, as shown in FIG. 26 and FIG. 27, on both sides of the first polysilicon films 104, the second polysilicon films 120 and the third polysilicon films 202 in the word line direction, oxide films 262 which are an example of an insulating film are formed by the oxide process (RTO). Thereafter, source/drain regions 160 are formed by the ion implanting process. Subsequently, a silicon nitride film 264 which is an example of an insulating film is formed so as to cover every memory cell, and the silicon nitride film 264 has a thickness of 40 nm.

Thereafter, an interlayer dielectric film 150 is formed so as to be embedded in gaps between the memory cells and so as to cover every memory cell. The process for forming the interlayer dielectric film 150 is the same as that of the related art mentioned above. However, in this embodiment, the sidewalls 212 are formed in the top corners of the seventh silicon oxide film 206 on the control gate electrodes CG and each of the sidewalls 212 has a gentle slope. Therefore, when the interlayer dielectric film 150 is formed in width W2 between memory cells, the interlayer dielectric film 150 is easily embedded therebetween and hence it is possible to avoid making the embedding failure.

In addition, the seventh silicon oxide film 206 is formed at a temperature of 600° C. to 700° C., which is above a temperature of 600° C. at which tungsten silicide reacts with oxygen, and then the silicon oxide film 210 is formed at a temperature below 600° C. in this embodiment, but these temperatures can be exchanged. That is, the seventh silicon oxide 206 may be formed at a temperature below 600° C. and the silicon oxide film 210 may be formed at a temperature of 600° C. to 700° C., which is above a temperature of 600° C. Moreover, both the seventh silicon oxide film 206 and the silicon oxide film 210 may be formed at temperatures below 600° C.

(Second Embodiment)

A second embodiment is a modified version of the first embodiment mentioned above, more specifically, the silicon oxide films 206 and 210 in the first embodiment are changed into silicon nitride films. Incidentally, the manufacturing process of a nonvolatile semiconductor memory device according to this embodiment is also the same as that of the first embodiment until FIG. 11.

Figure 28:
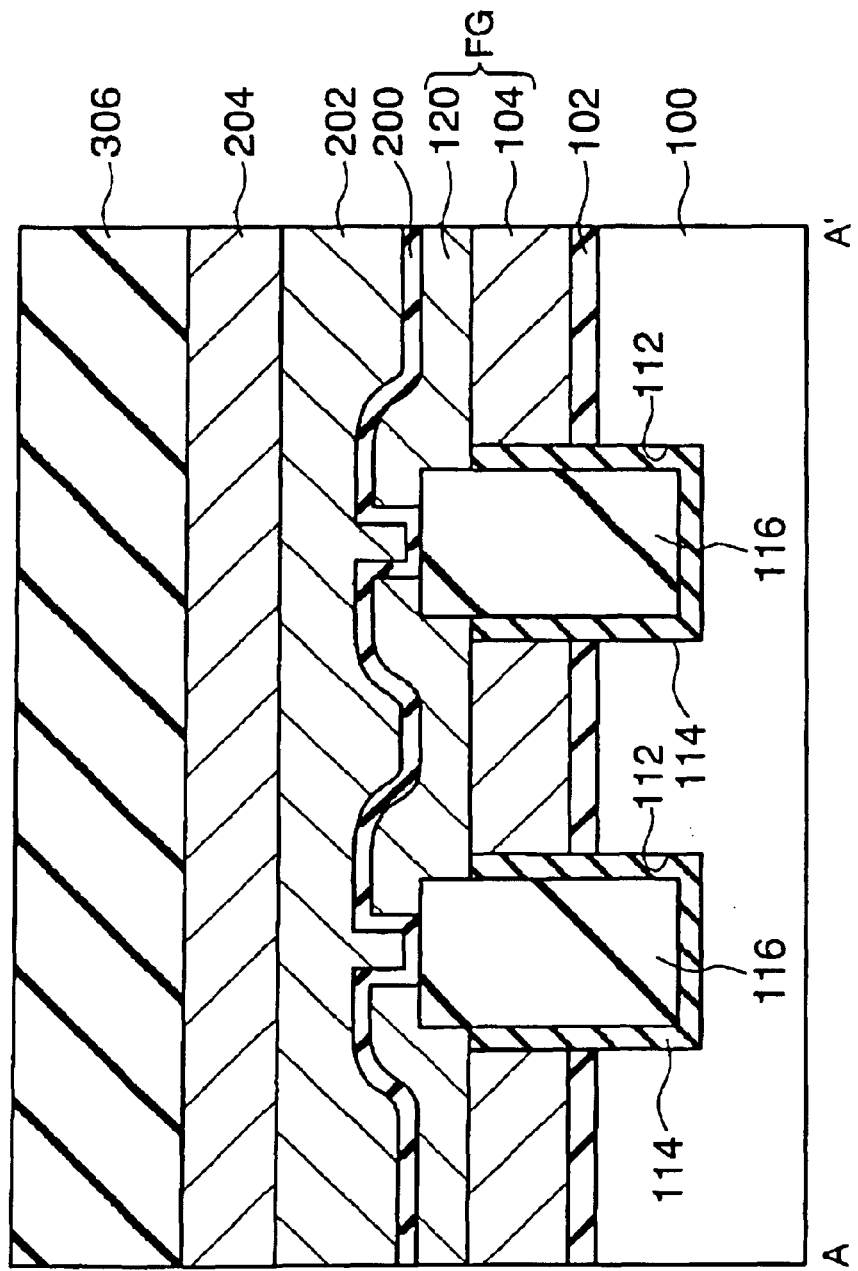
FIG. 28 is a sectional view showing a part of the manufacturing process of a nonvolatile semiconductor memory device according to a second embodiment (cross-sectional view taken along the line A–A' in FIG. 2)

After FIG. 11, in this embodiment, as shown in FIG. 28, an ONO film (a silicon oxide film—a silicon nitride film—a silicon oxide film) 200 is formed as an insulating film by the LPCVD method, and then the nonvolatile semiconductor memory device is heated in an oxygen atmosphere at 850° C. Subsequently, a third polysilicon film 202 is formed on the ONO film 200 by the LPCVD method. Thereafter, a tungsten silicide (WSi) film 204 is formed on the third polysilicon film 202 by the PVD (physical vapor deposition) method. Subsequently, a silicon nitride film 306 is formed on the tungsten silicide film 204 by the LPCVD method at a temperature of 700° C. to 800° C. In this embodiment, the silicon nitride film 306 is one example of an insulating film and has a thickness of 200 nm to 300 nm.

Figure 29:
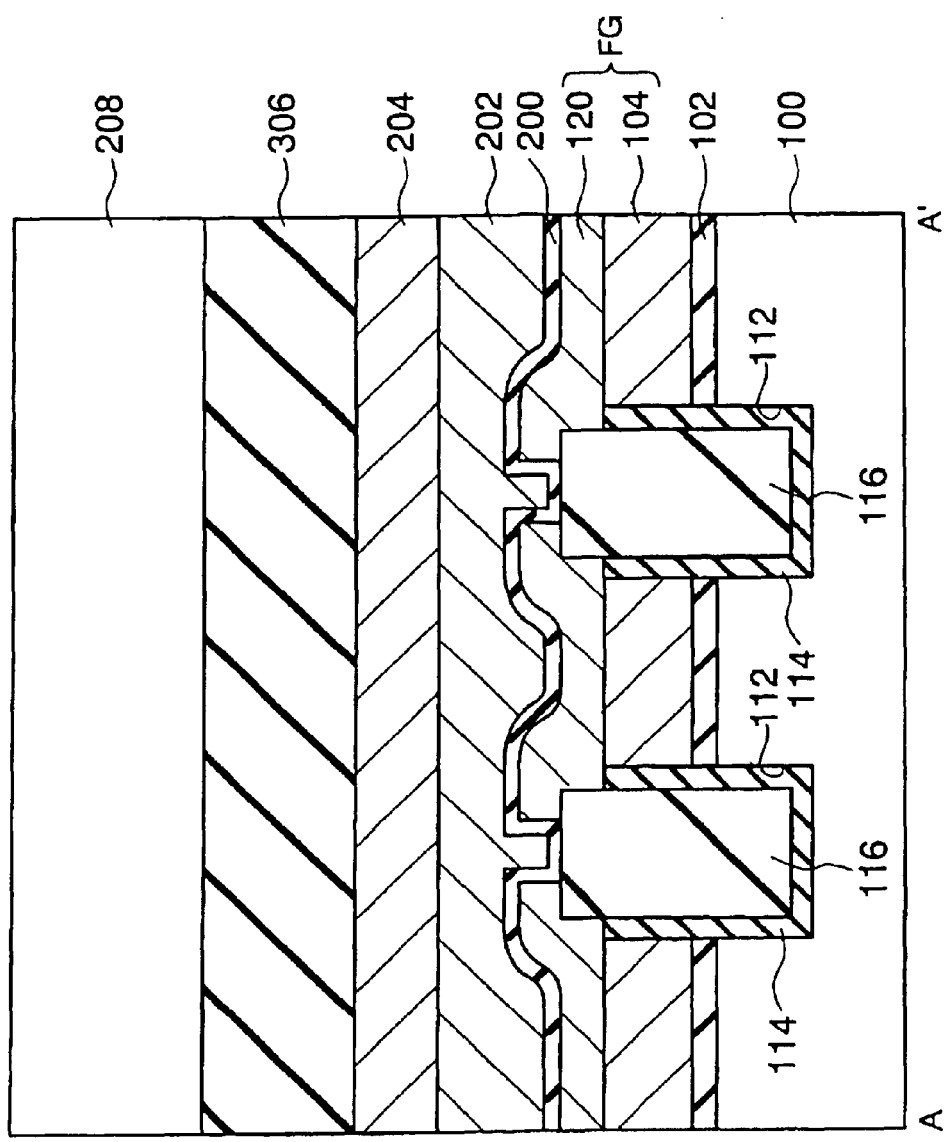
FIG. 29 is a sectional view showing a part of the manufacturing process of the nonvolatile semiconductor memory device according to the second embodiment (cross-sectional view taken along the line A–A' in FIG. 2)
Figure 30:
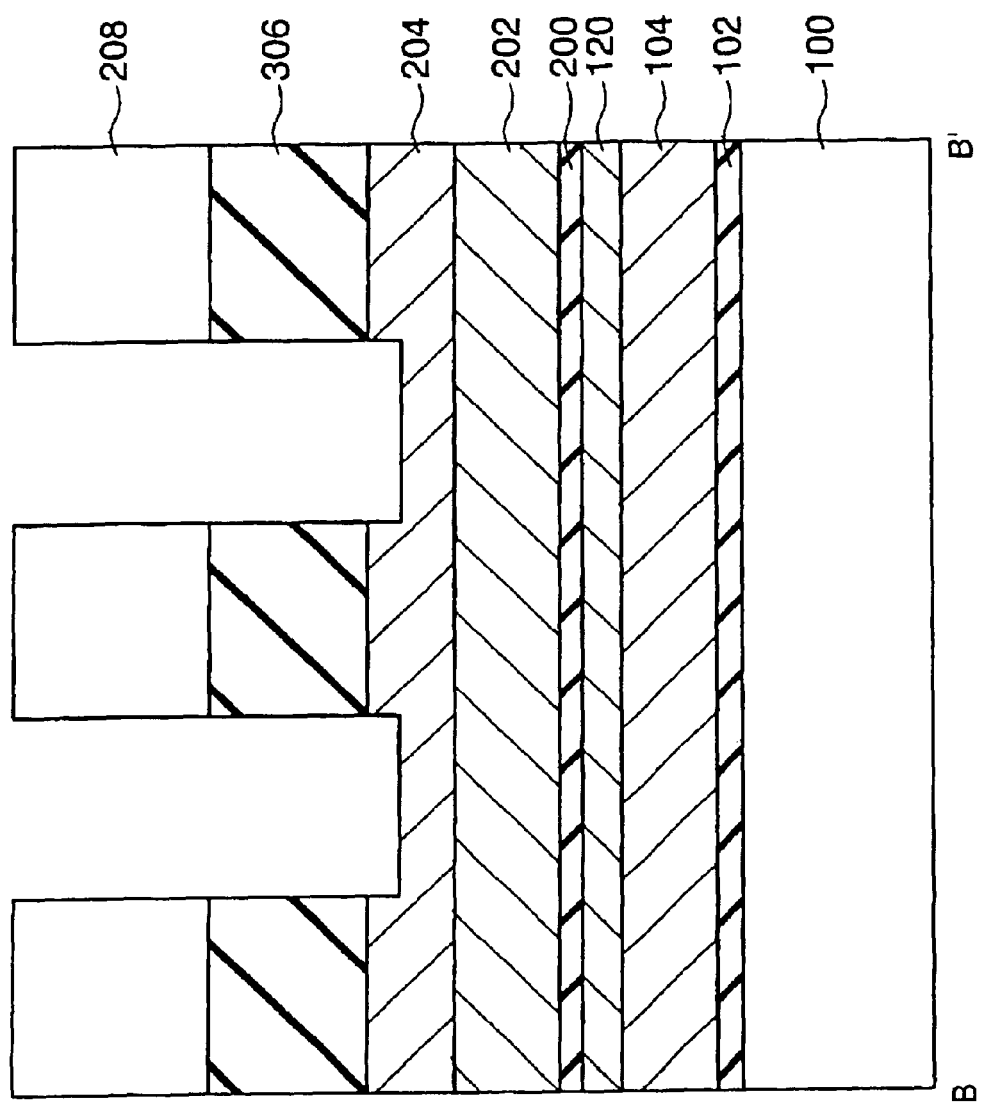
FIG. 30 is a sectional view showing a part of the manufacturing process of the nonvolatile semiconductor memory device according to the second embodiment (cross-sectional view taken along the line B–B' in FIG. 2) and corresponding to FIG. 29.

Next, as shown in FIG. 29 and FIG. 30, a photoresist 208 is applied to the silicon nitride film 306 and then a predetermined pattern is produced in the photoresist 208 by the photoengraving process. That is, the photoresist 208 which has slits extending along the word line direction is formed. Thereafter, the silicon nitride film 306 is etched by the RIE method using the photoresist 208 as a mask. In addition, the tungsten silicide 204 is also etched over. As a result, slits extending along the word line direction are formed in the silicon nitride film 306.

Figure 31:
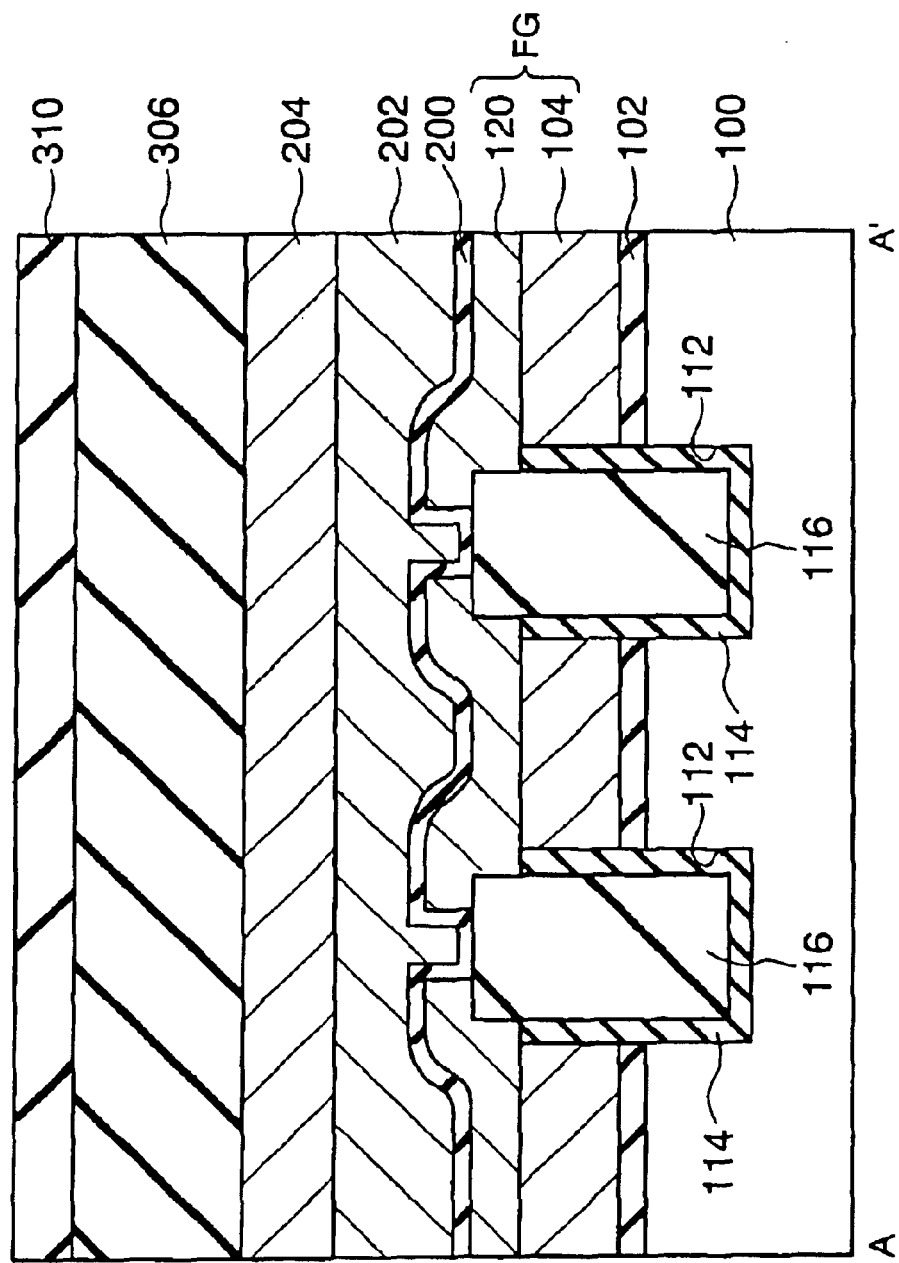
FIG. 31 is a sectional view showing a part of the manufacturing process of the nonvolatile semiconductor memory device according to the second embodiment (cross-sectional view taken along the line A–A' in FIG. 2)
Figure 32:
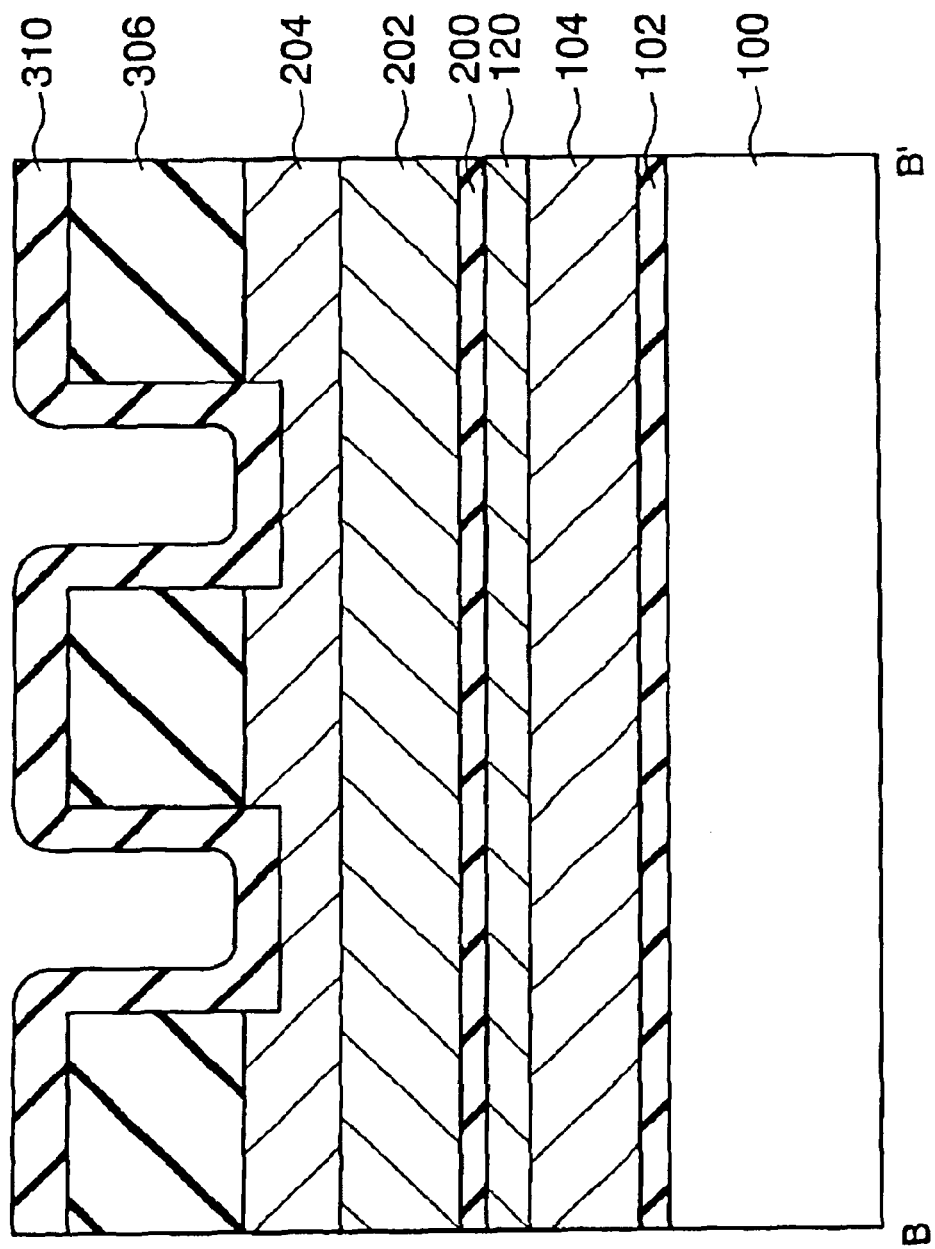
FIG. 32 is a sectional view showing a part of the manufacturing process of the nonvolatile semiconductor memory device according to the second embodiment (cross-sectional view taken along the line B–B' in FIG. 2) and corresponding to FIG. 31.

Next, as shown in FIG. 31 and FIG. 32, the photoresist 208 is removed. Thereafter, a silicon nitride film 310 is formed by the LPCVD method at a temperature below 600° C. In this embodiment, the silicon nitride film 310 is one example of an insulating film and has a thickness of 20 nm. The reason why the silicon nitride film 310 is formed at a temperature below 600° C. is the same as that of the first embodiment.

Figure 33:
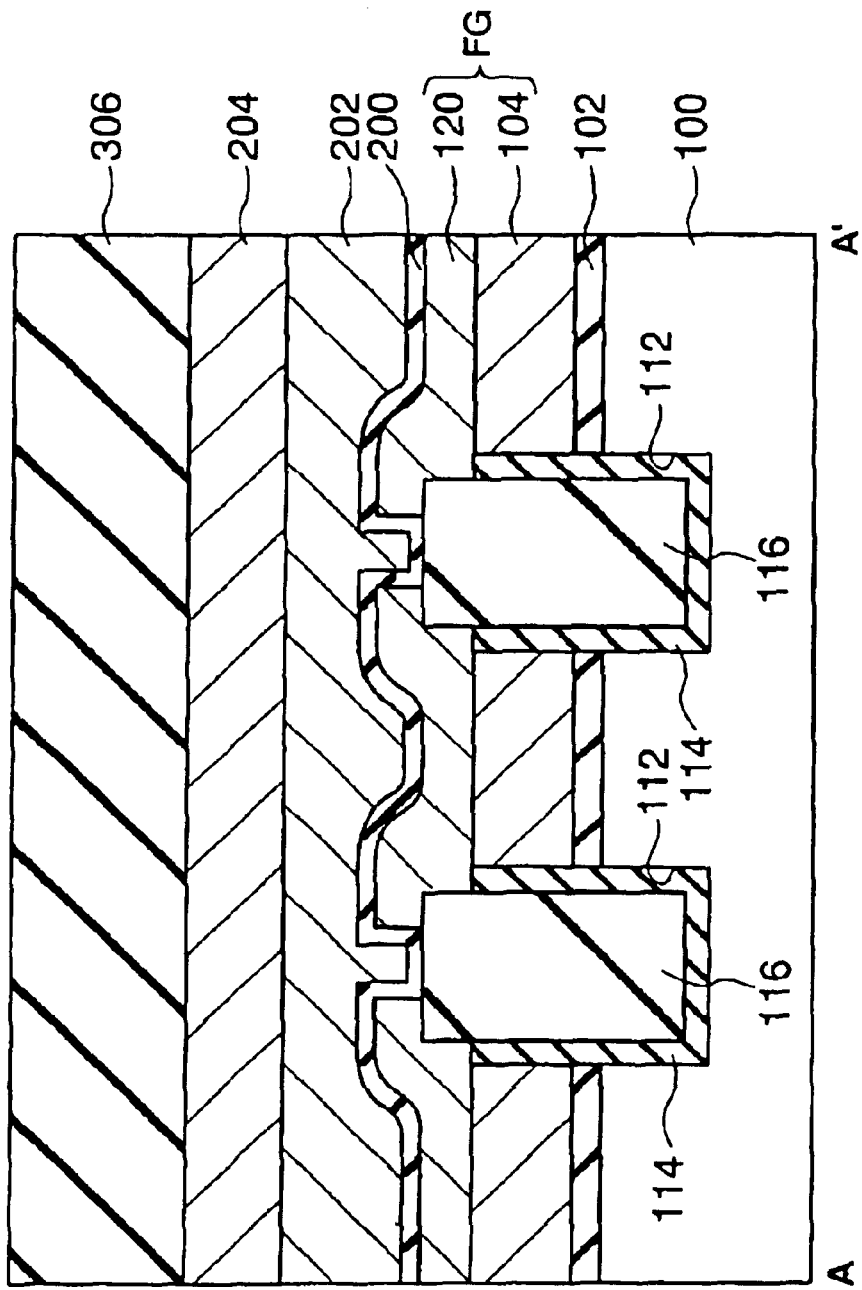
FIG. 33 is a sectional view showing a part of the manufacturing process of the nonvolatile semiconductor memory device according to the second embodiment (cross-sectional view taken along the line A–A' in FIG. 2)
Figure 34:
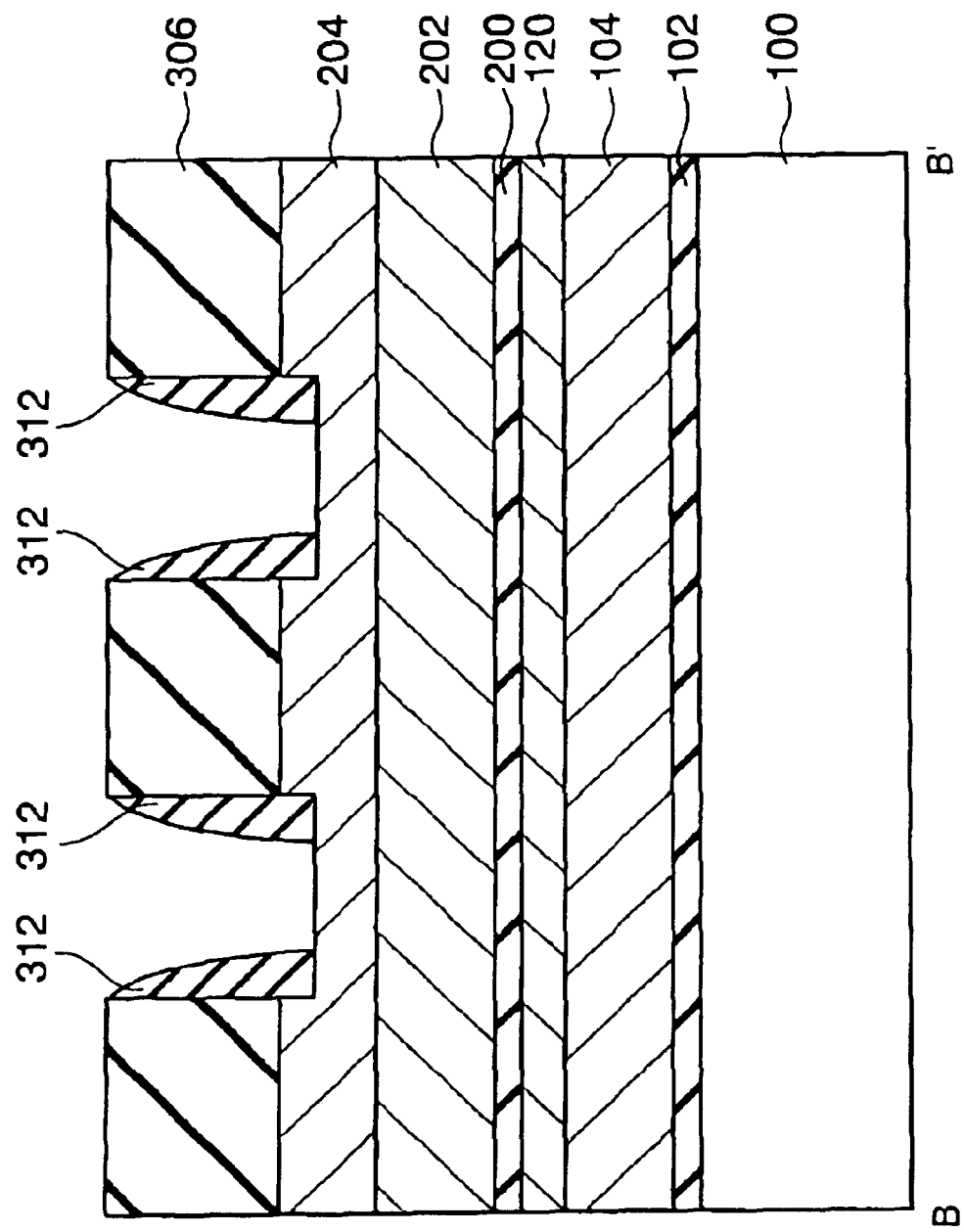
FIG. 34 is a sectional view showing a part of the manufacturing process of the nonvolatile semiconductor memory device according to the second embodiment (cross-sectional view taken along the line B–B' in FIG. 2) and corresponding to FIG. 33.

Next, as shown in FIG. 33 and FIG. 34, by etching back the silicon nitride film 310, sidewalls 312 are formed on both sides of the silicon nitride film 306 in the slits. That is, by etching back the silicon nitride film 310, the silicon nitride film 310 is made into the sidewalls 312 by the self-alignment process.

Figure 35:
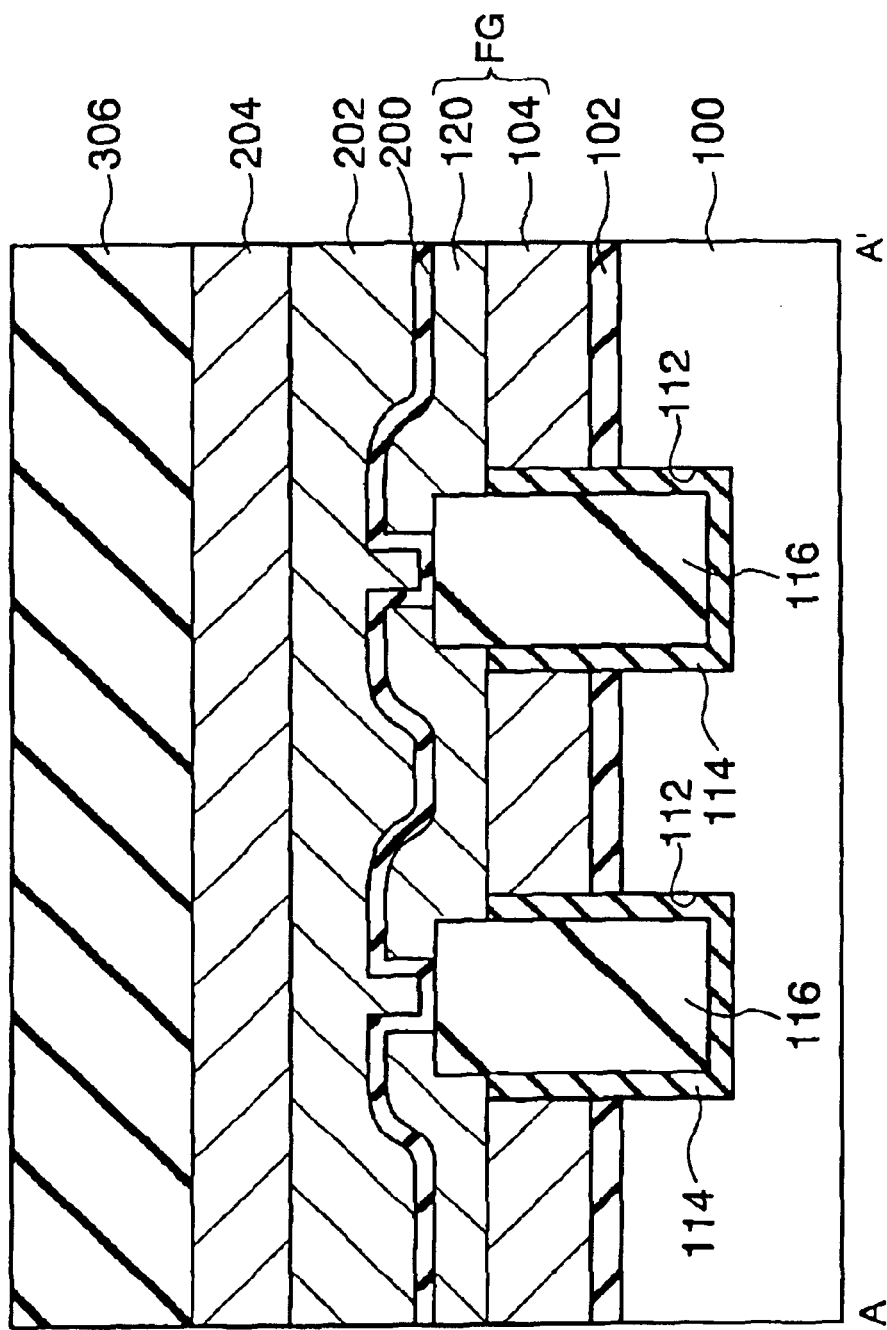
FIG. 35 is a sectional view showing a part of the manufacturing process of the nonvolatile semiconductor memory device according to the second embodiment (cross-sectional view taken along the line A–A' in FIG. 2)
Figure 36:
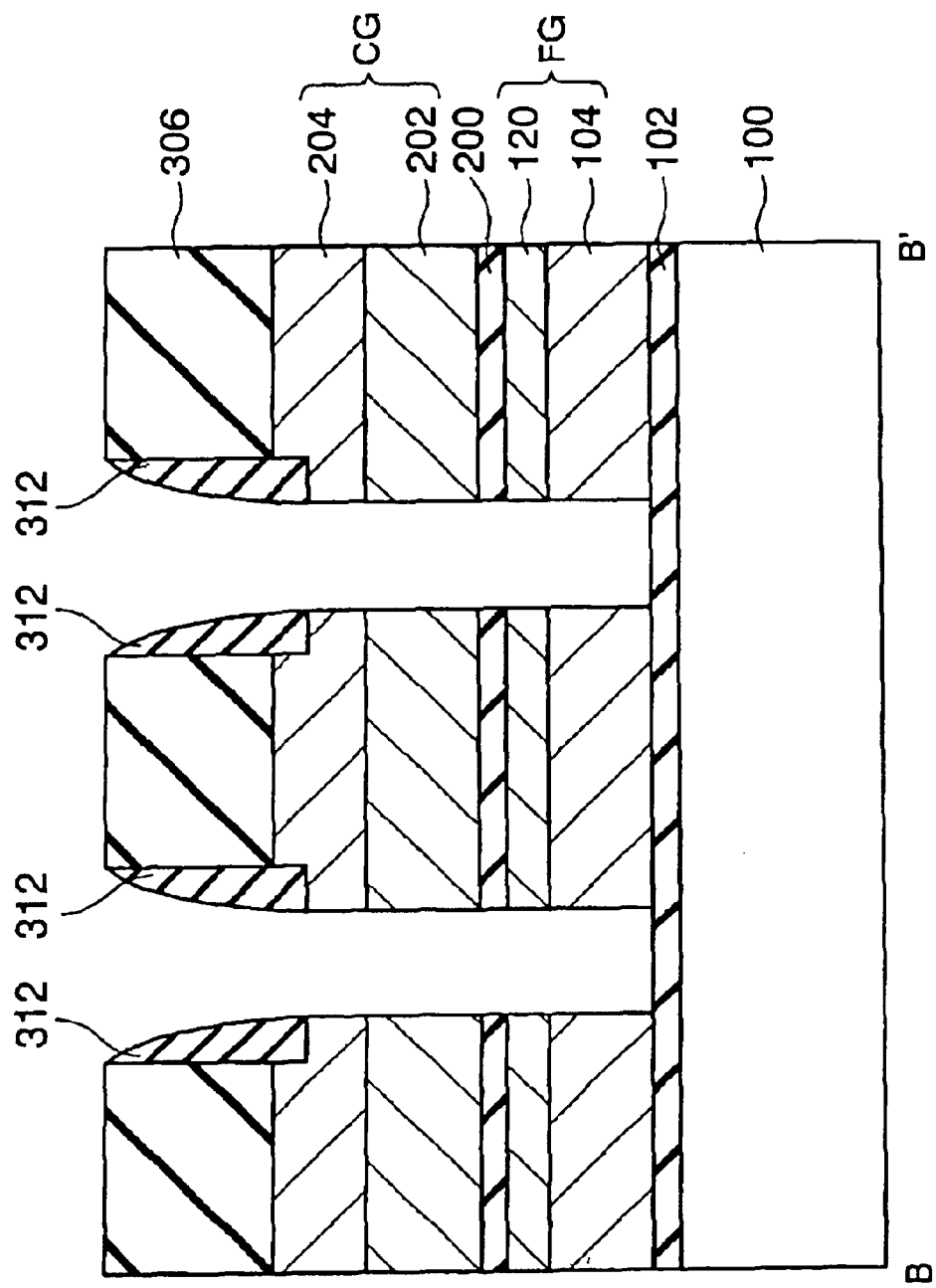
FIG. 36 is a sectional view showing a part of the manufacturing process of the nonvolatile semiconductor memory device according to the second embodiment (cross-sectional view taken along the line B–B' in FIG. 2) and corresponding to FIG. 35.

Next, as shown in FIG. 35 and FIG. 36, the tungsten silicide film 204, the third polysilicon film 202, the ONO film 200, the second polysilicon film 120 and the first polysilicon film 104 are etched using the silicon nitride films 306 and the sidewalls 312 formed of the silicon nitride film 310 as a mask. Thereby, the tungsten silicide film 204, the third polysilicon film 202, the ONO film 200, the second polysilicon film 120 and the first polysilicon film 104 are separated in the word line direction. As a result, tungsten silicide film 204 and the third polysilicon film 202 constitute control gate electrodes CG, and the first polysilicon film 104 and the second polysilicon film 120 constitute floating gate electrodes FG. In addition, steps like stairs are formed in the top corners of the tungsten silicide film 204 of the control gate electrode CG, and the sidewalls 312 are positioned on the steps.

Figure 37:
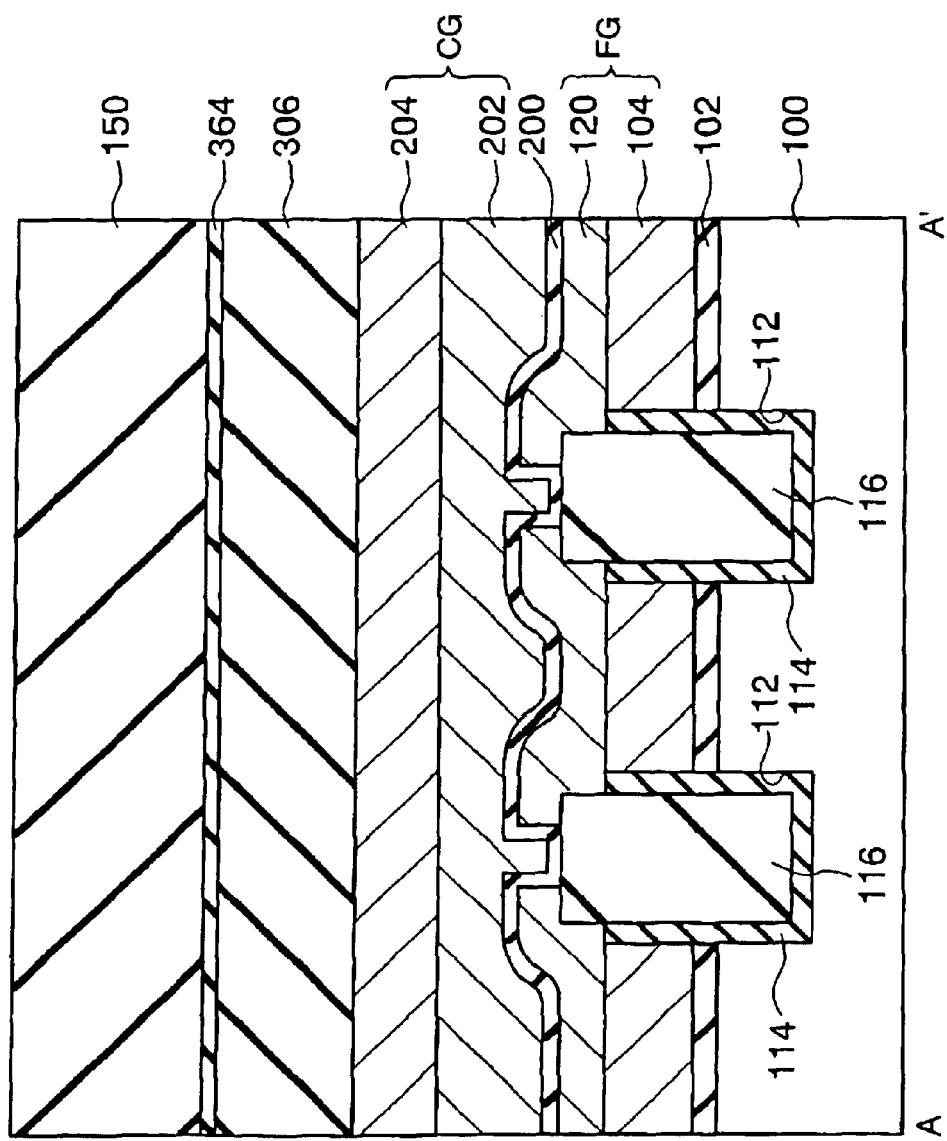
FIG. 37 is a sectional view showing a part of the manufacturing process of the nonvolatile semiconductor memory device according to the second embodiment (cross-sectional view taken along the line A–A' in FIG. 2)
Figure 38:
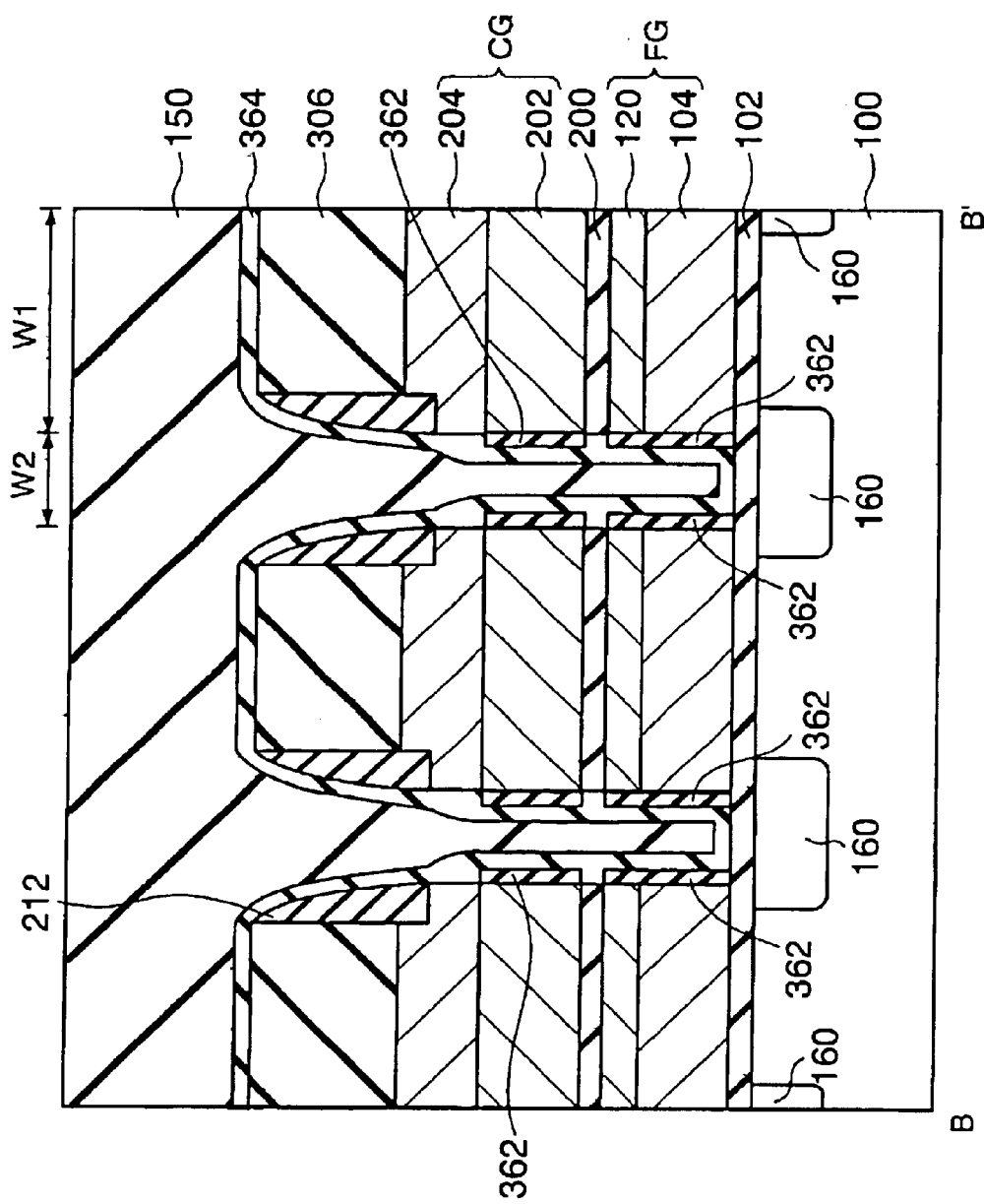
FIG. 38 is a sectional view showing a part of the manufacturing process of the nonvolatile semiconductor memory device according to the second embodiment (cross-sectional view taken along the line B–B' in FIG. 2) and corresponding to FIG. 37.

Next, as shown in FIG. 37 and FIG. 38, on both sides of the first polysilicon films 104, the second polysilicon films 120 and the third polysilicon films 202 in the word line direction, oxide films 362 which are an example of an insulating film are formed by the oxide process (RTO). Thereafter, source/drain regions 160 are formed by the ion implanting process. Subsequently, a silicon nitride film 364 which is an example of an insulating film is formed so as to cover every memory cell, and the silicon nitride film 364 has a thickness of 40 nm.

Thereafter, an interlayer dielectric film 150 is formed so as to be embedded in gaps between the memory cells and so as to cover every memory cell. The process for forming the interlayer dielectric film 150 is the same as that of the related art mentioned above. However, in this embodiment, the sidewalls 312 are formed in the top corners of the silicon nitride film 306 on the control gate electrodes CG and each of the sidewalls 312 has a gentle slope. Therefore, when the interlayer dielectric film 150 is formed in width W2 between memory cells, the interlayer dielectric film 150 is easily embedded therebetween and hence it is possible to avoid making the embedding failure.

In addition, the silicon nitride film 306 is formed at a temperature of 700° C. to 800° C., which is above a temperature of 600° C., at which tungsten silicide reacts with oxygen, and then the silicon nitride film 310 is formed at a temperature below 600° C. in this embodiment, but these temperatures can be exchanged. That is, the silicon nitride 306 may be formed at a temperature below 600° C. and the silicon nitride film 310 may be formed at temperature of 700° C. to 800° C., which is above a temperature of 600° C. Moreover, both the silicon nitride film 306 and the silicon nitride film 310 may be formed at temperatures below 600° C.

(Third Embodiment)

A third embodiment is a modified version of the first embodiment mentioned above, more specifically, the silicon oxide films 206 in the first embodiment is changed into a silicon nitride film. Incidentally, the manufacturing process of a nonvolatile semiconductor memory device according to this embodiment is also the same as that of the first embodiment until FIG. 11.

Figure 39:
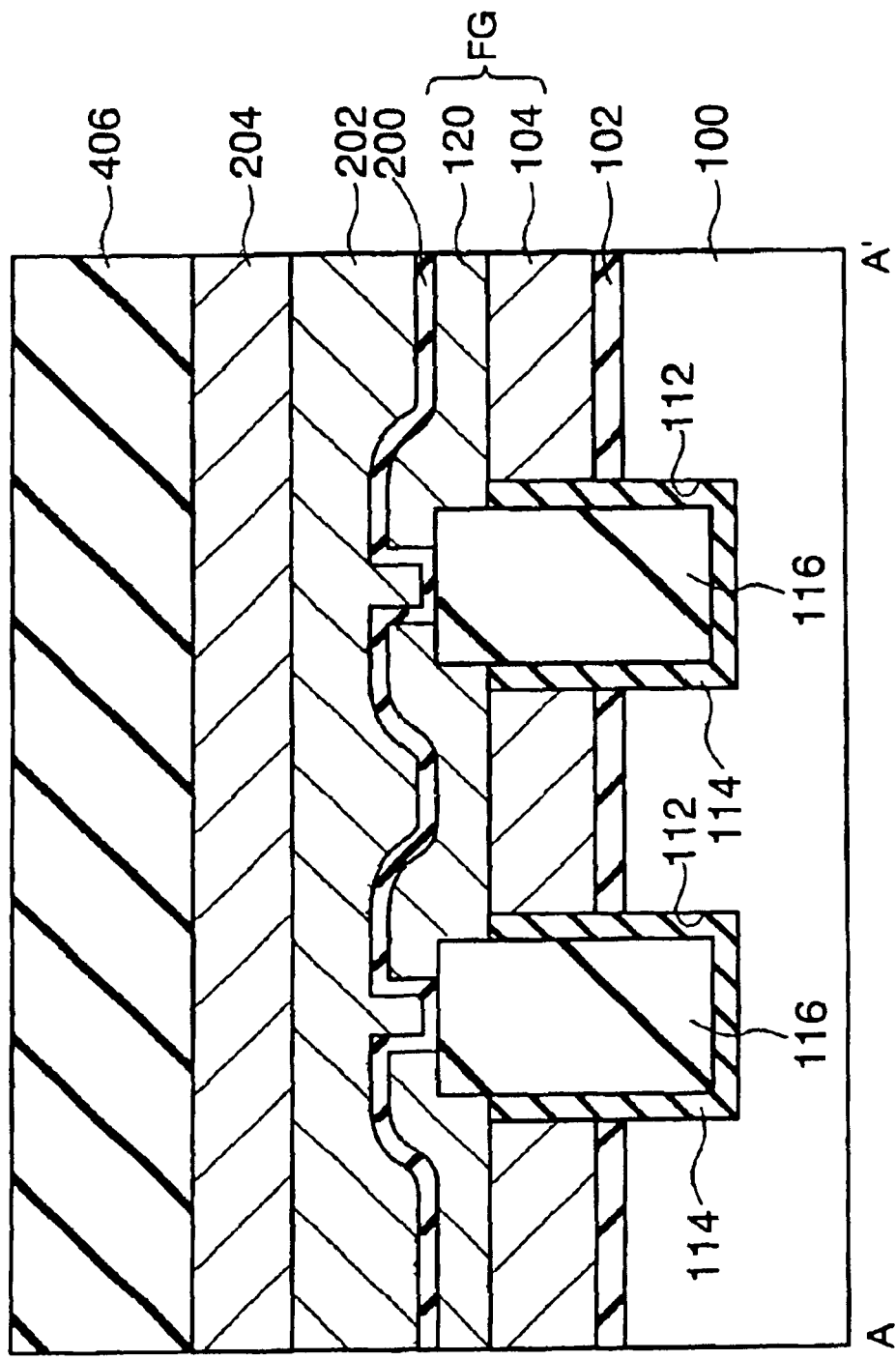
FIG. 39 is a sectional view showing a part of the manufacturing process of a nonvolatile semiconductor memory device according to a third embodiment (cross-sectional view taken along the line A–A' in FIG. 2)

After FIG. 11, in this embodiment, as shown in FIG. 39, an ONO film (silicon oxide film—silicon nitride film—silicon oxide film) 200 is formed as an insulating film by the LPCVD method, and then the nonvolatile semiconductor memory device is heated in an oxygen atmosphere at 850° C. Subsequently, a third polysilicon film 202 is formed on the ONO film 200 by the LPCVD method. Thereafter, a tungsten silicide (WSi) film 204 is formed on the third polysilicon film 202 by the PVD (physical vapor deposition) method. Subsequently, a silicon nitride film 406 is formed on the tungsten silicide film 204 by the LPCVD method at a temperature of a 700° C. to 800° C. In this embodiment, the silicon nitride film 406 is one example of an insulating film and has a thickness of 200 nm to 300 nm.

Figure 40:
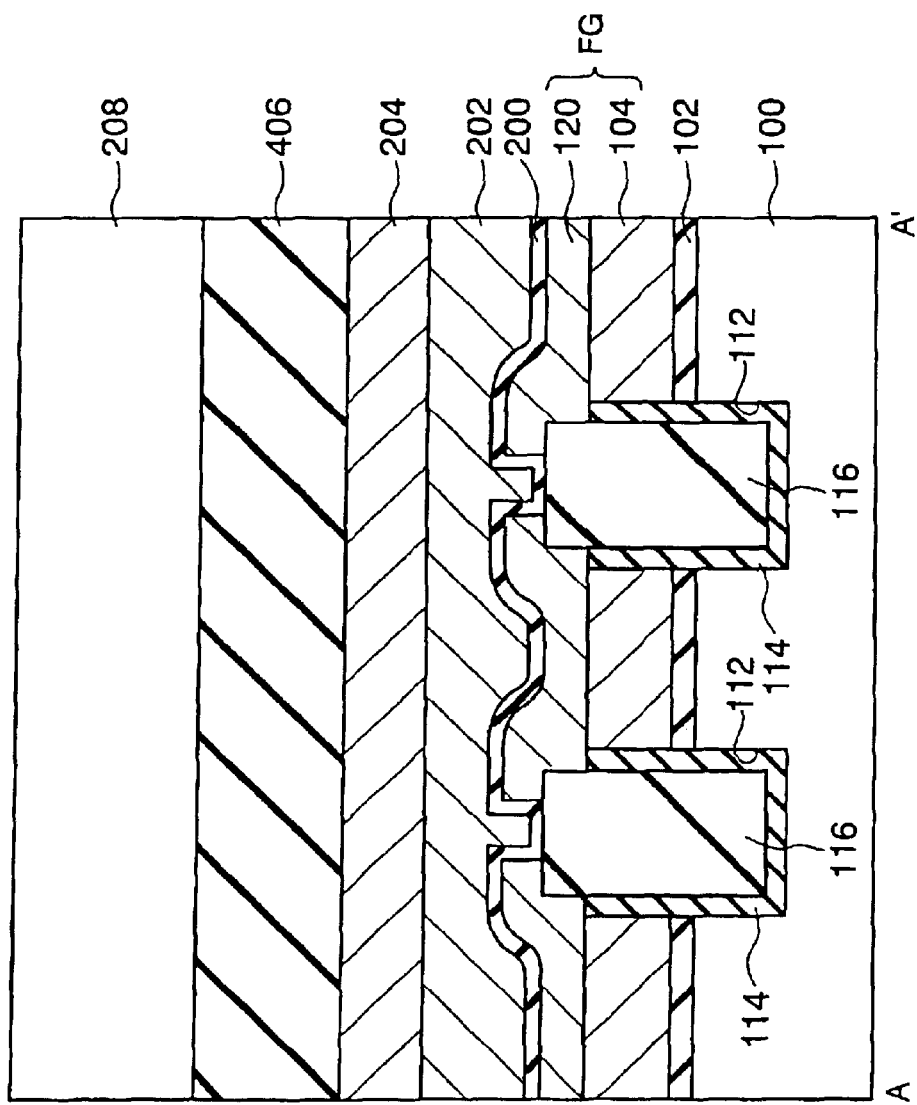
FIG. 40 is a sectional view showing a part of the manufacturing process of the nonvolatile semiconductor memory device according to the third embodiment (cross-sectional view taken along the line A–A' in FIG. 2)
Figure 41:
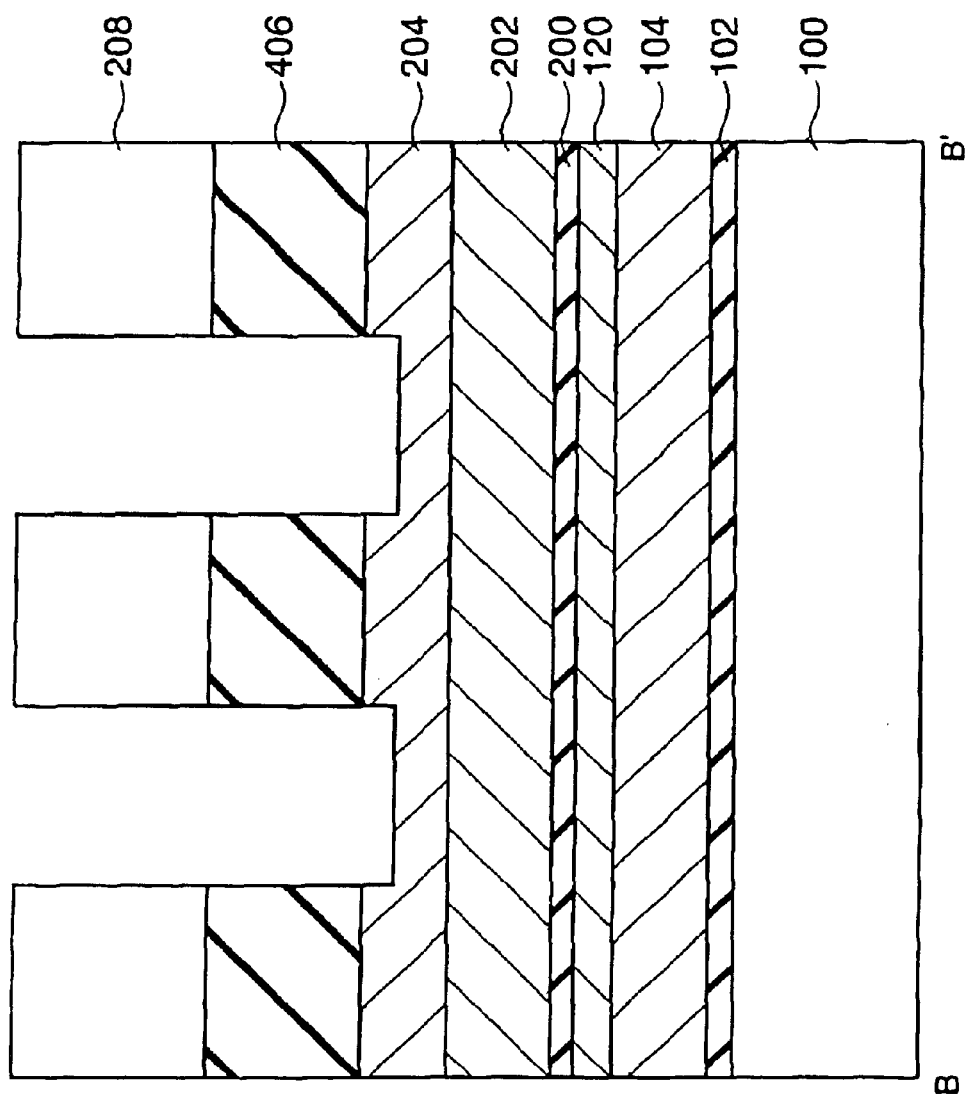
FIG. 41 is a sectional view showing a part of the manufacturing process of the nonvolatile semiconductor memory device according to the third embodiment (cross-sectional view taken along the line B–B' in FIG. 2) and corresponding to FIG. 40.

Next, as shown in FIG. 40 and FIG. 41, a photoresist 208 is applied to the silicon nitride film 306 and then a predetermined pattern is produced in the photoresist 208 by the photoengraving process. That is, the photoresist 208 which has slits extending along the word line direction is formed. Thereafter, the silicon nitride film 406 is etched by the RIE method using the photoresist 208 as a mask. In addition, the tungsten silicide 204 is also etched over. As a result, slits extending to the word line direction are formed in the silicon nitride film 406.

Figure 42:
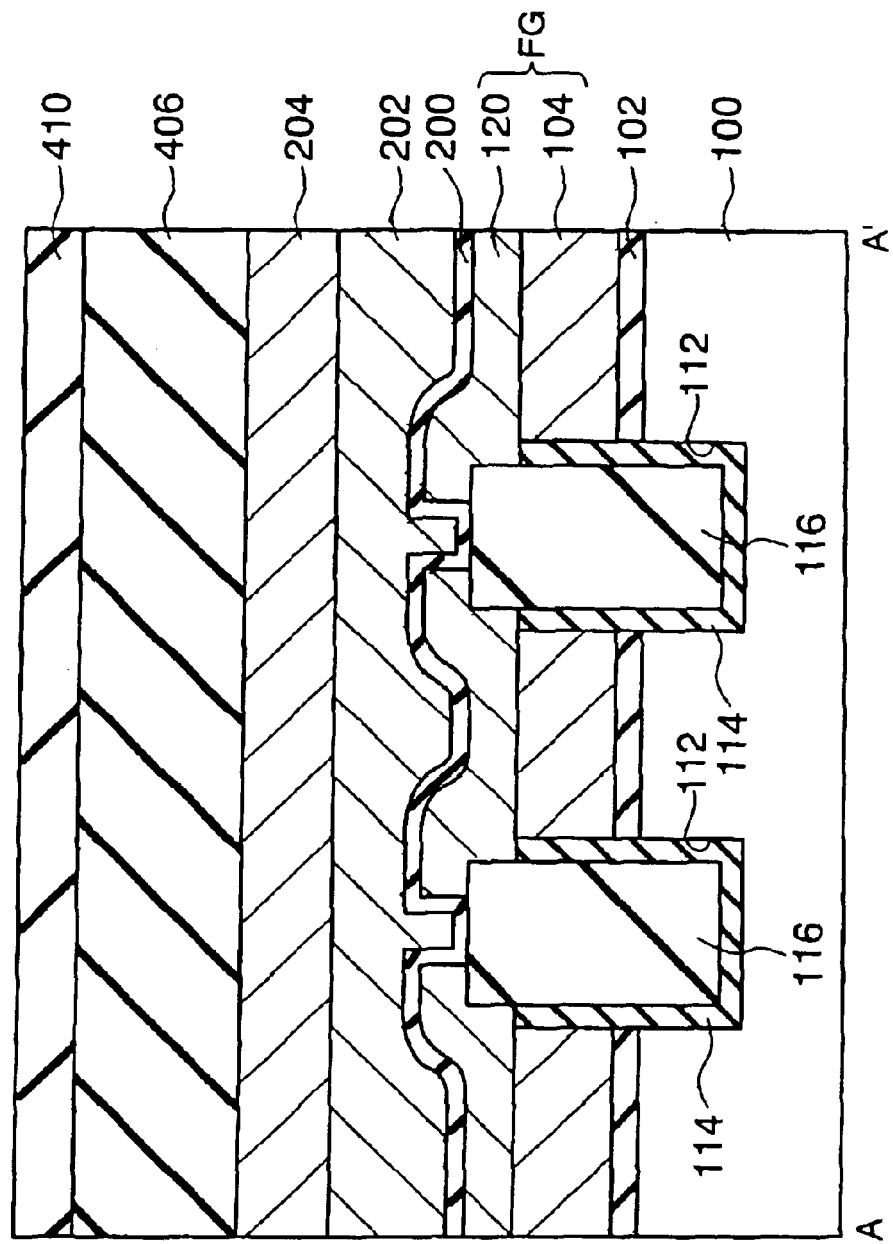
FIG. 42 is a sectional view showing a part of the manufacturing process of the nonvolatile semiconductor memory device according to the third embodiment (cross-sectional view taken along the line A–A' in FIG. 2)
Figure 43:
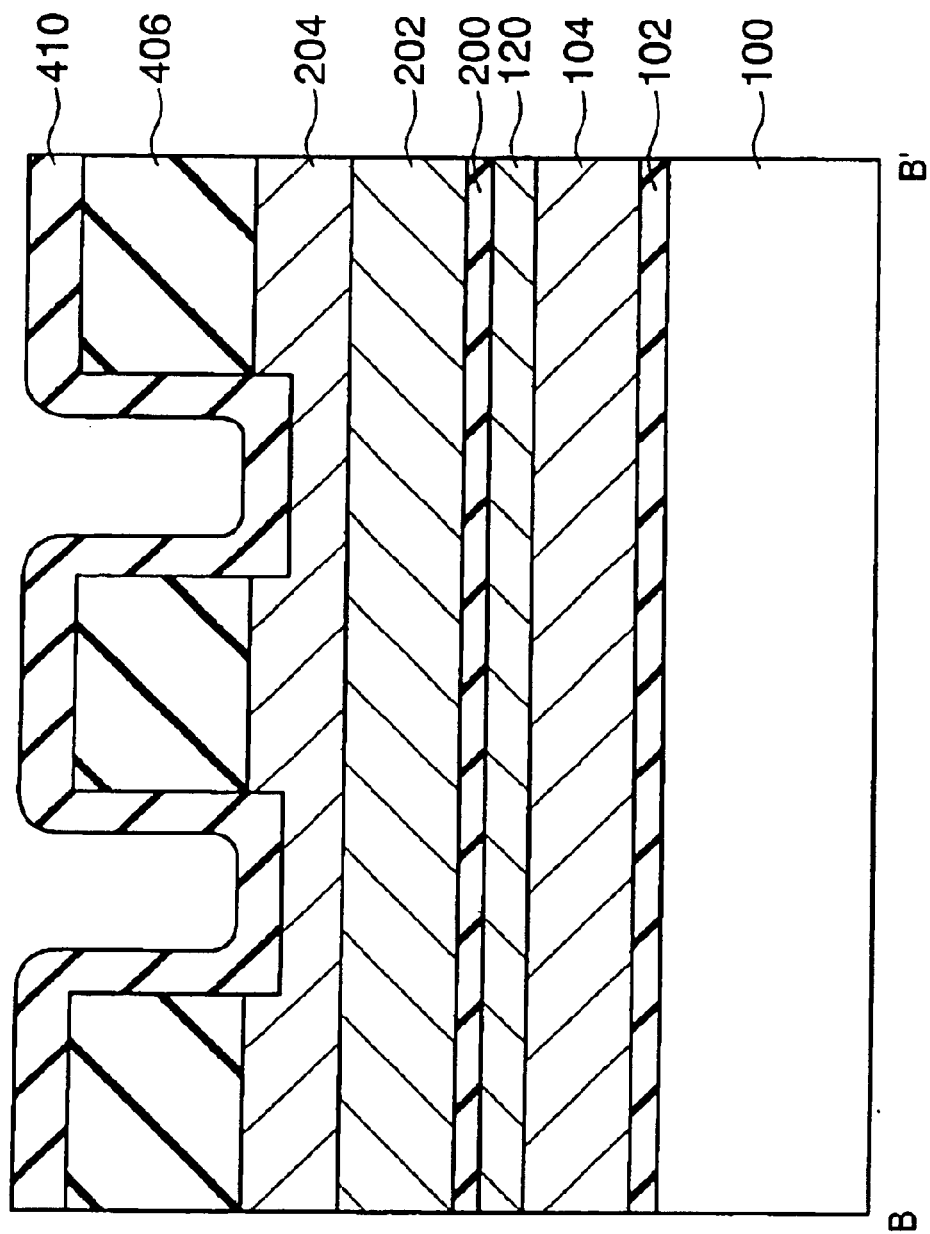
FIG. 43 is a sectional view showing a part of the manufacturing process of the nonvolatile semiconductor memory device according to the third embodiment (cross-sectional view taken along the line B–B' in FIG. 2) and corresponding to FIG. 42.

Next, as shown in FIG. 42 and FIG. 43, the photoresist 208 is removed. Thereafter, a silicon oxide film 410 is formed by the LPCVD method at a temperature below 600° C. In this embodiment, the silicon oxide film 410 is one example of an insulating film and has a thickness of 20 nm. The reason why the silicon nitride film 410 is formed at a temperature below 600° C. is the same as that of the first embodiment.

Figure 44:
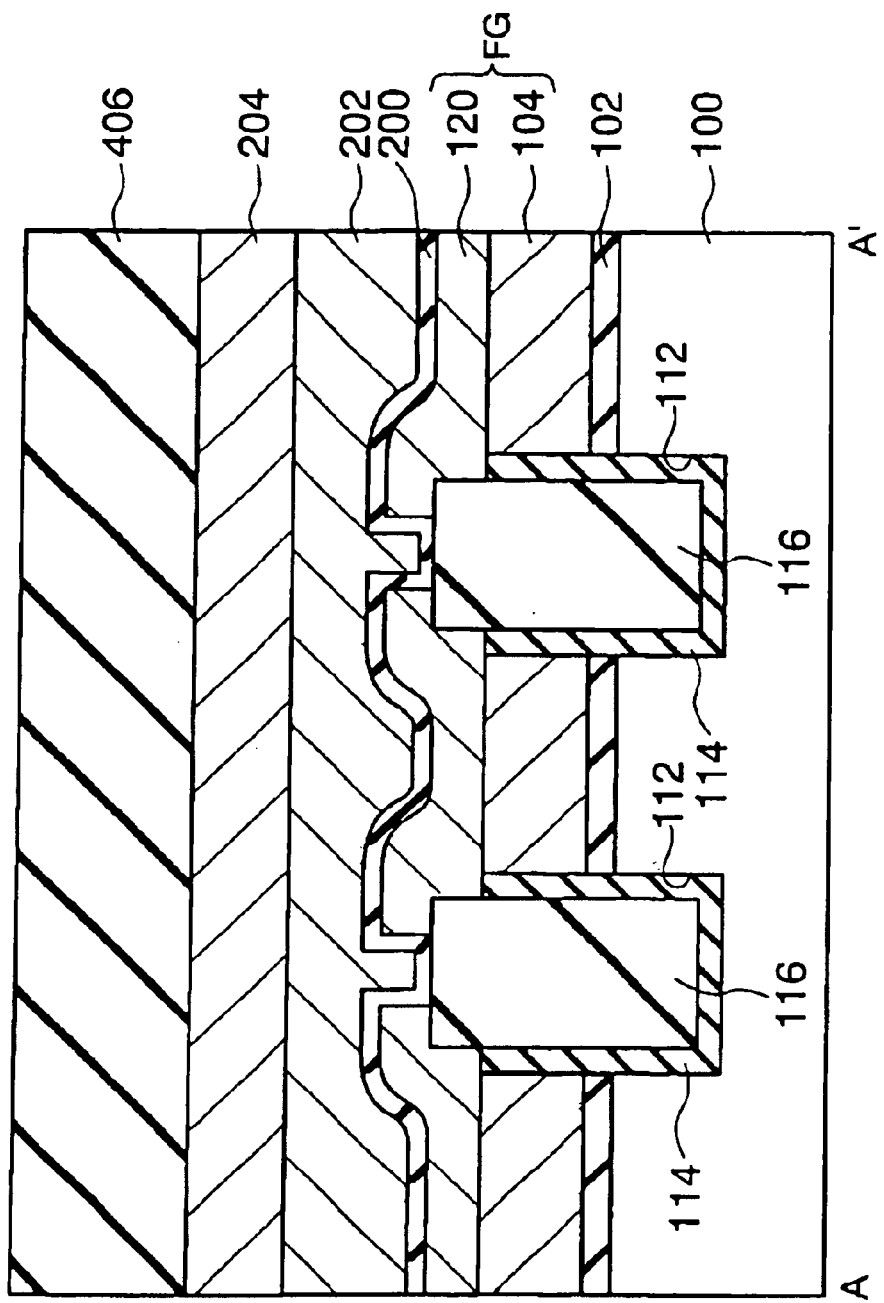
FIG. 44 is a sectional view showing a part of the manufacturing process of the nonvolatile semiconductor memory device according to the third embodiment (cross-sectional view taken along the line A–A' in FIG. 2)
Figure 45:
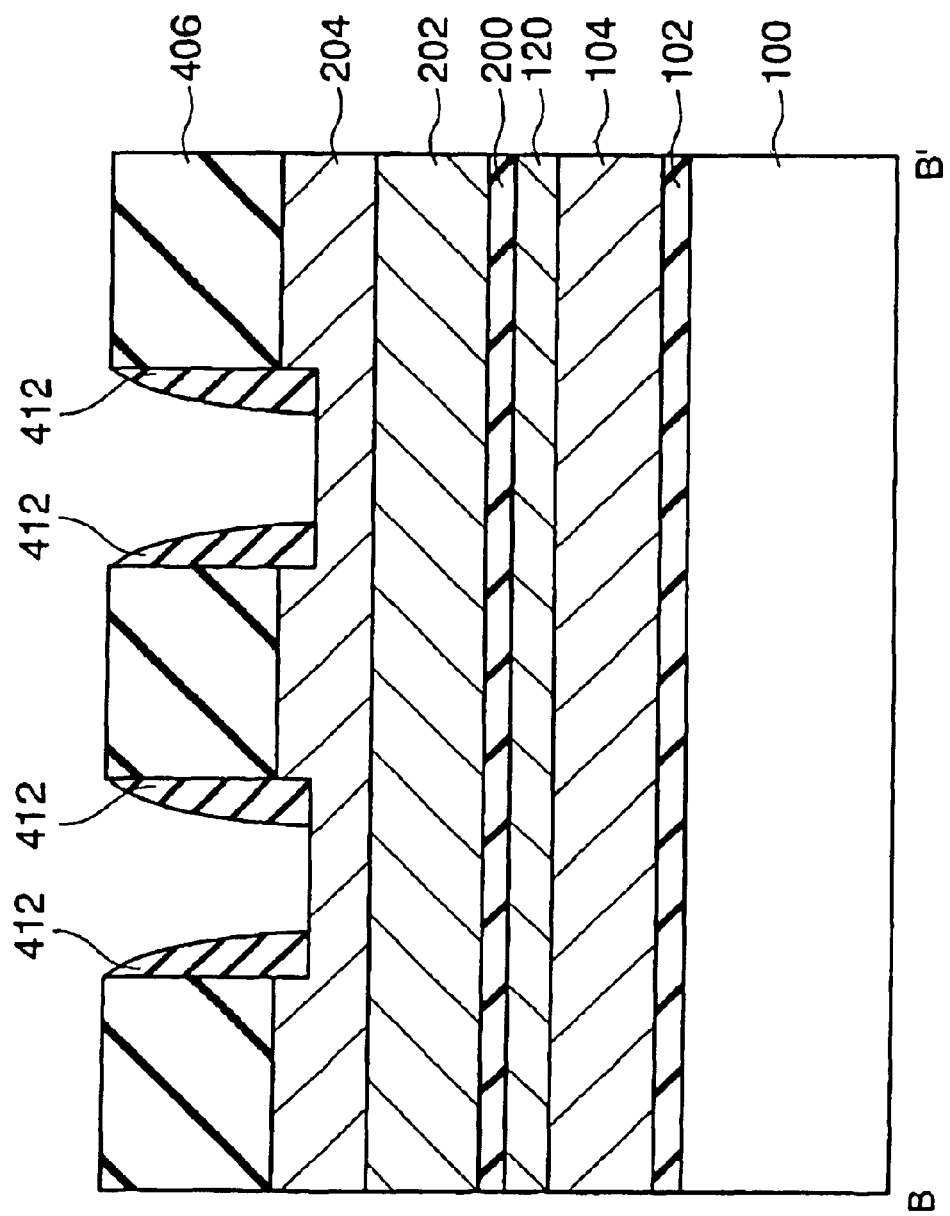
FIG. 45 is a sectional view showing a part of the manufacturing process of the nonvolatile semiconductor memory device according to the third embodiment (cross-sectional view taken along the line B–B' in FIG. 2) and corresponding to FIG. 44.

Next, as shown in FIG. 44 and FIG. 45, by etching back the silicon oxide film 410, sidewalls 412 are formed on both sides of the silicon nitride film 406 in the slits. That is, by etching back the silicon oxide film 410, the silicon oxide film 410 is made into the sidewalls 412 by the self-alignment process.

Figure 46:
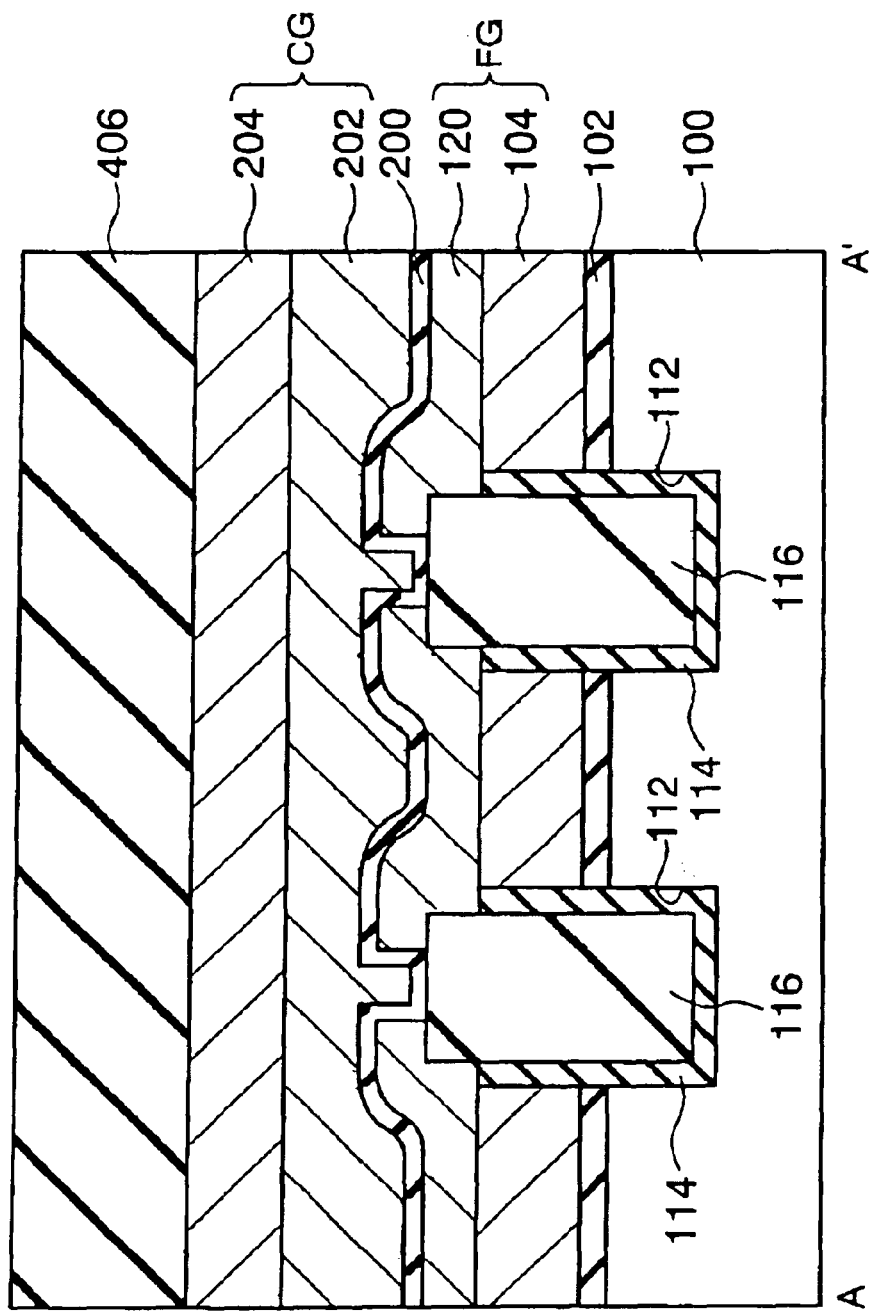
FIG. 46 is a sectional view showing a part of the manufacturing process of the nonvolatile semiconductor memory device according to the third embodiment (cross-sectional view taken along the line A–A' in FIG. 2)
Figure 47:
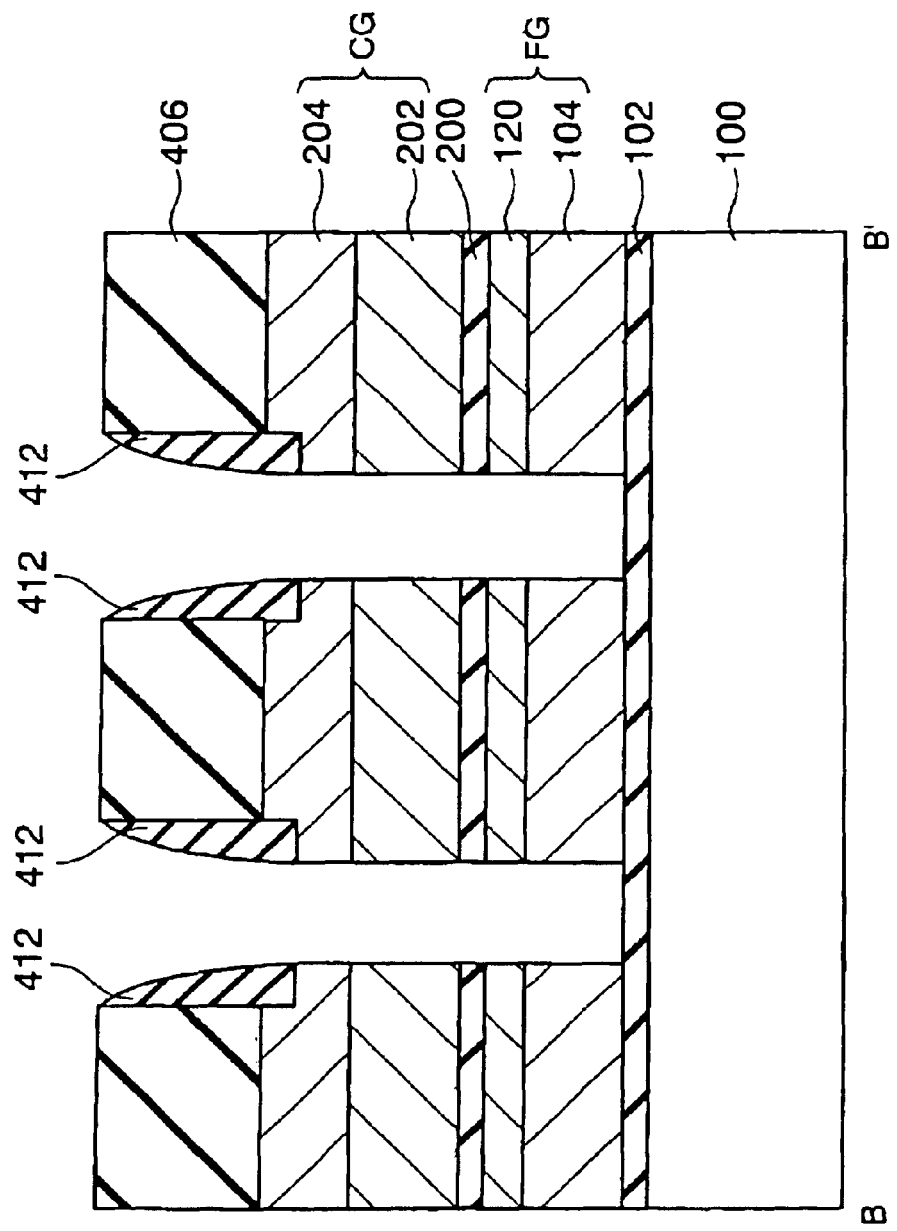
FIG. 47 is a sectional view showing a part of the manufacturing process of the nonvolatile semiconductor memory device according to the third embodiment (cross-sectional view taken along the line B–B' in FIG. 2) and corresponding to FIG. 46.

Next, as shown in FIG. 46 and FIG. 47, the tungsten silicide film 204, the third polysilicon film 202, the ONO film 200, the second polysilicon film 120 and the first polysilicon film 104 are etched using the silicon nitride films 406 and the sidewalls 412 formed of the silicon oxide film 410 as a mask. Thereby, the tungsten silicide film 204, the third polysilicon film 202, the ONO film 200, the second polysilicon film 120 and the first polysilicon film 104 are separated in the word line direction. As a result, tungsten silicide film 204 and the third polysilicon film 202 constitute control gate electrodes CG, and the first polysilicon film 104 and the second polysilicon film 120 constitute floating gate electrodes FG. In addition, steps like stairs are formed on the top corners of the tungsten silicide film 204 of the control gate electrode CG, and the sidewalls 412 are positioned on the steps.

Figure 48:
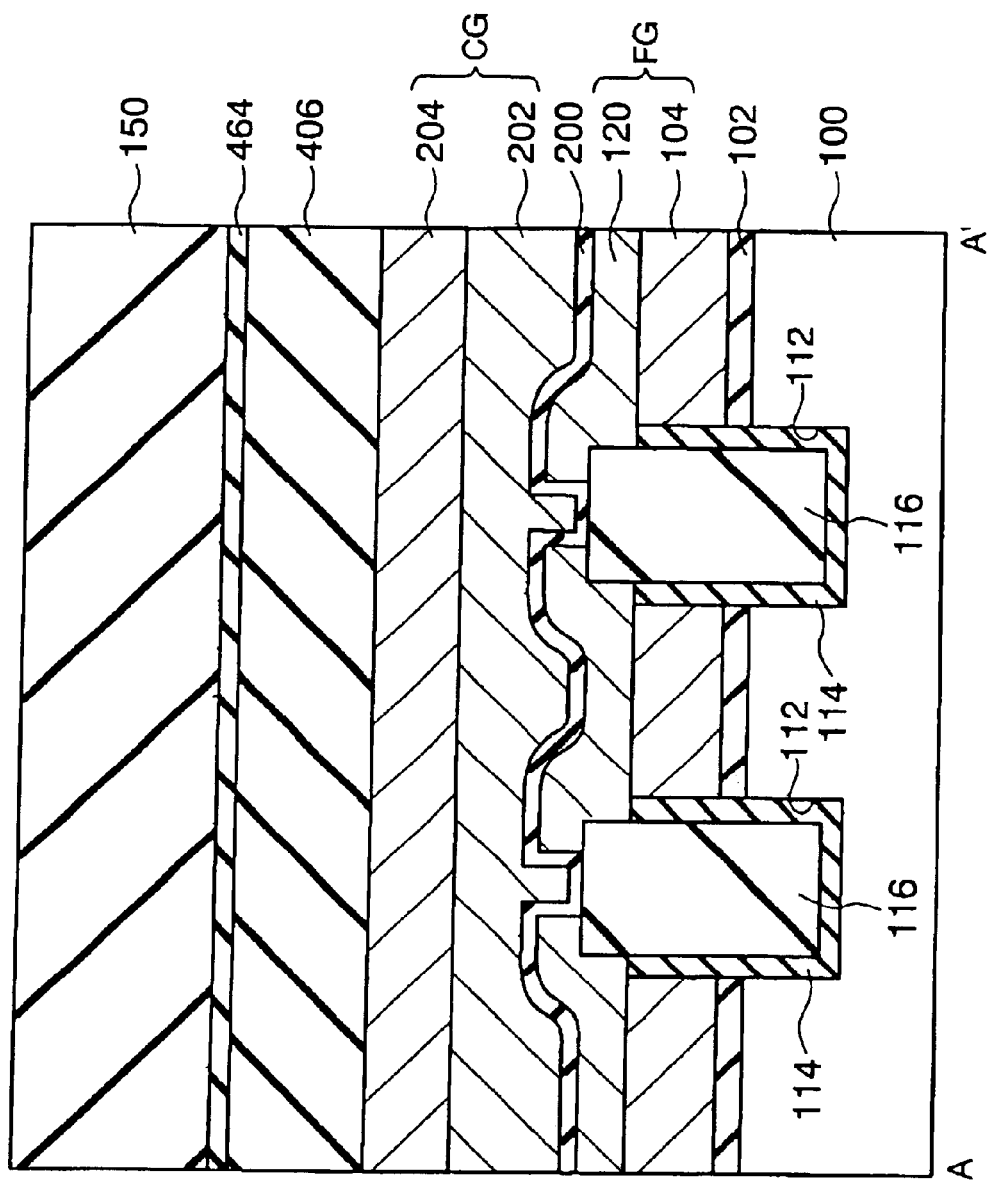
FIG. 48 is a sectional view showing a part of the manufacturing process of the nonvolatile semiconductor memory device according to the third embodiment (cross-sectional view taken along the line A–A' in FIG. 2)
Figure 49:
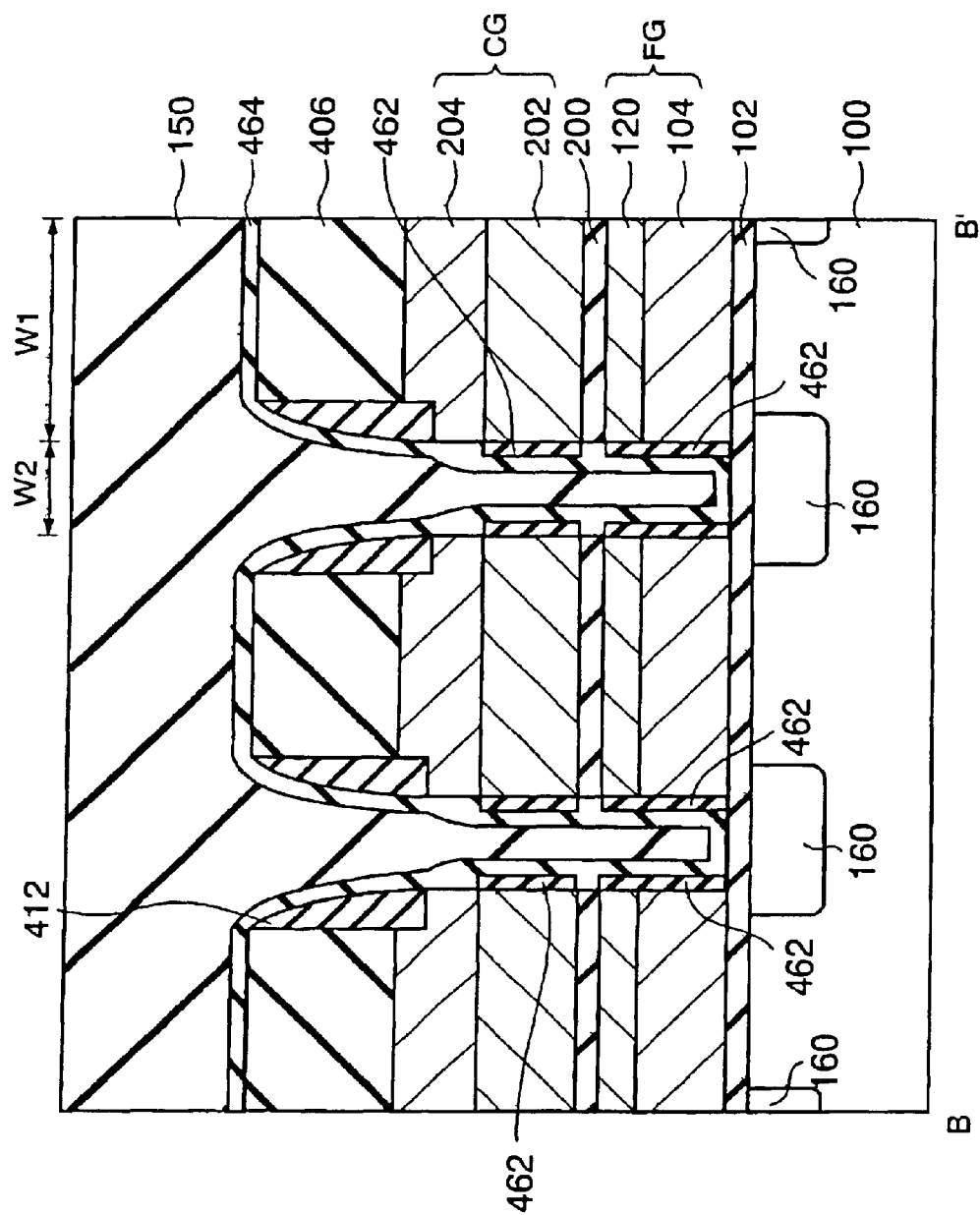
FIG. 49 is a sectional view showing a part of the manufacturing process of the nonvolatile semiconductor memory device according to the third embodiment (cross-sectional view taken along the line B–B' in FIG. 2) and corresponding to FIG. 48.

Next, as shown in FIG. 48 and FIG. 49., on both sides of the first polysilicon films 104, the second polysilicon films 120 and the third polysilicon films 202 in the word line direction, oxide films 462 which are an example of an insulating film are formed by the oxide process (RTO). Thereafter, source/drain regions 160 are formed by the ion implanting process. Subsequently, a silicon nitride film 464 which is an example of an insulating film is formed so as to cover every memory cell, and the silicon nitride film 464 has a thickness of 40 nm.

Thereafter, an interlayer dielectric film 150 is formed so as to be embedded in gaps between the memory cells and so as to cover every memory cell. The process for forming the interlayer dielectric film 150 is the same as that of the related art mentioned above. However, in this embodiment, the sidewalls 412 are formed in the top corners of the silicon nitride film 406 on the control gate electrodes CG and each of the sidewalls 412 has a gentle slope. Therefore, when the interlayer dielectric film 150 is formed in width W2 between memory cells, the interlayer dielectric film 150 is easily embedded therebetween and hence it is possible to avoid making the embedding failure.

In addition, the silicon nitride film 406 is formed at a temperature of 700° C. to 800° C., which is above a temperature of 600° C. at which tungsten silicide reacts with oxygen, and then the silicon oxide film 410 is formed at a temperature below 600° C. in this embodiment, but these temperatures can be exchanged. That is, the silicon nitride 406 may be formed at a temperature below 600° C. and the silicon oxide film 410 may be formed at temperature of 600° C. to 700° C., which is above a temperature of 600° C. Moreover, both the silicon nitride film 406 and the silicon oxide film 410 may be formed at a temperature below 600° C.

Moreover, material can be exchanged between the silicon nitride film 406 and the silicon oxide film 410 under any temperature conditions. That is, the silicon nitride film 406 may be changed to a silicon oxide film and the silicon oxide film 410 may be changed to a silicon nitride film.

(Fourth Embodiment)

A fourth embodiment is a modified version of the first embodiment mentioned above, more specifically, this nonvolatile semiconductor memory device is exposed to a heat treatment before the silicon oxide film 210 in the first embodiment is formed, and therefore the silicon oxide film 210 can be formed at a temperature above 600° C. at which tungsten silicide reacts with oxygen. The detailed explanation will be made hereinafter.

Incidentally, the manufacturing process of a nonvolatile semiconductor memory device according to this embodiment is also the same as that of the first embodiment until FIG. 18 and FIG. 19.

Figure 50:
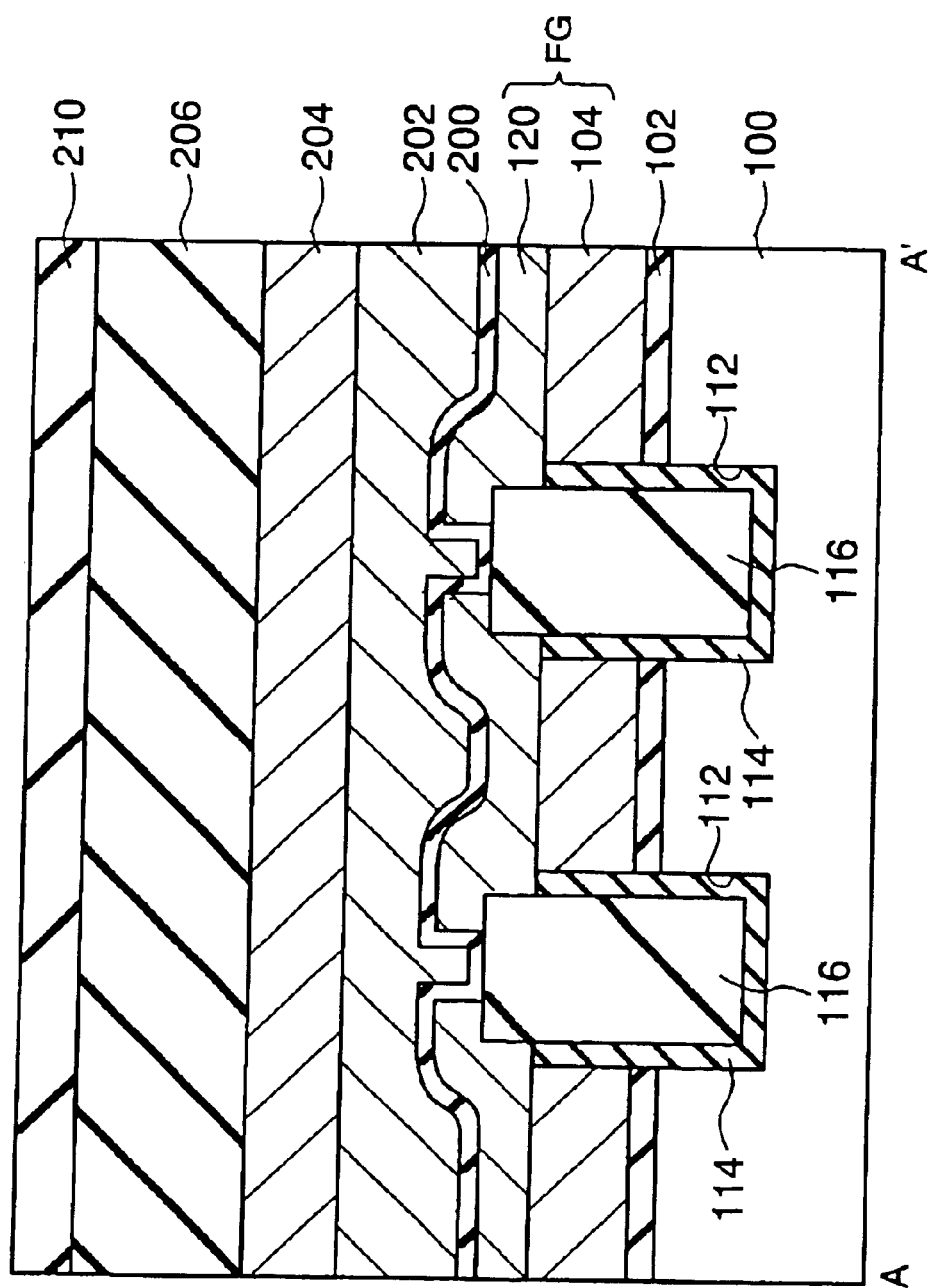
FIG. 50 is a sectional view showing a part of the manufacturing process of a nonvolatile semiconductor memory device according to a fourth embodiment (cross-sectional view taken along the line A–A' in FIG. 2)
Figure 51:
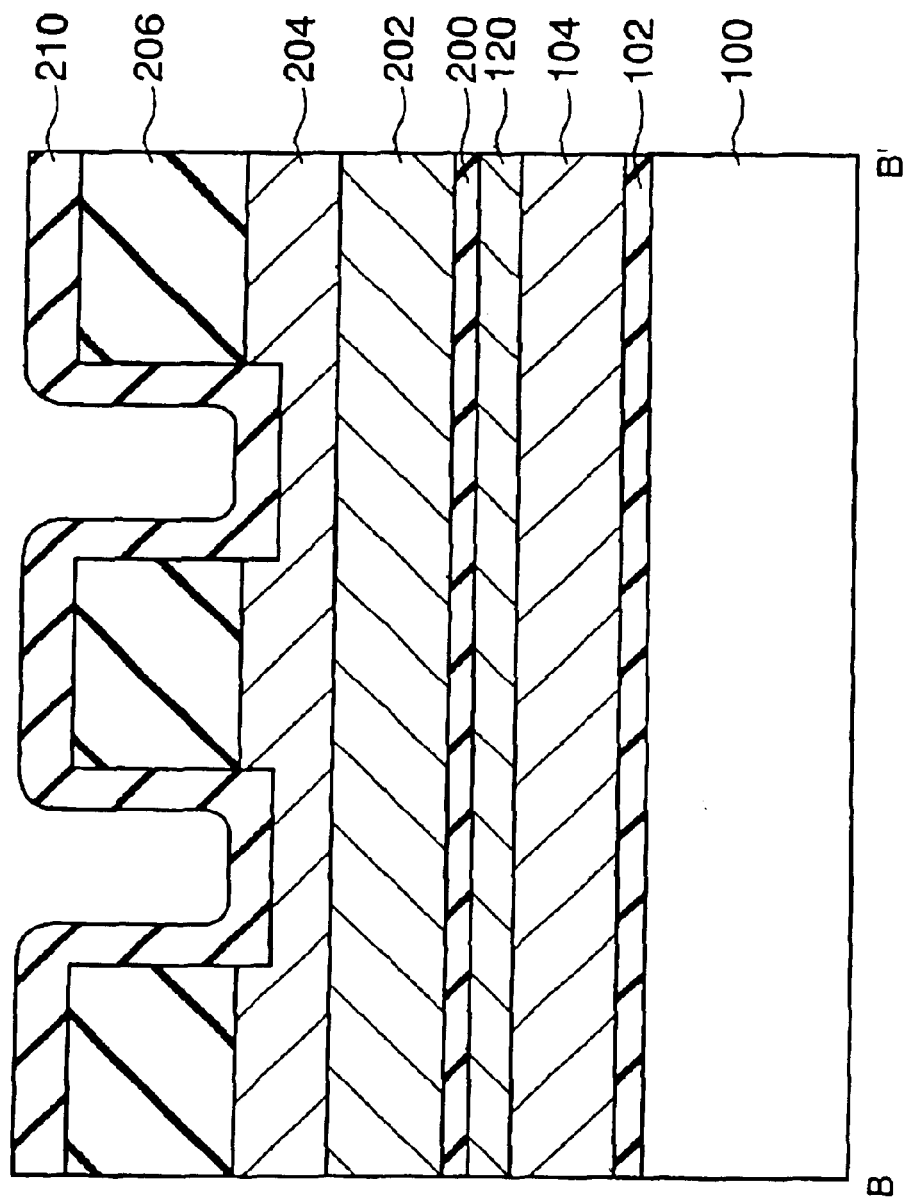
FIG. 51 is a sectional view showing a part of the manufacturing process of the nonvolatile semiconductor memory device according to the fourth embodiment (cross-sectional view taken along the line B–B' in FIG. 2) and corresponding to FIG. 50.

After FIG. 18 and FIG. 19, in this embodiment, as shown in FIG. 50 and FIG. 51, the photoresist 208 is removed. Subsequently, this nonvolatile semiconductor memory device is heated in a nitrogen atmosphere at a temperature of 800° C. to 1000° C. Thereafter, a silicon oxide film 210 is formed by the LPCVD method at a temperature of 600° C. to 700° C. In this embodiment, the silicon oxide film 210 has a thickness of 20 nm.

The reason why the silicon oxide film 210 can be formed at a temperature of 600° C. to 700° C., which is above 600° C. at which tungsten silicide reacts with oxygen is as follows. That is, in this embodiment, the nonvolatile semiconductor memory device is exposed to the heat treatment after the silicon oxide film 206 is formed and before the silicon oxide film 210 is formed. As a result, even if silicon (Si) in the surface side of the tungsten silicide (WSi) film 204 has already reacted with oxygen, silicon is moved from the center portion thereof to the surface side thereof by the heat treatment. Under this condition, if the silicon oxide film 210 is formed at the temperature above 600° C., the silicon in the surface side of the tungsten silicide (WSi) film 204 can react with oxygen again, so that it is possible to avoid forming abnormal oxide ($W_2O_3$) in the tungsten silicide film 204.

The manufacturing process after FIG. 50 and FIG. 51 is the same as that of the first embodiment, therefore its explanation is omitted.

According to the embodiment, since the silicon oxide film 210 can be formed at temperature above 600° C., the silicon oxide film 210 can be formed by the LPCVD method of which the deposition rate is faster than that of the first embodiment.

(Fifth Embodiment)

A fifth embodiment is a modified version of the second embodiment mentioned above, more specifically, this nonvolatile semiconductor memory device is exposed to a heat treatment before the silicon nitride film 310 in the second embodiment is formed, and therefore the silicon nitride film 310 can be formed at a temperature above 600° C. at which tungsten silicide reacts with oxygen. The detailed explanation will be made hereinafter.

Incidentally, the manufacturing process of a nonvolatile semiconductor memory device according to this embodiment is also the same as that of the second embodiment until FIG. 29 and FIG. 30.

Figure 52:
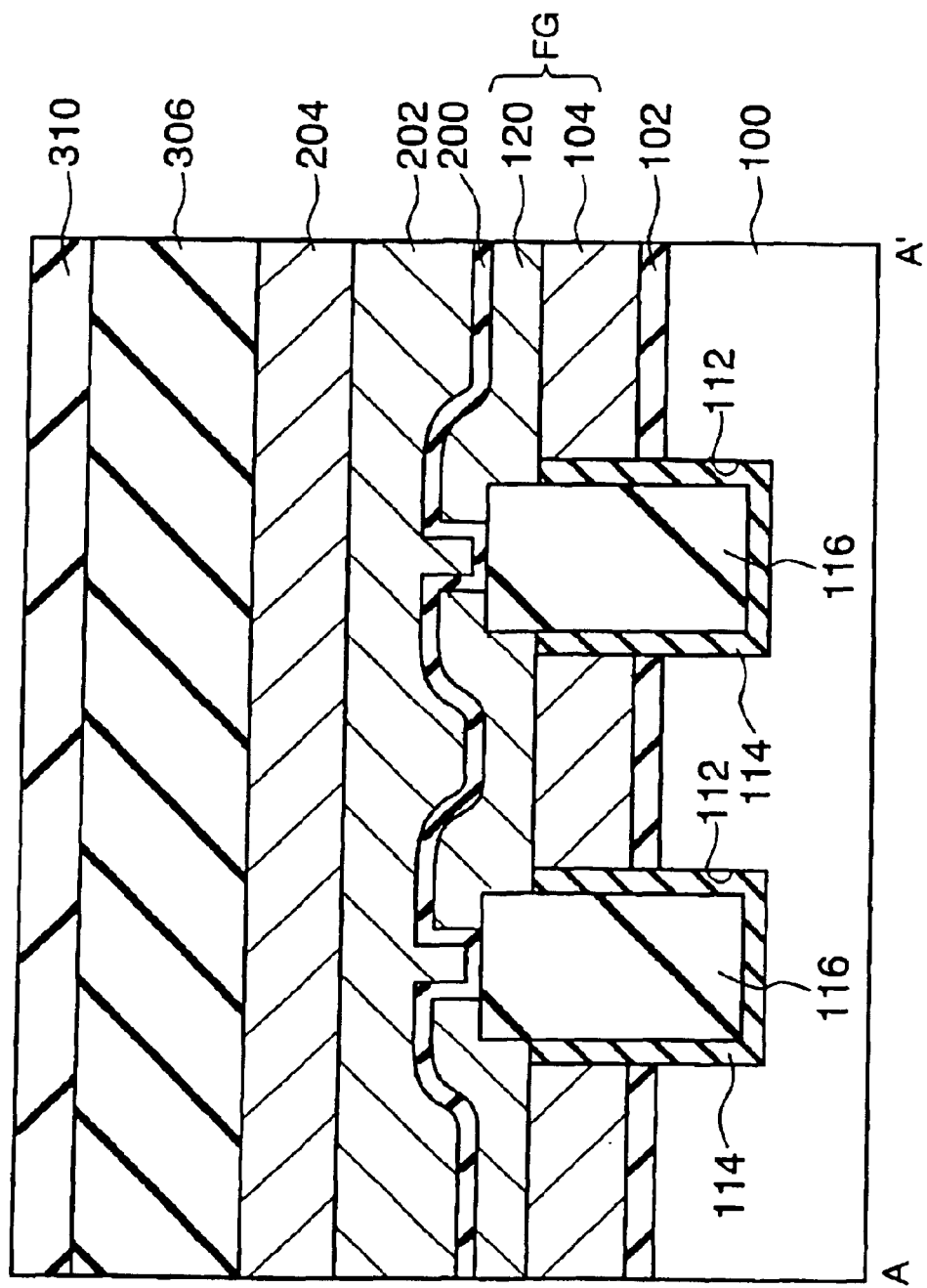
FIG. 52 is a sectional view showing a part of the manufacturing process of a nonvolatile semiconductor memory device according to a fifth embodiment (cross-sectional view taken along the line A–A' in FIG. 2)
Figure 53:
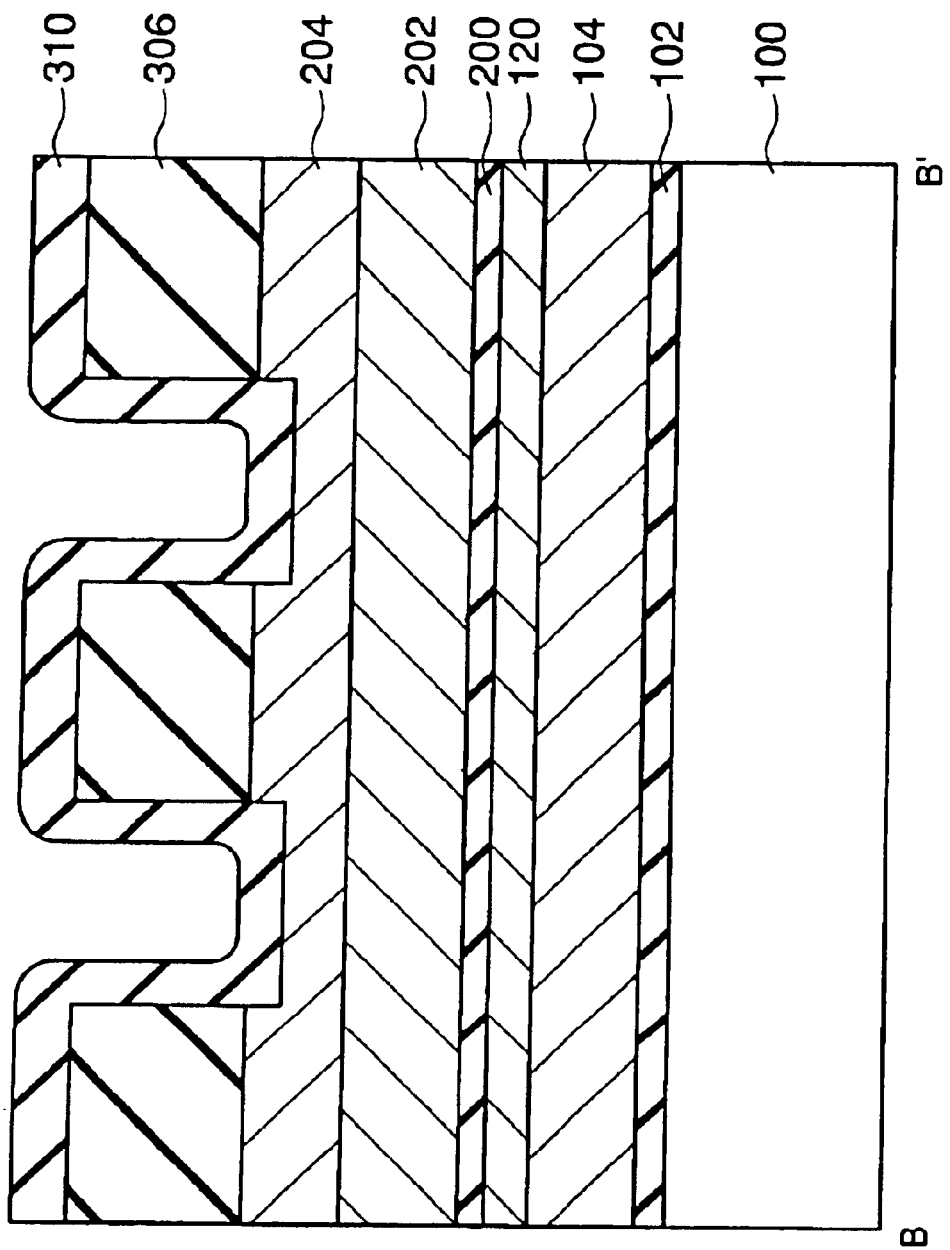
FIG. 53 is a sectional view showing a part of the manufacturing process of the nonvolatile semiconductor memory device according to the fifth embodiment (cross-sectional view taken along the line B–B' in FIG. 2) and corresponding to FIG. 52.

After FIG. 29 and FIG. 30, in this embodiment, as shown in FIG. 52 and FIG. 53, the photoresist 208 is removed. Subsequently, this nonvolatile semiconductor memory device is heated in a nitrogen atmosphere at a temperature of 800° C. to 1000° C. Thereafter, a silicon nitride film 310 is formed by the LPCVD method at a temperature of 700° C. to 800° C. In this embodiment, the silicon nitride film 310 has a thickness of 20 nm.

The reason why the silicon nitride film 310 can be formed at a temperature of 600° C. to 700° C. which is above 600° C. at which tungsten silicide reacts with oxygen is the same as that of the fourth embodiment mentioned above. The manufacturing process after FIG. 52 and FIG. 53 is the same as that of the second embodiment, therefore its explanation is omitted.

According to the embodiment, since the silicon nitride film 310 can be formed at a temperature above 700° C., the silicon nitride film 310 can be formed by the LPCVD method of which the deposition rate is faster than that of the second embodiment.

The present invention should not be limited to the above-described embodiments, but the present invention may be modified in various ways. For example, a high melting point metal silicide of the control gate electrodes CG is formed of the tungsten silicide film 204 in the above-described embodiments, but other high melting point metals such as cobalt (Co) and nickel (Ni) may be used. In this case, even if CoSi and NiSi are exposed to a temperature above 600° C., abnormal oxide is not generated therein, but CoSi becomes of high resistance if it is heated at a temperature above 700° C., and NiSi becomes of high resistance if it is heated at temperature above 500° C.

Therefore, when the cobalt or the nickel is used as the high melting point metal silicide film of the control gate electrodes CG, the first, the second or the third embodiment described above should be applied thereto. Then, the silicon oxide films 206, 210 and 410 and the silicon nitride films 306, 310 and 406 should be formed at a temperature below 700° C. when the cobalt is used, whereas they should be formed at a temperature below 500° C., when the nickel is used.

In addition, although the NAND-type nonvolatile semiconductor memory device is taken as one example in the above-mentioned embodiments, the present invention can be applied to other type of nonvolatile semiconductor memory device such as a NOR-type one, an AND-type one and soon. Moreover, the present invention is not limited to the nonvolatile semiconductor memory device. It can be applied to other types of semiconductor memory devices such that the interlayer dielectric film is embedded in the gaps between elements.

Furthermore, the silicon oxide film and the silicon nitride film used in the above-described embodiments are examples of insulating films, and therefore other types of insulating films may be used instead of them.

What is claimed is:

1. A method for producing a nonvolatile semiconductor memory device, comprising:

forming a first insulating film on a semiconductor substrate;

forming a floating gate electrode material film on the first insulating film;

forming a second insulating film on the floating gate electrode material film;

forming a control gate electrode material film on the second insulating film;

forming a first mask film on the control gate electrode material film, the first mask film having slits extending along a first direction;

forming sidewalls on the sides of the first mask film in the slits so that the sidewalls cover a whole side of the first mask film and have a sloped surface; and etching the control gate electrode material film, the second insulating film and the floating gate electrode material film using the first mask film and the sidewalls as a mask so as to align and flatten etched side surfaces of the control gate electrode material film, etched side surfaces of the second insulating film and etched side surfaces of the floating gate electrode material film and so as to form memory cells each of which includes a floating gate electrode and a control gate electrode.

2. The method for producing the nonvolatile semiconductor memory device as set forth in claim 1, wherein the control gate electrode material film includes a tungsten silicide film.

3. The method for producing the nonvolatile semiconductor memory device as set forth in claim 2, wherein at least one of the step of forming the first mask film and the step of forming the sidewalls is performed at a temperature below 600° C.

4. The method for producing the nonvolatile semiconductor memory device as set forth in claim 2, wherein the step of forming the first mask film is performed at a temperature below 600° C., and the method further comprises exposing the nonvolatile semiconductor memory device to a heat treatment in a nitrogen atmosphere after the step of forming the first mask film and before the step of forming the sidewalls.

5. The method for producing the nonvolatile semiconductor memory device as set forth in claim 4, wherein the step of forming the sidewalls is performed at a temperature above 600° C.

6. The method for producing the nonvolatile semiconductor memory device as set forth in claim 1, wherein the first mask film is formed of silicon oxide material and the sidewalls are also formed of silicon oxide material.

7. The method for producing the nonvolatile semiconductor memory device as set forth in claim 1, wherein the first mask film is formed of silicon nitride material and the sidewalls are also formed of silicon nitride material.

8. The method for producing the nonvolatile semiconductor memory device as set forth in claim 1, wherein the first mask film is formed of one of silicon oxide material and a silicon nitride material and the sidewalls are formed of the other of the silicon oxide material and the silicon nitride material.

9. The method for producing the nonvolatile semiconductor memory device as set forth in claim 1, further comprising:

forming a second mask film on the floating gate electrode material film, the second mask film having slits extending along a second direction which intersects the first direction; and etching the floating gate material film using the second mask film as a mask.

10. The method for producing the nonvolatile semiconductor memory device as set forth in claim 1, wherein the control gate electrode material film includes a high melting metal silicide film.

11. The method for producing the nonvolatile semiconductor memory device as set forth in claim 1, further comprising forming an interlayer dielectric film which covers the memory cells and is embedded in gaps between the memory cells after forming the memory cells.

* * * * *